US012438100B2

(12) United States Patent
Yamada et al.

(10) Patent No.: US 12,438,100 B2
(45) Date of Patent: Oct. 7, 2025

(54) THREE-DIMENSIONAL MEMORY DEVICE WITH MULTIPLE TYPES OF SUPPORT PILLAR STRUCTURES AND METHOD OF FORMING THE SAME

(71) Applicant: SANDISK TECHNOLOGIES LLC, Addison, TX (US)

(72) Inventors: Katsuo Yamada, Yokkaichi (JP); Kakeru Tamai, Yokkaichi (JP); Akira Iwasaki, Yokkaichi (JP); Akira Fukunaga, Yokkaichi (JP); Koichi Matsuno, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 722 days.

(21) Appl. No.: 17/806,592

(22) Filed: Jun. 13, 2022

(65) Prior Publication Data

US 2022/0352093 A1 Nov. 3, 2022

Related U.S. Application Data

(63) Continuation-in-part of application No. 17/244,311, filed on Apr. 29, 2021, now Pat. No. 12,096,632.

(51) Int. Cl.
*H01L 23/00* (2006.01)
*H10B 41/27* (2023.01)
(Continued)

(52) U.S. Cl.
CPC ........... *H01L 23/562* (2013.01); *H10B 41/27* (2023.02); *H10B 43/27* (2023.02); *H10B 51/20* (2023.02)

(58) Field of Classification Search
CPC ................................ H10B 41/27; H10B 43/27
See application file for complete search history.

(56) References Cited

U.S. PATENT DOCUMENTS 9,230,987 B2 1/2016 Pachamuthu et al.
9,412,749 B1 8/2016 Shimabukuro et al.
(Continued)

FOREIGN PATENT DOCUMENTS

KR 20180126210 A 11/2018
KR 20200035469 A 4/2020
WO WO2020-163007 A1 8/2020

OTHER PUBLICATIONS

Endoh, T. et al., "Novel Ultra High-Density Memory with a Stacked-Surrounding Gate Transistor (S-SGT) Structured Cell," IEDM Proc., (2001), 33-36.
(Continued)

*Primary Examiner* — Alia Sabur
(74) *Attorney, Agent, or Firm* — THE MARBURY LAW GROUP PLLC

(57) ABSTRACT

A three-dimensional memory device includes an alternating stack of insulating layers and electrically conductive layers, memory opening fill structures located within a respective memory opening vertically extending through the alternating stack in a memory array region, and support pillar structures vertically extending through the alternating stack. Each of the memory opening fill structures includes a respective vertical semiconductor channel and a respective memory film that contacts each layer within the alternating stack. Each of the support pillar structures includes a respective dummy vertical semiconductor channel, a respective dummy memory film, and at least one respective dielectric spacer material portion laterally surrounding the respective dummy memory film and interposed between the electrically conductive layers and the respective dummy memory film.

18 Claims, 89 Drawing Sheets

(51) Int. Cl.

*H10B 43/27* (2023.01)
*H10B 51/20* (2023.01)

(56) References Cited

U.S. PATENT DOCUMENTS

| | | | | |
|---|---|---|---|---|
| 9,576,967 | B1 | 2/2017 | Kimura et al. | |
| 9,659,956 | B1 | 5/2017 | Pachamuthu et al. | |
| 9,754,963 | B1 | 9/2017 | Kawamura et al. | |
| 9,805,805 | B1 | 10/2017 | Zhang et al. | |
| 9,853,038 | B1 | 12/2017 | Cui | |
| 9,881,929 | B1 | 1/2018 | Ravikirthi et al. | |
| 9,905,573 | B1 | 2/2018 | Mada et al. | |
| 9,978,766 | B1 | 5/2018 | Hosoda et al. | |
| 10,014,316 | B2 | 7/2018 | Yu et al. | |
| 10,115,632 | B1 | 10/2018 | Masamori et al. | |
| 10,141,331 | B1 | 11/2018 | Susuki et al. | |
| 10,192,784 | B1 | 1/2019 | Cui et al. | |
| 10,256,245 | B2 | 4/2019 | Ariyoshi | |
| 10,269,820 | B1 | 4/2019 | Kaminaga | |
| 10,304,852 | B1 | 5/2019 | Cui et al. | |
| 10,381,434 | B1 | 8/2019 | Pachamuthu et al. | |
| 10,475,879 | B1 | 11/2019 | Pachamuthu et al. | |
| 10,672,780 | B1 | 6/2020 | Kawamura et al. | |
| 10,685,973 | B2 * | 6/2020 | Song | H10B 43/20 |
| 10,700,089 | B1 | 6/2020 | Hojo et al. | |
| 10,727,248 | B2 | 7/2020 | Kaminaga | |
| 10,854,629 | B2 | 12/2020 | Ge et al. | |
| 10,892,267 | B2 | 1/2021 | Mushiga et al. | |
| 10,937,801 | B2 | 3/2021 | Otsu et al. | |
| 10,957,706 | B2 | 3/2021 | Otsu et al. | |
| 10,971,514 | B2 | 4/2021 | Otsu et al. | |
| 11,049,876 | B2 | 6/2021 | Kaminaga et al. | |
| 11,257,835 | B2 | 2/2022 | Li et al. | |
| 11,322,440 | B2 | 5/2022 | Kubo | |
| 11,404,429 | B2 * | 8/2022 | Son | H10B 43/20 |
| 2015/0236038 | A1 | 8/2015 | Pachamuthu et al. | |
| 2015/0380423 | A1 | 12/2015 | Kanakamedela et al. | |
| 2015/0380424 | A1 | 12/2015 | Makala et al. | |
| 2016/0071861 | A1 | 3/2016 | Serov et al. | |
| 2016/0111435 | A1 | 4/2016 | Pang et al. | |
| 2016/0111436 | A1 | 4/2016 | Ding et al. | |
| 2016/0111437 | A1 | 4/2016 | Pang et al. | |
| 2016/0204122 | A1 | 7/2016 | Shoji et al. | |
| 2016/0276359 | A1 | 9/2016 | Oginoe et al. | |
| 2016/0322374 | A1 | 11/2016 | Sano et al. | |
| 2017/0148800 | A1 | 5/2017 | Nishikawa et al. | |
| 2017/0236835 | A1 | 8/2017 | Nakamura et al. | |
| 2018/0061850 | A1 | 3/2018 | Mada et al. | |
| 2018/0108671 | A1 | 4/2018 | Yu et al. | |
| 2018/0122904 | A1 | 5/2018 | Matsumoto et al. | |
| 2018/0122905 | A1 | 5/2018 | Ogawa et al. | |
| 2018/0130812 | A1 | 5/2018 | Hosoda et al. | |
| 2018/0151588 | A1 | 5/2018 | Tsutsumi et al. | |
| 2018/0151672 | A1 * | 5/2018 | Choi | H10B 41/27 |
| 2018/0261613 | A1 | 9/2018 | Ariyoshi | |
| 2018/0261671 | A1 | 9/2018 | Matsumoto et al. | |
| 2018/0277567 | A1 | 9/2018 | Nakamura et al. | |
| 2018/0301374 | A1 * | 10/2018 | Masamori | H10B 43/40 |
| 2018/0342531 | A1 | 11/2018 | Susuki et al. | |
| 2018/0350879 | A1 | 12/2018 | Sel et al. | |
| 2018/0374863 | A1 | 12/2018 | Purayath | |
| 2018/0374865 | A1 | 12/2018 | Shimabukuro et al. | |
| 2019/0067182 | A1 * | 2/2019 | Lee | H10D 62/115 |
| 2019/0198515 | A1 | 6/2019 | Hosoda et al. | |
| 2019/0252396 | A1 | 8/2019 | Mushiga et al. | |
| 2019/0252403 | A1 | 8/2019 | Kaminaga et al. | |
| 2019/0252404 | A1 | 8/2019 | Kaminaga | |
| 2019/0363098 | A1 | 11/2019 | Lung | |
| 2019/0386108 | A1 | 12/2019 | Nishikawa et al. | |
| 2020/0027835 | A1 | 1/2020 | Hsu et al. | |
| 2020/0035694 | A1 | 1/2020 | Kaminaga | |
| 2020/0105785 | A1 | 4/2020 | Jung et al. | |
| 2020/0203362 | A1 | 6/2020 | Rabkin et al. | |
| 2020/0219895 | A1 | 7/2020 | Mushiga et al. | |
| 2020/0219896 | A1 | 7/2020 | Mushiga et al. | |
| 2020/0266206 | A1 | 8/2020 | Fukuo et al. | |
| 2020/0312864 | A1 | 10/2020 | Iwai et al. | |
| 2020/0312865 | A1 | 10/2020 | Ge et al. | |
| 2020/0357815 | A1 | 11/2020 | Iwai et al. | |
| 2020/0395374 | A1 | 12/2020 | Huo et al. | |
| 2020/0402905 | A1 | 12/2020 | Otsu et al. | |
| 2020/0402992 | A1 | 12/2020 | Otsu et al. | |
| 2020/0403005 | A1 | 12/2020 | Sakurai et al. | |
| 2021/0005627 | A1 | 1/2021 | Hinoue et al. | |
| 2021/0159241 | A1 | 5/2021 | Li et al. | |
| 2021/0174839 | A1 | 6/2021 | Lee | |
| 2021/0193672 | A1 | 6/2021 | Kim et al. | |
| 2021/0272981 | A1 | 9/2021 | Jeong et al. | |
| 2021/0327889 | A1 | 10/2021 | Makala et al. | |
| 2021/0358936 | A1 | 11/2021 | Takuma et al. | |
| 2021/0358937 | A1 | 11/2021 | Yamaguchi et al. | |
| 2021/0358941 | A1 | 11/2021 | Kajiwara et al. | |
| 2021/0384206 | A1 | 12/2021 | Iwai et al. | |
| 2021/0384207 | A1 | 12/2021 | Iwai et al. | |
| 2021/0398997 | A1 | 12/2021 | Luo et al. | |
| 2022/0005818 | A1 | 1/2022 | Tanaka et al. | |
| 2022/0005824 | A1 | 1/2022 | Tanaka et al. | |
| 2022/0059561 | A1 | 2/2022 | Noh | |

OTHER PUBLICATIONS

International Search Report and Written Opinion of the International Searching Authority for International Application No. PCT/US2022/013782, mailed May 26, 2022, 11 pages.

U.S. Appl. No. 17/146,866, filed Jan. 12, 2021, SanDisk Technologies, LLC.

U.S. Appl. No. 17/174,064, filed Feb. 11, 2021, SanDisk Technologies, LLC.

U.S. Appl. No. 17/174,094, filed Feb. 11, 2021, SanDisk Technologies, LLC.

U.S. Appl. No. 17/244,258, filed Apr. 29, 2021, SanDisk Technologies, LLC.

U.S. Appl. No. 17/244,311, filed Apr. 29, 2021, SanDisk Technologies, LLC.

U.S. Appl. No. 17/328,302, filed May 24, 2021, SanDisk Technologies, LLC.

U.S. Appl. No. 17/355,883, filed Jun. 23, 2021, SanDisk Technologies, LLC.

U.S. Appl. No. 17/462,446, filed Aug. 31, 2021, SanDisk Technologies, LLC.

U.S. Appl. No. 17/510,833, filed Oct. 26, 2021, SanDisk Technologies, LLC.

U.S. Appl. No. 17/678,499, filed Feb. 23, 2022, SanDisk Technologies, LLC.

USPTO Office Communication, Non-Final Office for U.S. Appl. No. 17/244,258, mailed Jan. 18, 2023, 21 pages.

USPTO Office Communication, Non-Final Office for U.S. Appl. No. 17/462,446, mailed Mar. 15, 2024, 32 pages.

USPTO Office Communication, Non-Final Office for U.S. Appl. No. 17/244,258, mailed Jul. 13, 2023, 16 pages.

USPTO Office Communication, Non-Final Office Action for U.S. Appl. No. 17/244,311, mailed Sep. 26, 2023, 26 pages.

ISR—Notification of Transmittal of The International Search Report and Written Opinion of the International Searching Authority for International Patent Application No. PCT/US2022/013782, mailed May 26, 2022, 11 pages.

* cited by examiner

THREE-DIMENSIONAL MEMORY DEVICE WITH MULTIPLE TYPES OF SUPPORT PILLAR STRUCTURES AND METHOD OF FORMING THE SAME

RELATED APPLICATIONS

This application is a continuation-in-part (CIP) application of U.S. application Ser. No. 17/244,311 filed on Apr. 29, 2021, the entire contents of which are incorporated herein by reference.

FIELD

The present disclosure relates generally to the field of semiconductor devices, and particularly to three-dimensional memory devices multiple types of support pillar structures and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device includes an alternating stack of insulating layers and electrically conductive layers, memory opening fill structures located within a respective memory opening vertically extending through the alternating stack in a memory array region, and support pillar structures vertically extending through the alternating stack. Each of the memory opening fill structures includes a respective vertical semiconductor channel and a respective memory film that contacts each layer within the alternating stack. Each of the support pillar structures includes a respective dummy vertical semiconductor channel, a respective dummy memory film, and at least one respective dielectric spacer material portion laterally surrounding the respective dummy memory film and interposed between the electrically conductive layers and the respective dummy memory film.

According to another aspect of the present disclosure, a method of forming a three-dimensional memory device is provided, which comprises: forming an alternating stack of insulating layers and sacrificial material layers over a substrate; forming stepped surfaces by patterning the alternating stack in a staircase region; forming a retro-stepped dielectric material portion over the stepped surfaces; forming support openings in the staircase region and memory openings in a memory array region in which each layer within the alternating stack is present; forming a patterning film over the alternating stack such that the patterning film covers the memory openings and does not cover the support openings; forming a dielectric spacer material portion layer on physically exposed surfaces of the support openings and over the patterning film; anisotropically etching portions of the dielectric spacer material portion layer from above the patterning film and in upper portions of the support openings, wherein remaining portions of the dielectric spacer material portion layer in the support openings comprise dielectric spacer material portions; removing the patterning film; forming memory opening fill structures in the memory openings and support pillar structures in the support openings, wherein each of the memory opening fill structures comprises a respective memory film and a respective vertical semiconductor channel, and each of the support pillar structures comprises a respective one of the dielectric spacer material portions, a respective dummy memory film, and a respective dummy vertical semiconductor channel; and replacing the sacrificial material layers with electrically conductive layers.

According to an aspect of the present disclosure, a three-dimensional memory device is provided, which comprises: an alternating stack of insulating layers and electrically conductive layers located over a substrate, wherein each layer within the alternating stack is present within a memory array region, and the alternating stack comprises stepped surfaces in a staircase region in which the electrically conductive layers have variable lateral extents with a vertical distance from the substrate; memory opening fill structures located within a respective memory opening vertically extending through the alternating stack in the memory array region, wherein each of the memory opening fill structures comprises a respective vertical semiconductor channel and a respective memory film; dielectric support pillar structures located in the staircase region, vertically extending through the alternating stack, and free of any semiconductor material therein; and composite support pillar structures located in the staircase region and vertically extending through the alternating stack, wherein each of the composite support pillar structures comprises a dummy vertical semiconductor channel including a same material as the vertical semiconductor channels.

According to another aspect of the present disclosure, a method of forming a three-dimensional memory device is provided, which comprises: forming an alternating stack of insulating layers and sacrificial material layers over a substrate; forming memory openings, first-type support openings, and second-type support openings through the alternating stack; covering the memory openings and the first-type support openings with a mask material layer without covering the second-type support openings; depositing a dielectric fill material layer in the second-type support openings; removing the mask material layer and portions of the dielectric fill material layer located outside the second-type support openings, wherein dielectric support pillar structures are formed in the second-type support openings; forming memory opening fill structures and composite support pillar structures in the memory openings and the first-type support openings, respectively, by depositing and planarizing material layers comprising a memory material layer and a semiconductor channel material layer; and replacing the sacrificial material layers with electrically conductive layers.

According to yet another aspect of the present disclosure, a three-dimensional memory device is provided, which comprises: an alternating stack of insulating layers and electrically conductive layers located over a substrate, wherein each layer within the alternating stack is present within a memory array region, and the alternating stack comprises stepped surfaces in a staircase region in which the electrically conductive layers have variable lateral extents with a vertical distance from the substrate; memory opening fill structures located within a respective memory opening vertically extending through the alternating stack in the memory array region, wherein each of the memory opening fill structures comprises a respective vertical semiconductor channel and a respective memory film; first-type support pillar structures located in the staircase region and vertically extending through the alternating stack, wherein each of the first-type support pillar structures comprises a respective first dummy vertical semiconductor channel and a respective first dummy memory film; and second-type support pillar structures located in the staircase region and vertically extending through the alternating stack, wherein each of the second-type support pillar structures comprises a respective second dummy vertical semiconductor channel, a respective second dummy memory film, and at least one respective dielectric spacer material portion laterally surrounding the respective second dummy memory film and interposed between the electrically conductive layers and the respective second dummy memory film.

According to still another aspect of the present disclosure, a method of forming a three-dimensional memory device is provided, which comprises: forming an alternating stack of insulating layers and sacrificial material layers over a substrate; forming memory openings, first-type support openings, and second-type support openings through the alternating stack; forming at least one respective dielectric spacer material portion within each of the second-type support openings by depositing and patterning a dielectric spacer material such that the dielectric spacer material is present within the second-type support openings and is not present within the memory openings and the first-type support openings; forming memory opening fill structures, first-type support pillar structures, and second-type support pillar structures in the memory openings, the first-type support openings, and the second-type support openings, respectively, by depositing material layers comprising a memory film and a semiconductor channel material layer within the memory openings, the first-type support openings, and remaining volumes of the second-type support openings and by planarizing the material layers; and replacing the sacrificial material layers with electrically conductive layers.

DETAILED DESCRIPTION

Figure 1A:
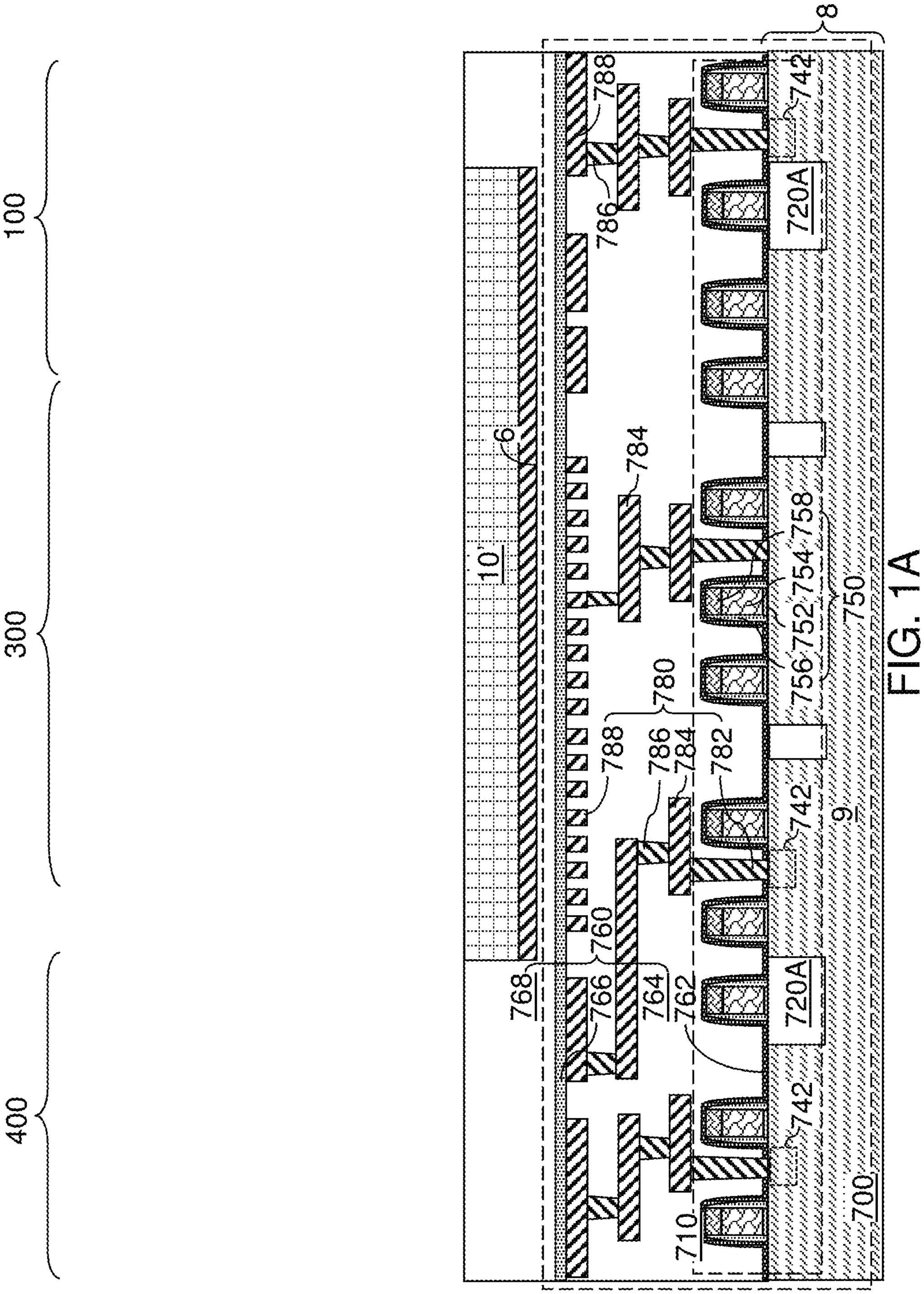
FIG. 1A is a vertical cross-sectional view of a first exemplary structure after formation of semiconductor devices, lower level dielectric layers, lower metal interconnect structures, and in-process source level material layers on a semiconductor substrate according to an embodiment of the present disclosure.

As discussed above, the embodiments of the present disclosure are directed to three-dimensional memory devices containing different types of support pillar structures and methods of manufacturing the same. The embodiments of the disclosure can be employed to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulator material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm.

An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Figure 1B:
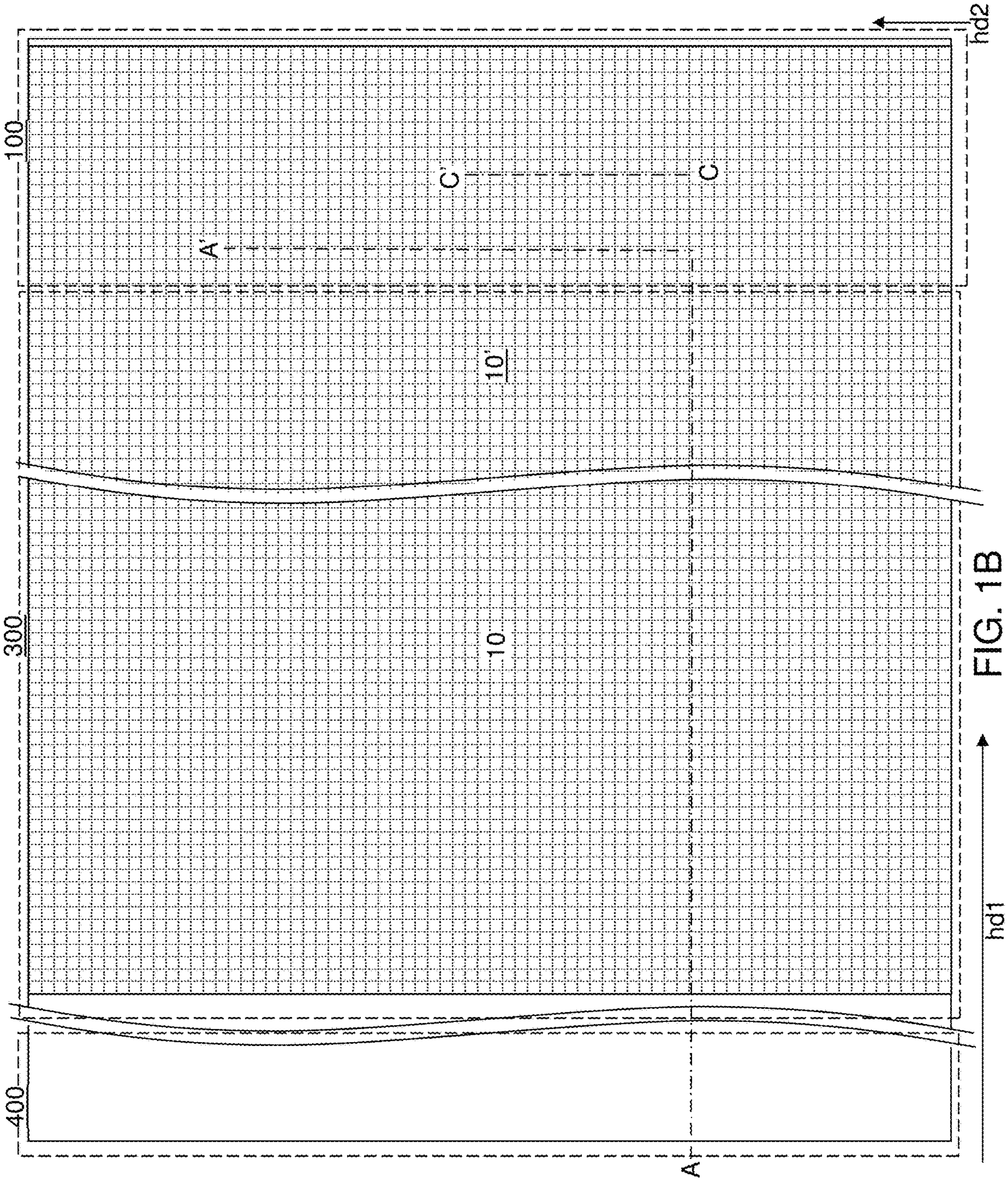
FIG. 1B is a top-down view of the first exemplary structure of FIG. 1A. The hinged vertical plane A-A' is the plane of the vertical cross-sectional view of FIG. 1A.
Figure 1C:
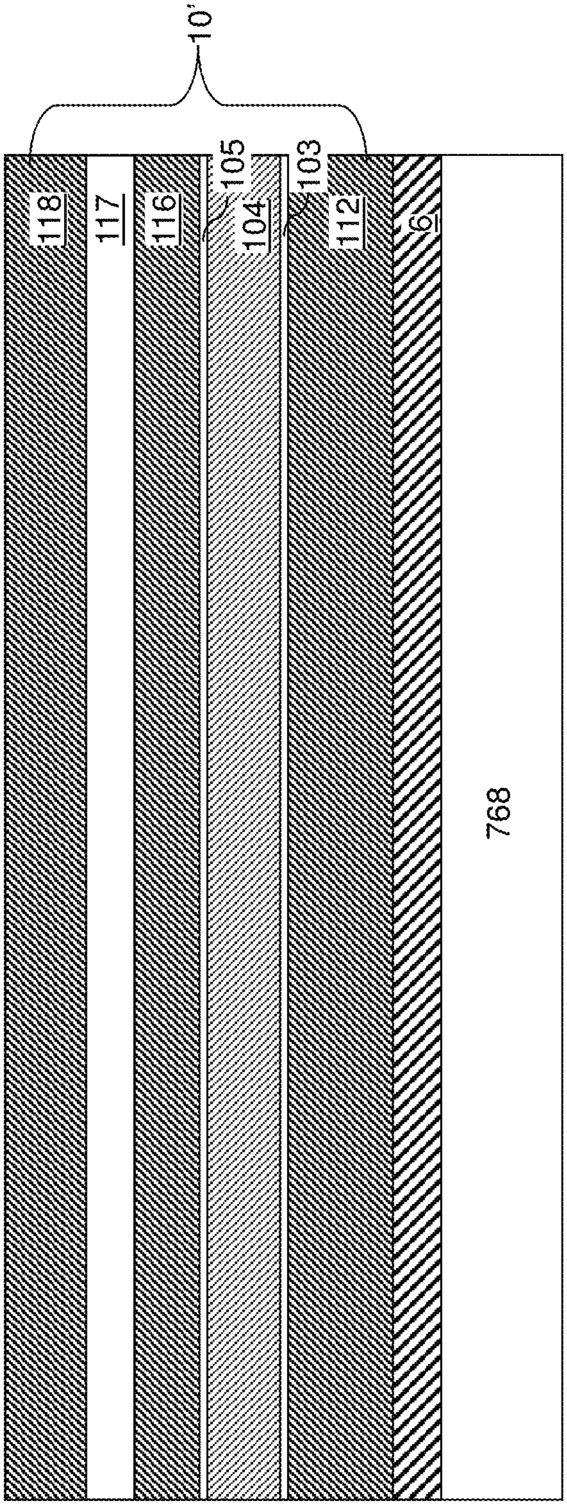
FIG. 1C is a magnified view of the in-process source level material layers along the vertical plane C-C' of FIG. 1B.

Referring to FIGS. 1A-1C, a first exemplary structure according to an embodiment of the present disclosure is illustrated. FIG. 1C is a magnified view of an in-process source-level material layers 10' illustrated in FIGS. 1A and 1B. The first exemplary structure includes a substrate 8 and semiconductor devices 710 formed thereupon. The substrate 8 includes a substrate semiconductor layer 9 at least at an upper portion thereof. Shallow trench isolation structures 720 may be formed in an upper portion of the substrate semiconductor layer 9 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

An optional layer of a metallic material and a layer of a semiconductor material may be deposited over, or within patterned recesses of, the at least one second dielectric material layer 768, and is lithographically patterned to provide an optional conductive plate layer 6 and in-process source-level material layers 10'. The optional conductive plate layer 6, if present, provides a high conductivity conduction path for electrical current that flows into, or out of, the in-process source-level material layers 10'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses may also be used.

The in-process source-level material layers 10' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 10' may include, from bottom to top, a lower source-level semiconductor layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped polysilicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The in-process source-level material layers 10' may be formed directly above a subset of the semiconductor devices on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional conductive plate layer 6 and the in-process source-level material layers 10' may be patterned to provide openings in areas in which through-memory-level contact via structures and through-dielectric contact via structures are to be subsequently formed. Patterned portions of the stack of the conductive plate layer 6 and the in-process source-level material layers 10' are present in each memory array region 100 in which three-dimensional memory stack structures are to be subsequently formed.

The optional conductive plate layer 6 and the in-process source-level material layers 10' may be patterned such that an opening extends over a staircase region 300 in which contact via structures contacting word line electrically conductive layers are to be subsequently formed. In one embodiment, the staircase region 300 may be laterally spaced from the memory array region 100 along a first horizontal direction hd1. A horizontal direction that is perpendicular to the first horizontal direction hd1 is herein referred to as a second horizontal direction hd2. In one embodiment, additional openings in the optional conductive plate layer 6 and the in-process source-level material layers 10' may be formed within the area of a memory array region 100, in which a three-dimensional memory array including memory stack structures is to be subsequently formed. A peripheral device region 400 that is subsequently filled with a field dielectric material portion may be provided adjacent to the staircase region 300.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760. Through-memory-level contact via structures may be subsequently formed directly on the lower-level metal interconnect structures 780 to provide electrical connection to memory devices to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level contact via structures to be subsequently formed.

Figure 2:
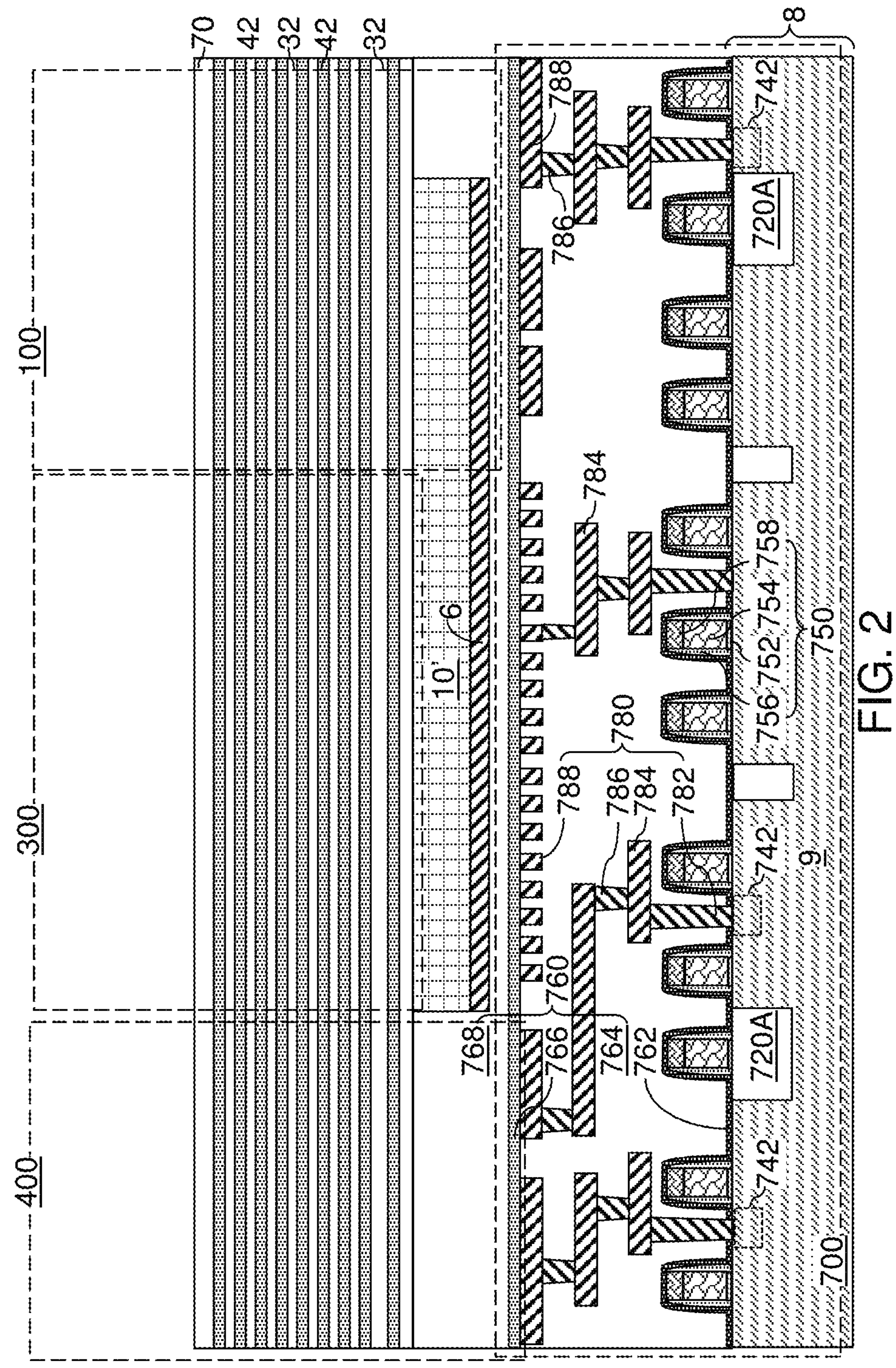
FIG. 2 is a vertical cross-sectional view of the first exemplary structure after formation of a alternating stack of first insulting layers and first spacer material layers according to an embodiment of the present disclosure.

Referring to FIG. 2, a stack of an alternating plurality of first material layers (which can be insulating layers 32) and second material layers (which can be sacrificial material layer 42) is formed over the top surface of the in-process source-level material layers 10'. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
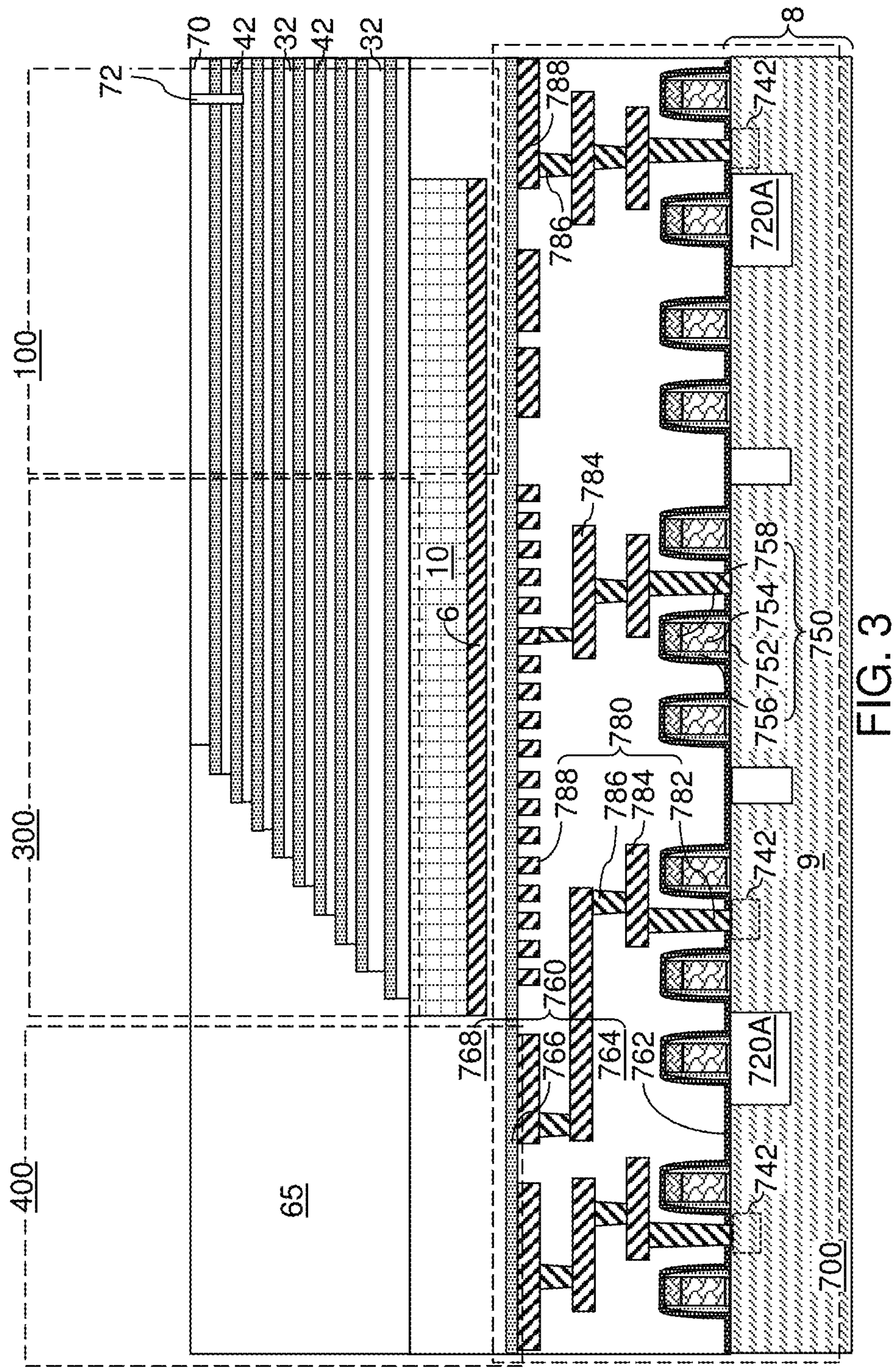
FIG. 3 is a vertical cross-sectional view of the first exemplary structure after patterning stepped surfaces and forming a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The staircase region 300 may be located between the memory array region 100 and the peripheral region 400 containing the at least one semiconductor device for the peripheral circuitry. The stepped cavity can have various stepped surfaces such that the horizontal cross-sectional shape of the stepped cavity changes in steps as a function of the vertical distance from the top surface of the in-process source-level material layers 10'. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the staircase region 300. The staircase region 300 includes stepped surfaces of the alternating stack (32, 42) that continuously extend from a bottommost layer within the alternating stack (32, 42) to a topmost layer within the alternating stack (32, 42). In one embodiment, the sacrificial material layers 42 have variable lateral extents that decrease with a vertical distance from the substrate 8 within the staircase region 300, and each layer within the alternating stack (32, 42) is present within the memory array region 100.

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a “retro-stepped” element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
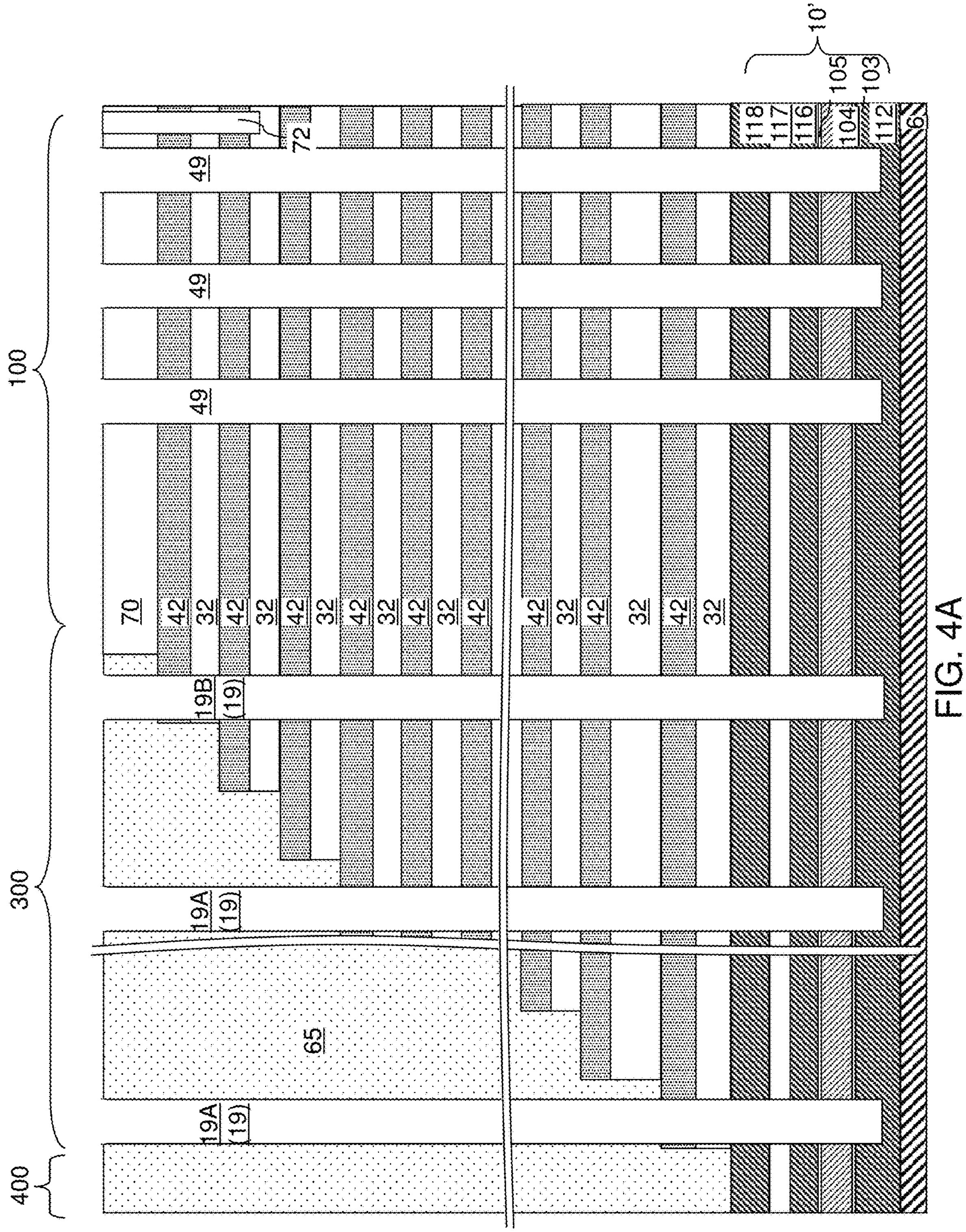
FIG. 4A is a vertical cross-sectional view of the first exemplary structure after formation of memory openings and support openings in a first layout according to a first embodiment of the present disclosure.
Figure 4B:
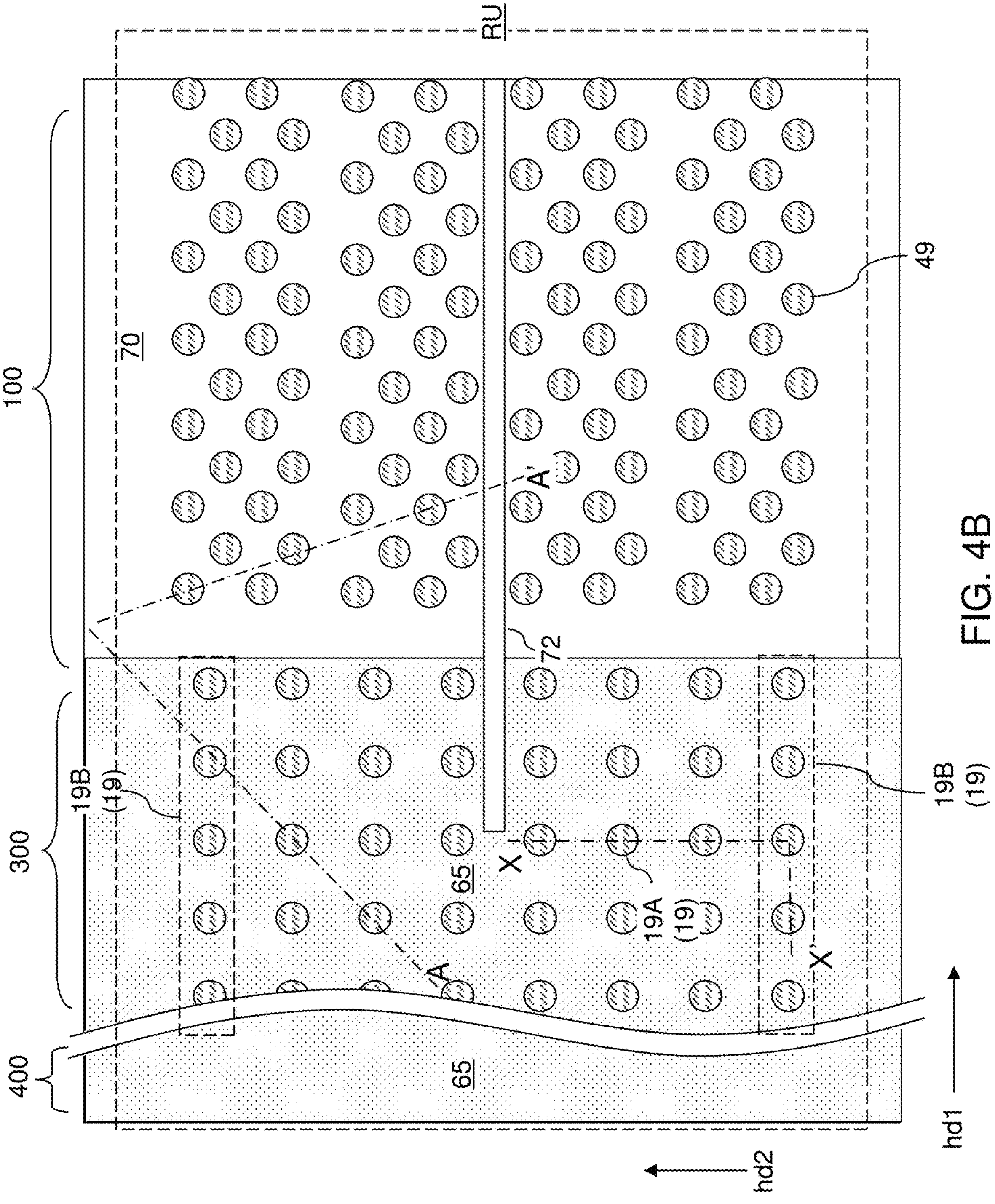
FIG. 4B is a horizontal cross-sectional view of the first exemplary structure of FIG. 4A. The hinged vertical plane A-A' corresponds to the plane of the vertical cross-sectional view of FIG. 4A.
Figure 5A:
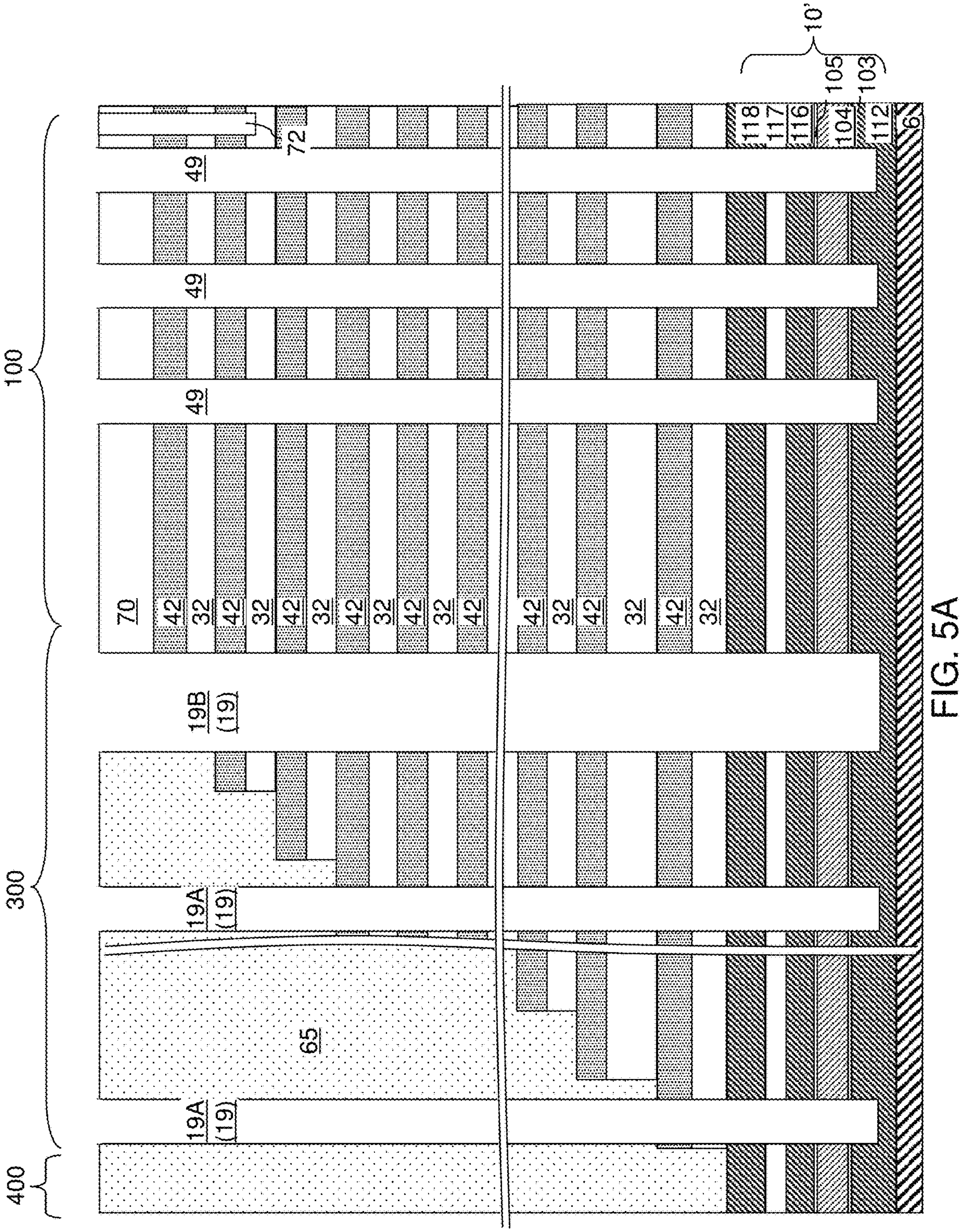
FIG. 5A is a vertical cross-sectional view of the first exemplary structure after formation of memory openings and support openings in a second layout according to a second embodiment of the present disclosure.
Figure 5B:
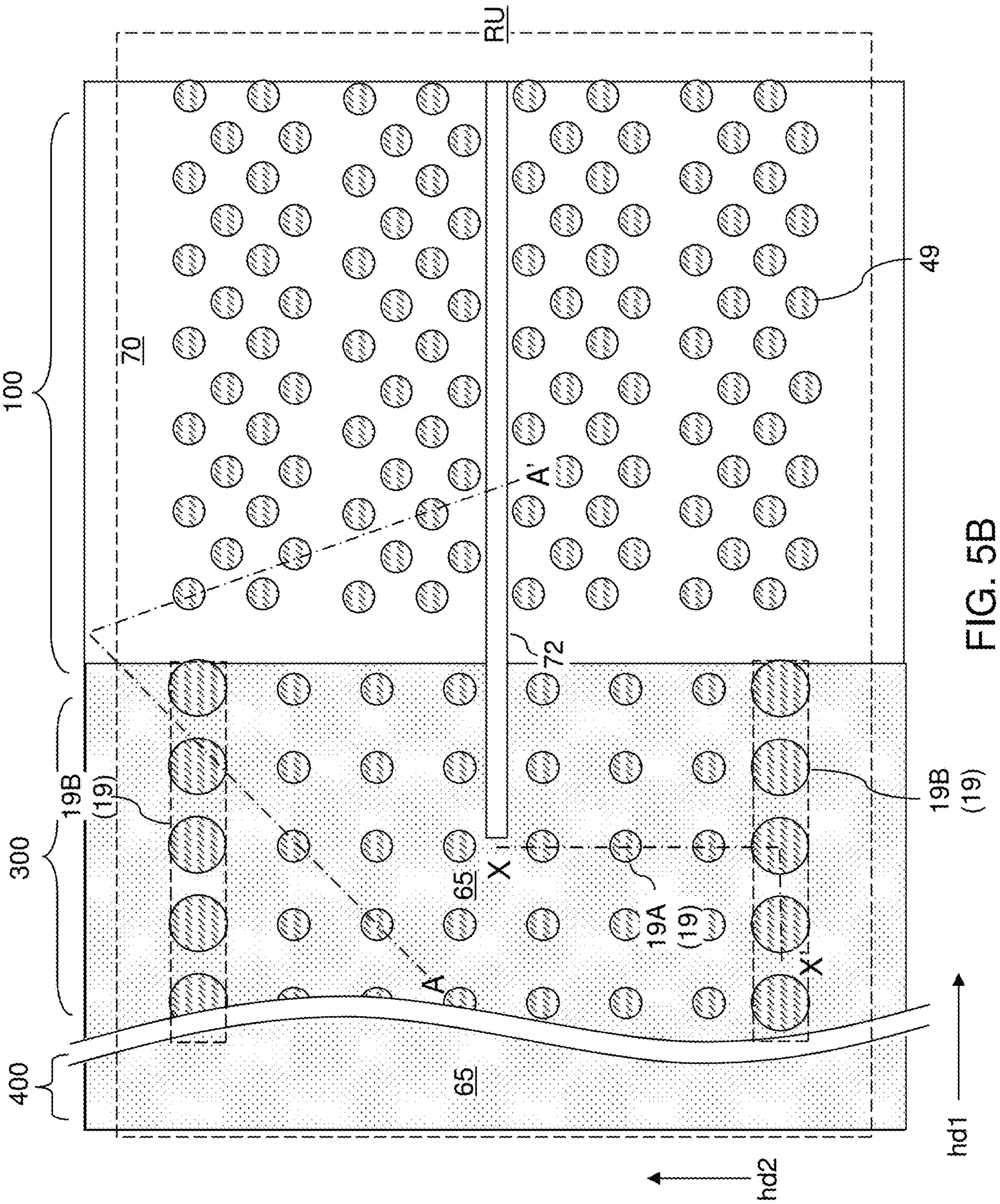
FIG. 5B is a horizontal cross-sectional view of the first exemplary structure of FIG. 5A. The hinged vertical plane A-A' corresponds to the plane of the vertical cross-sectional view of FIG. 5A.
Figure 6A:
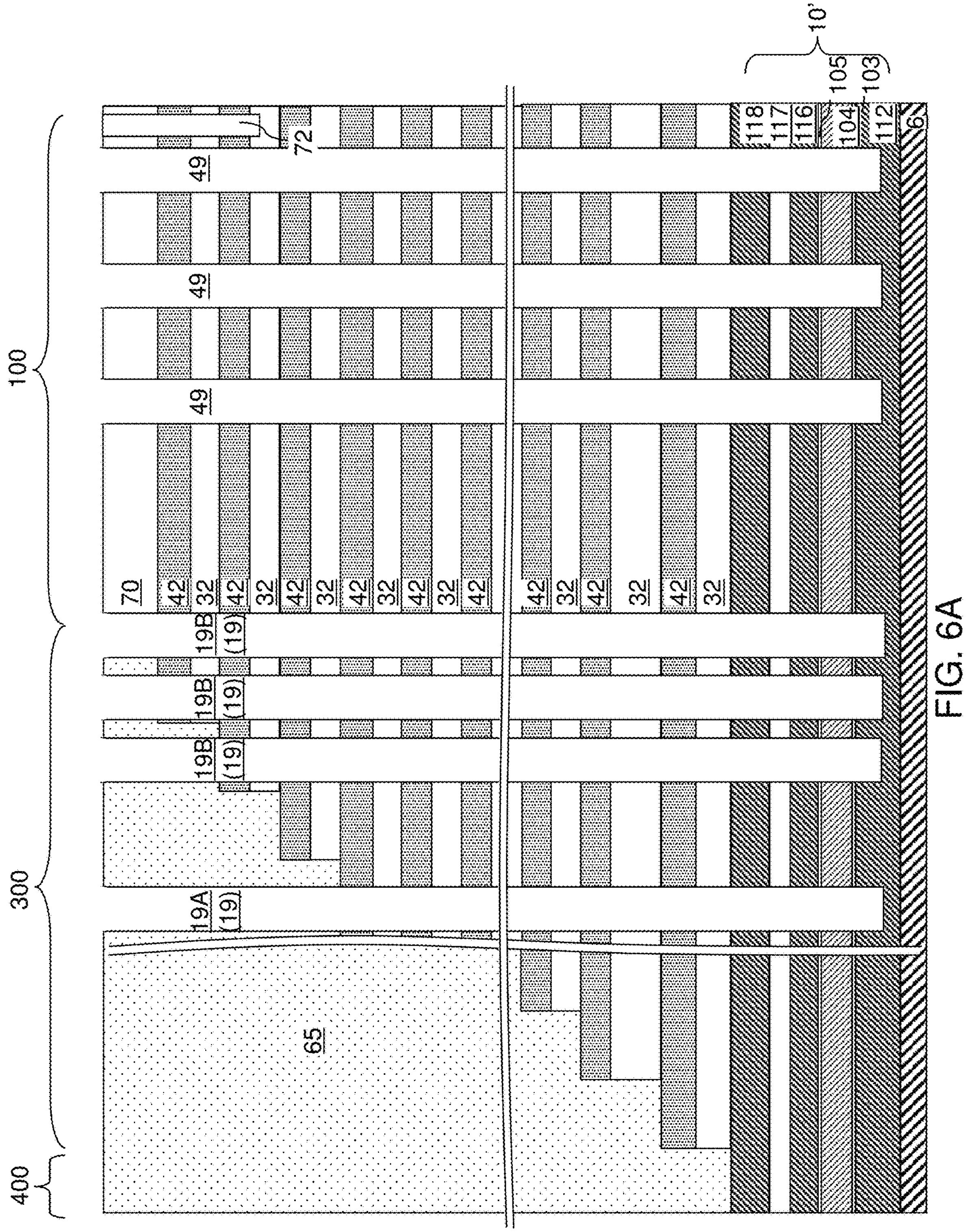
FIG. 6A is a vertical cross-sectional view of the first exemplary structure after formation of memory openings and support openings in a third layout according to a third embodiment of the present disclosure.
Figure 6B:
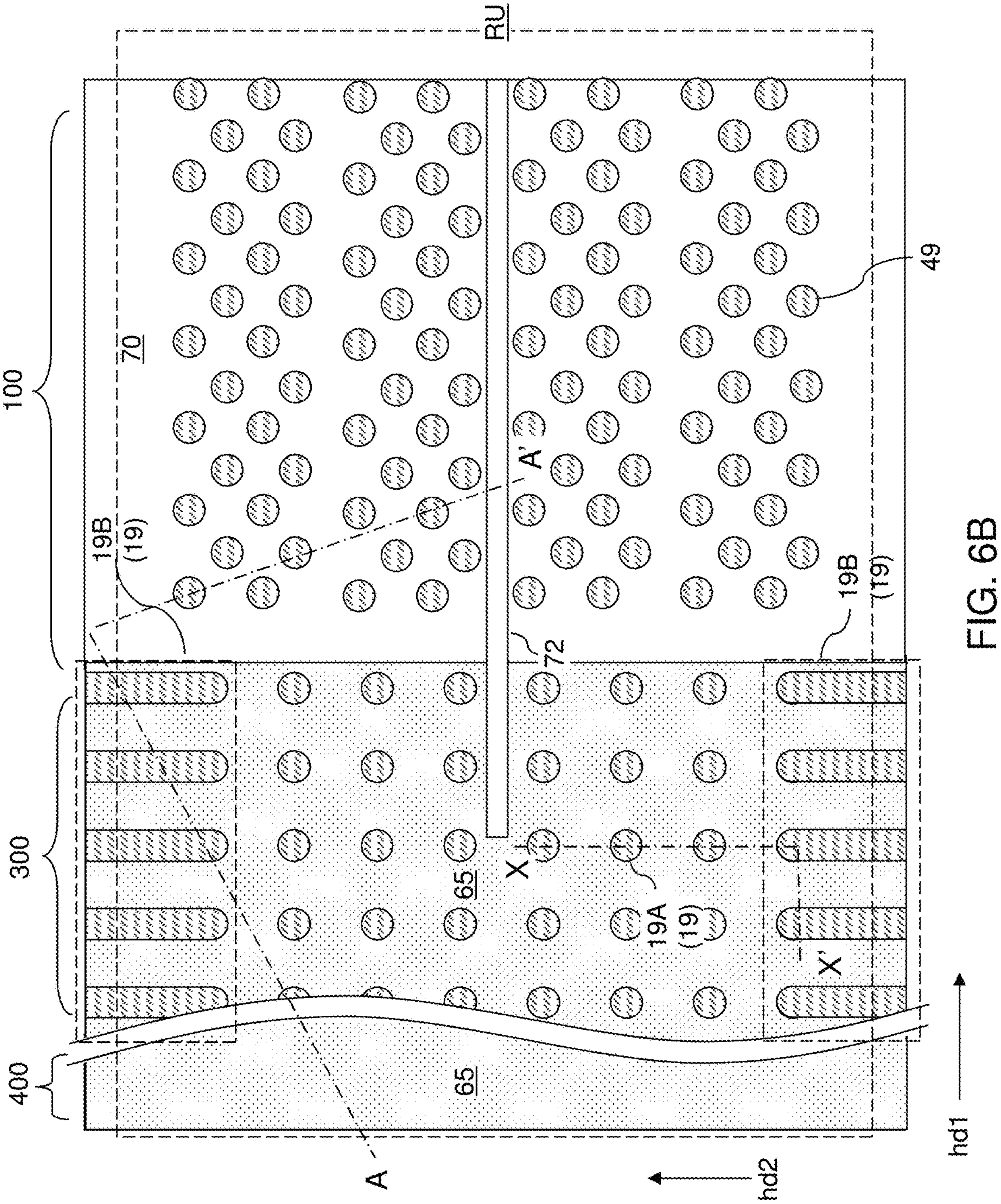
FIG. 6B is a horizontal cross-sectional view of the first exemplary structure of FIG. 6A. The hinged vertical plane A-A' corresponds to the plane of the vertical cross-sectional view of FIG. 6A.

Referring collectively to FIGS. 4A and 4B, FIGS. 5A and 5B, and 6A and 6B, memory openings 49, first-type support openings 19A, and second-type support openings 19B can be formed through the alternating stack (32, 42) and the retro-stepped dielectric material portion 65. The first-type support openings 19A and the second-type support openings 19B are collectively referred to as support openings 19. According to various embodiments of the present disclosure, various layouts can be employed for the support openings 19. FIGS. 4A and 4B illustrate a configuration in which the support openings 19 are formed in a first layout. FIGS. 5A and 5B illustrate a configuration in which the support openings 19 are formed in a second layout. FIGS. 6A and 6B illustrate a configuration in which the support openings 19 are formed in a third layout.

Generally, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100, a second set of openings formed over segments of the staircase region 300, and a third set of openings formed over additional segments of the staircase region 300.

According to an aspect of the present disclosure, the pattern of the openings may be repeated along the second horizontal direction. An area corresponding to a repetition unit RU for the pattern of the openings is illustrated in FIGS. 4B, 5B, and 6B. In one embodiment, the repetition unit RU may correspond to a memory block. Thus, the pattern illustrated in the repetition unit RU can be periodically replicated along the second horizontal direction (e.g., bit line direction) hd2. Within the area of each repetition unit RU, the first set of openings can be formed as a cluster of openings located within the memory array region 100. Within the area of each repetition unit RU, the second set of openings can be formed as a cluster of openings located within the middle portion of the repetition unit RU in the staircase region 300. Within the area of each repetition unit RU, the third set of openings can be formed at the edge portions on either side of the middle portion of the repetition unit RU in the staircase region 300. In one embodiment, the third set of openings can be formed as two rows of openings located at each side of the second set of openings along the second horizontal direction hd2 and laterally extending along the first horizontal direction (e.g., word line direction) hd1. The two rows of openings may be located entirely within the area of the repetition unit RU, or may be merged with a row of openings within a respective neighboring repetition unit RU. In alternative embodiment, more than two rows of the third set of openings can be formed.

The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49, first-type support openings 19A, and second-type support openings 19B. The memory openings 49 are formed underneath the first set of openings in the lithographic material stack. The first-type support openings 19A are formed underneath the second set of openings in the lithographic material stack. The second-type support openings 19B are formed underneath the third set of openings in the lithographic material stack. As used herein, a “memory opening” refers to a structure in which memory elements, such as a memory stack structure, is subsequently formed. As used herein, a “support opening” refers to a structure in which a support structure (such as a support pillar structure) that mechanically supports other elements and which is not electrically connected to a bit line is subsequently formed. The memory openings 49 are formed through the insulating cap layer 70 and the entirety of the alternating stack (32, 42) in the memory array region 100. The first-type support openings 19A and the second-type support openings 19B are collectively referred to as support openings 19. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. In one embodiment, the memory openings 49 and the support openings 19 can vertically extend into the in-process source-level material layers 10'. For example, the memory openings 49 and the support openings 19 can vertically extend to the lower source-level semiconductor layer 112. The sidewalls of the memory openings 49 and the support openings 19 can be substantially vertical, or can be tapered. The patterned lithographic material stack can be subsequently removed, for example, by ashing.

Each of the memory openings 49 and the support openings 19 may include a sidewall (or a plurality of sidewalls) that extends substantially perpendicular to the topmost surface of the substrate 8 and/or to the topmost surface of the in-process source-level material layers 10'. A two-dimensional array of memory openings 49 can be formed in the memory array region 100. A two-dimensional array of support openings 19 can be formed in the staircase region 300.

In case the memory openings 49 and the support openings 19 are formed employing the first layout illustrated in FIGS. 4A and 4B, the second-type support openings 19B may have approximately the same shape and the same lateral dimension as the first-type support openings 19A. For example, the first-type support openings 19A and the second-type support openings 19B may have a respective cylindrical shape such that the lateral dimension of the second-type support openings 19B may be in a range from 100% to 150% of the lateral dimension of the first-type support openings 19A. As used herein, a "lateral dimension" of an object refers to the maximum of all possible lateral dimensions that can be generated from horizontal cross-sectional views of the object, such as a horizontal diameter for example. Within each area of a repetition unit RU, the first-type support openings 19A can be formed as a periodic two-dimensional array of cylindrical openings, and the second-type support openings 19B can be formed as at least two rows of cylindrical openings laterally extending along the first horizontal direction hd1 and having a same pitch as the periodic two-dimensional array of cylindrical openings 19A along the first horizontal direction hd1.

In case the memory openings 49 and the support openings 19 are formed employing the second layout illustrated in FIGS. 5A and 5B, the second-type support openings 19B may have a greater lateral dimension (e.g., horizontal diameter) than the first-type support openings 19A. For example, the first-type support openings 19A and the second-type support openings 19B may have a respective cylindrical shape such that the lateral dimension of the second-type support openings 19B may be in a range from 150% to 400% of the lateral dimension of the first-type support openings 19A. The size difference between the first-type support openings 19A and the second-type support openings 19B can be induced by forming larger openings in the lithographic material stack above the areas of the second-type support openings 19B than above the areas of the first-type support openings 19A. Within each area of a repetition unit RU, the first-type support openings 19A can be formed as a periodic two-dimensional array of cylindrical openings, and the second-type support openings 19B can be formed as at least two rows of cylindrical openings laterally extending along the first horizontal direction hd1. Each row of cylindrical openings comprising the second-type support openings 19B may have the same pitch as, or may have a pitch that is different from, the pitch as the periodic two-dimensional array of cylindrical openings 19A along the first horizontal direction hd1.

In case the memory openings 49 and the support openings 19 are formed employing the third layout illustrated in FIGS. 6A and 6B, the second-type support openings 19B may be elongated along the second horizontal direction hd2 such that the width of the second-type support openings 19B along the second horizontal direction hd2 is greater than the width of each backside trench to be subsequently formed. In one embodiment, the a row of second-type support openings 19B can be centered at a boundary between neighboring pairs of repetition units RU (e.g., pairs of memory blocks). In this case, approximately one half of volumes of the second-type support openings 19B can be formed within the area of one of the repletion units RU, and remaining portions of the volumes of the second-type support openings 19B can be formed within the area of an adjacent one of the repetition units RU. Within each area of a repetition unit RU, the first-type support openings 19A can be formed as a periodic two-dimensional array of cylindrical openings, and approximately one half of each row of second-type support openings 19B within two rows of the second-type support openings 19B can be formed along peripheral regions of the periodic two-dimensional array of cylindrical openings. Each low of cylindrical openings comprising the second-type support openings 19B may have the same pitch as, or may have a pitch that is different from, the pitch as the periodic two-dimensional array of cylindrical openings 19A along the first horizontal direction hd1. The width of each opening 19B along the second horizontal direction hd2 is greater than the diameter of each opening 19A. However, the length of each opening 19B along the first horizontal direction hd1 may be the same as or greater than the diameter of each opening 19A.

After formation of the memory openings 49 and the support openings 19, first-type support pillar structures, second-type support pillar structures, and memory opening fill structures can be formed in the first-type support openings 19A, the second-type support openings 19B, and the memory openings 49, respectively. According to various embodiments of the present disclosure, various methods can be employed to form the first-type support pillar structures, the second-type support pillar structures, and the memory opening fill structures. FIGS. 7A-7E illustrate a sequence of manufacturing steps for forming the first-type support pillar structures and the second-type support pillar structures in the first configuration according to a first embodiment. FIGS. 8A-8E illustrate a sequence of manufacturing steps for forming the first-type support pillar structures and the second-type support pillar structures in the second configuration according to a second embodiment. FIGS. 9A-9E illustrate a sequence of manufacturing steps for forming the first-type support pillar structures and the second-type support pillar structures in the third configuration according to a third embodiment. FIGS. 10A-10I illustrate a sequence of manufacturing steps for forming the first-type support pillar structures and the second-type support pillar structures according to a combination of the first and second configurations according to a fourth embodiment. FIGS. 11A-11E illustrate a sequence of manufacturing steps for forming the first-type support pillar structures and the second-type support pillar structures according to an alternative combination of the first and second configurations according to fifth embodiment. FIGS. 12A-12D illustrate a sequence of manufacturing steps for forming the memory opening fill structures 58 in the memory openings 49 during the formation of the support pillar structures 19 according to the first through fifth embodiments.

Figure 7A:
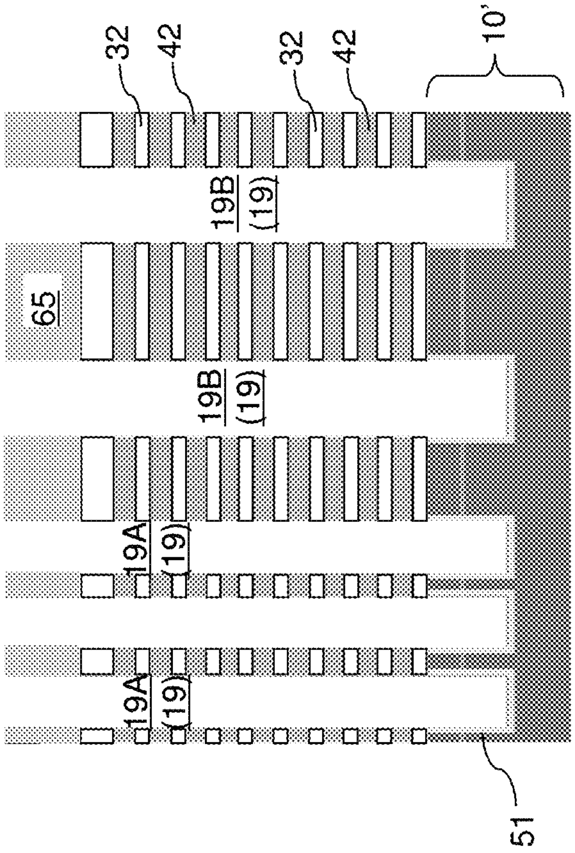
FIGS. 7A-7E are sequential vertical cross-sectional views along a hinged vertical plane X-X' of FIG. 4B during formation of first-type support pillar structures and second-type support pillar structures in a first configuration according to the first embodiment of the present disclosure.

Referring to FIG. 7A, a region of the first exemplary structure is shown along the vertical plane X-X' of FIG. 4B. The first-type support pillar structures and the second-type support pillar structures in the first configuration can be formed employing the first exemplary structure of FIGS. 4A and 4B, which includes first-type support openings 19A and second-type support openings 19B that are arranged in the first layout.

Optionally, an oxidation process such as a thermal oxidation process or a plasma oxidation process can be performed to convert physically exposed surfaces portions of semiconductor materials in the in-process source-level material layers 10'. In this case, dielectric liners 51 may be formed at the bottom of each of the first-type support openings 19A, the second-type support openings 19B, and the memory openings 49 (not illustrated in FIG. 7B). The thickness of each dielectric liner 51 may be in a range from 1 nm to 10 nm, such as from 2 nm to 6 nm, although lesser and greater thicknesses may also be employed.

Figure 7B:
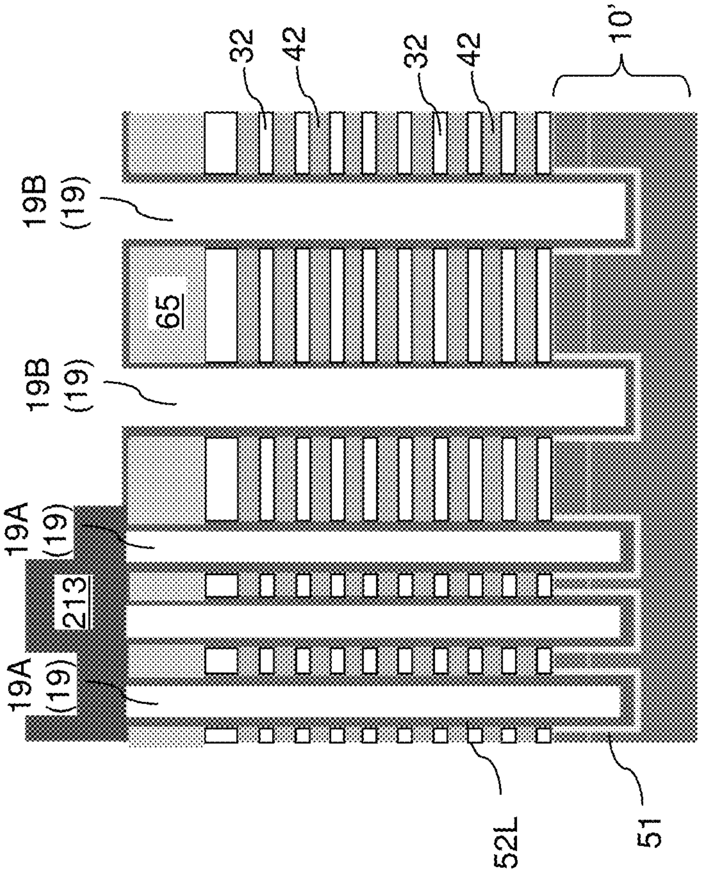
Figure 12B:
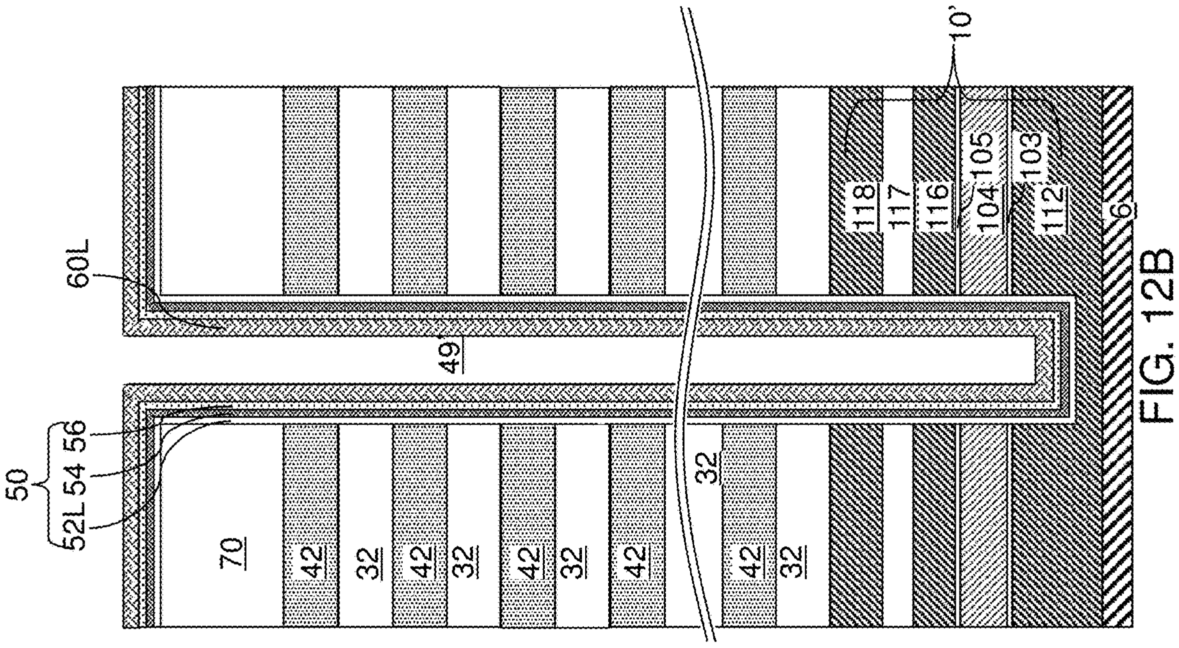
FIGS. 12A-12D are sequential schematic vertical cross-sectional views of a memory opening within the first exemplary structure during formation of a memory opening fill structure according to an embodiment of the present disclosure.
Figure 12A:
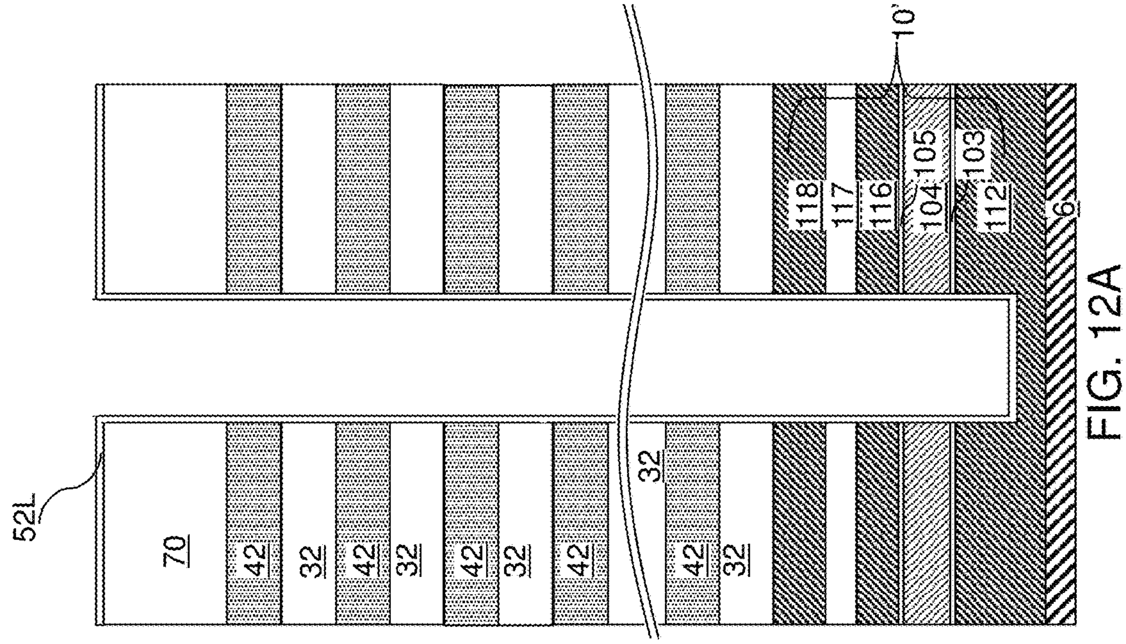

Referring to FIGS. 7B and 12A, a continuous blocking dielectric layer 52L can be conformally formed on physically exposed sidewalls of the alternating stack (32, 42) within each of the first-type support openings 19A, and the second-type support openings 19B, and the memory openings 49. The continuous blocking dielectric layer 52L can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the continuous blocking dielectric layer 52L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($La_2O_3$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the continuous blocking dielectric layer 52L includes aluminum oxide. In one embodiment, the continuous blocking dielectric layer 52L can include multiple dielectric metal oxide layers having different material compositions.

Alternatively or additionally, the continuous blocking dielectric layer 52L can include a dielectric semiconductor compound such as silicon oxide, silicon oxynitride, silicon nitride, or a combination thereof. In one embodiment, the continuous blocking dielectric layer 52L can include silicon oxide. In this case, the dielectric semiconductor compound of the continuous blocking dielectric layer 52L can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed.

A mask material layer 213 can be formed over the first exemplary structure, and can be lithographically patterned to cover each of the first-type support openings 19A and the memory openings 49, and not to cover the second-type support openings 19B. The mask material layer 213 includes a material that can be subsequently removed selective to the material of the continuous blocking dielectric layer 52L. For example, the mask material layer 213 may include amorphous carbon, diamond-like carbon, a semiconductor material (such as silicon or a silicon-germanium alloy), and/or a polymer material (e.g., photoresist). Alternatively, if subsequent layers are deposited over the mask at room temperature or close to room temperature (e.g., using ultra low temperature deposition), then photoresist can be used as the mask material layer 213. The material of the mask material layer 213 can be deposited anisotropically so that voids are formed within the volumes of the support openings 19 and the memory openings 49. The mask material layer 213 can be patterned, for example, by applying and lithographically patterning a photoresist material layer (not shown) so that the photoresist material layer covers each of the first-type support openings 19A and the memory openings 49, and not to cover the second-type support openings 19B, and by performing an etch process that etches unmasked portions of the mask material layer 213 employing an etch process (which may employ an isotropic etch process or an anisotropic etch process). The patterned photoresist layer can be subsequently removed, for example, by ashing. Alternatively, the mask material layer 213 may comprise the photoresist layer as noted above. In that case, the etch process is omitted. Thus, the memory opening 49 and the first-type support openings 19A can be covered with the mask material layer 213 without covering the second-type support openings 19B.

Figure 7C:
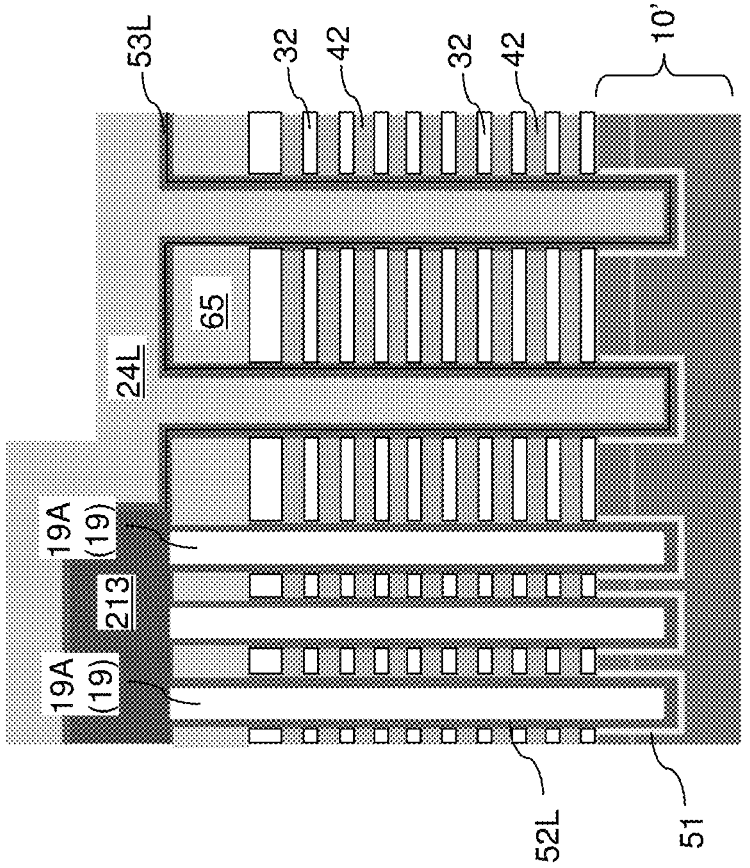

Referring to FIG. 7C, a silicon oxide liner layer 53L may be optionally deposited on the physically exposed surfaces of the continuous blocking dielectric layer 52L and over the mask material layer 213. For example, the silicon oxide liner layer 53L may include a low temperature oxide material, which is a silicon oxide material deposited by chemical vapor deposition at a temperature in a range from 350 degrees Celsius to 500 degrees Celsius.

A dielectric fill material layer 24L can be deposited in the second-type support openings 19B and over the mask material layer 213 over the silicon oxide liner layer 53L (if present) or directly on physically exposed surfaces of the continuous blocking dielectric layer 52L (in case the silicon oxide liner layer 53L is omitted). The dielectric fill material layer 24L includes a dielectric fill material that may be conformally deposited. For example, the dielectric fill material layer 24L can include undoped silicate glass, borosilicate glass, phosphosilicate glass, borophosphosilicate glass, organosilicate glass, or a combination thereof.

Figure 7D:
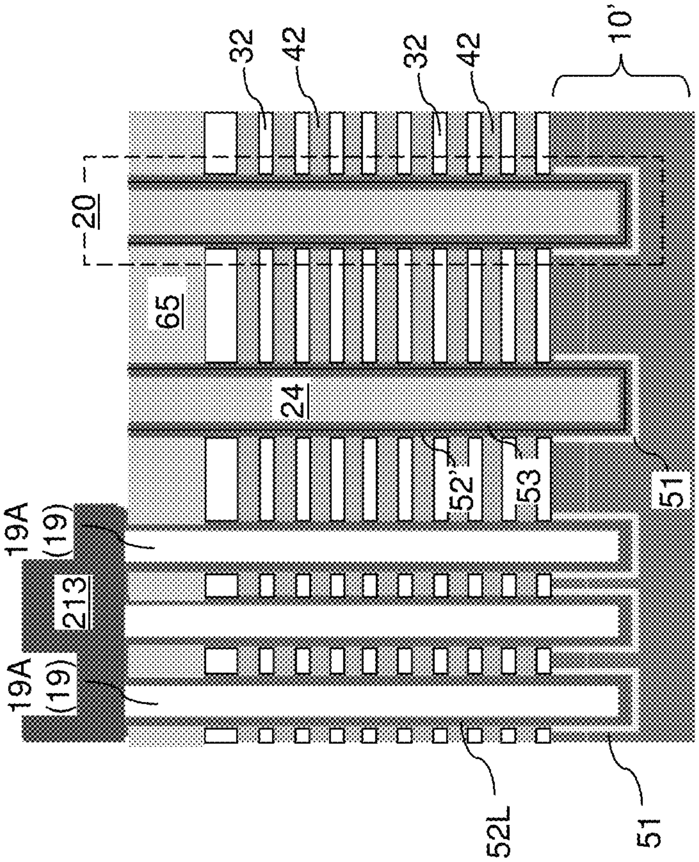

Referring to FIG. 7D, an etch back process can be performed to remove portions of the dielectric fill material layer 24L and the optional silicon oxide liner layer 53L that are located above the horizontal plane including the top surface of the retro-stepped dielectric material portion 65 and the top surface of the insulating cap layer 70. The etch back process may include an isotropic etch process, such as a wet etch process. For example, if the dielectric fill material layer 24L includes a dielectric fill material such as undoped silicate glass, borosilicate glass, phosphosilicate glass, borophosphosilicate glass, organosilicate glass, or a combination thereof, a wet etch process employing dilute hydrofluoric acid may be employed to isotropically recess the dielectric fill material layer 24L. In case the dielectric fill material layer 24L includes a silicate glass material having a higher etch rate in dilute hydrofluoric acid than the material of the silicon oxide liner layer 53L, the silicon oxide liner layer 53L may be employed as an etch stop structure. Portions of the silicon oxide liner layer 53L that overlie the horizontal plane including the top surface of the retro-stepped dielectric material portion 65 and the top surface of the insulating cap layer 70 can be subsequently removed employing an overetch process. Generally, portions of the dielectric fill material layer 24L located outside the second-type support openings 19B can be removed by the etch back process.

Each remaining portion of the continuous blocking dielectric layer 52L that remains in the second-type support opening 19B constitutes a dummy blocking dielectric layer 52'. Each remaining portion of the silicon oxide liner layer 53L that remains in the second-type support opening 19B constitutes a silicon oxide liner 53. Each remaining portion of the dielectric fill material layer 24L that remains in the second-type support opening 19B constitutes a dielectric fill material portion 24, which can be a dielectric pillar structure having a cylindrical sidewall. Each contiguous combination of an optional dielectric liner 51, a dummy blocking dielectric layer 52', an optional silicon oxide liner 53, and a dielectric fill material portion 24 constitutes a dielectric support pillar structure 20 consisting of at least one dielectric material, such as a plurality of dielectric materials, located in the second-type support opening 19B.

Figure 7E:
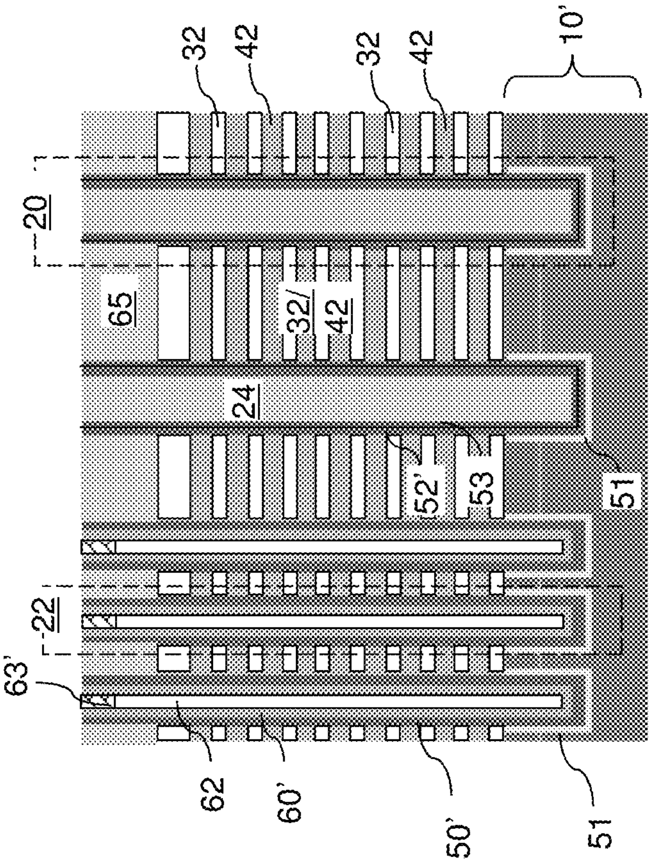

Referring to FIG. 7E, the mask material layer 213 can be removed selective to the material of the silicon oxide liner layer 53L (if present) or the continuous blocking dielectric layer 52L (in case the silicon oxide liner layer 53L is omitted), the dielectric fill material portions 24, and the retro-stepped dielectric material portion 65. For example, the mask material layer 213 may be removed employing an ashing process.

As shown in FIG. 12B, a layer stack of material layers can be sequentially deposited in the first-type support openings 19A and the memory openings 49. The layer stack of material layers can include, for example, a continuous memory material layer 54, an optional dielectric liner (such as a tunneling dielectric layer) 56, and a semiconductor channel material layer 60L.

Figure 12D:
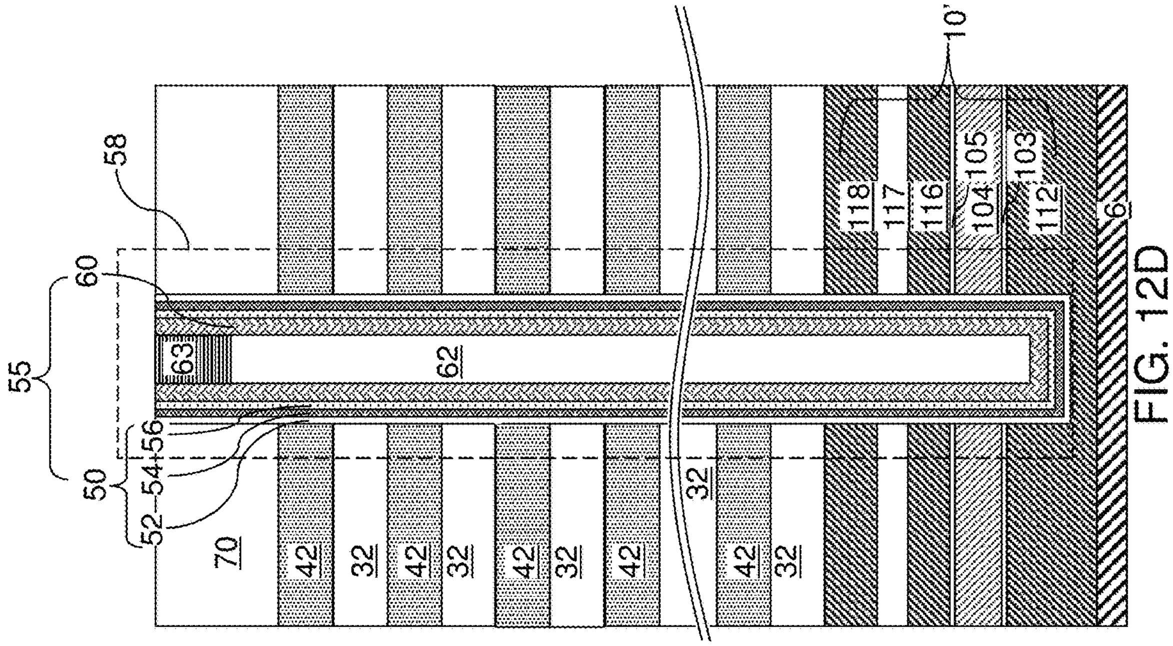
Figure 12C:
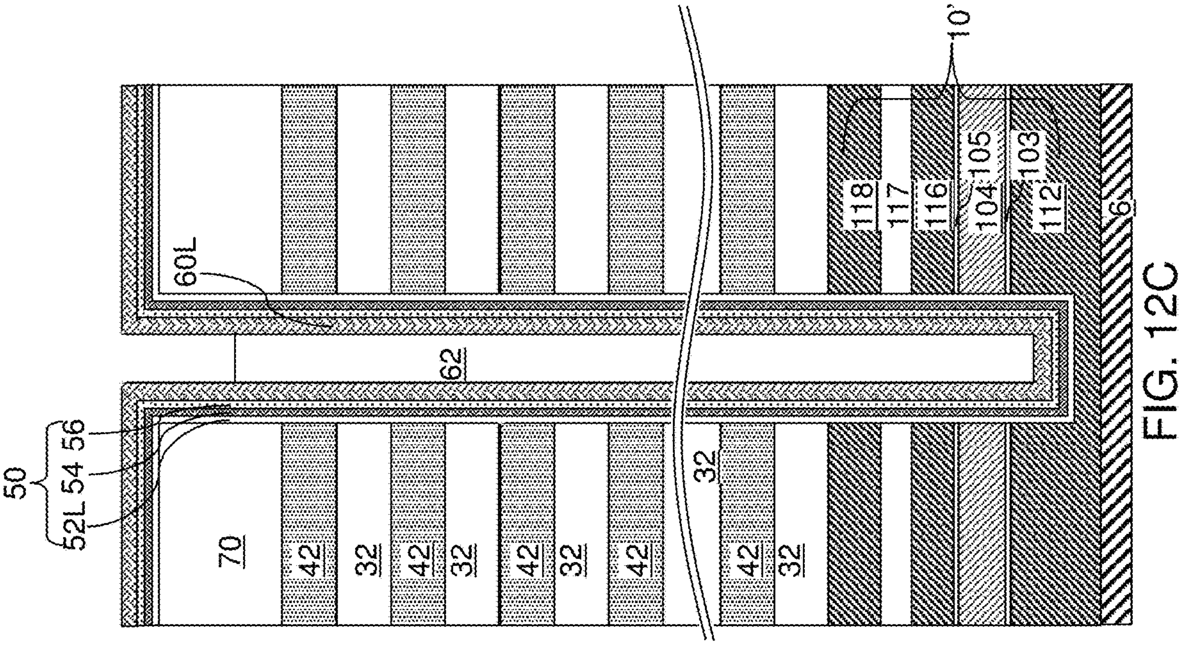
Figure 13A:
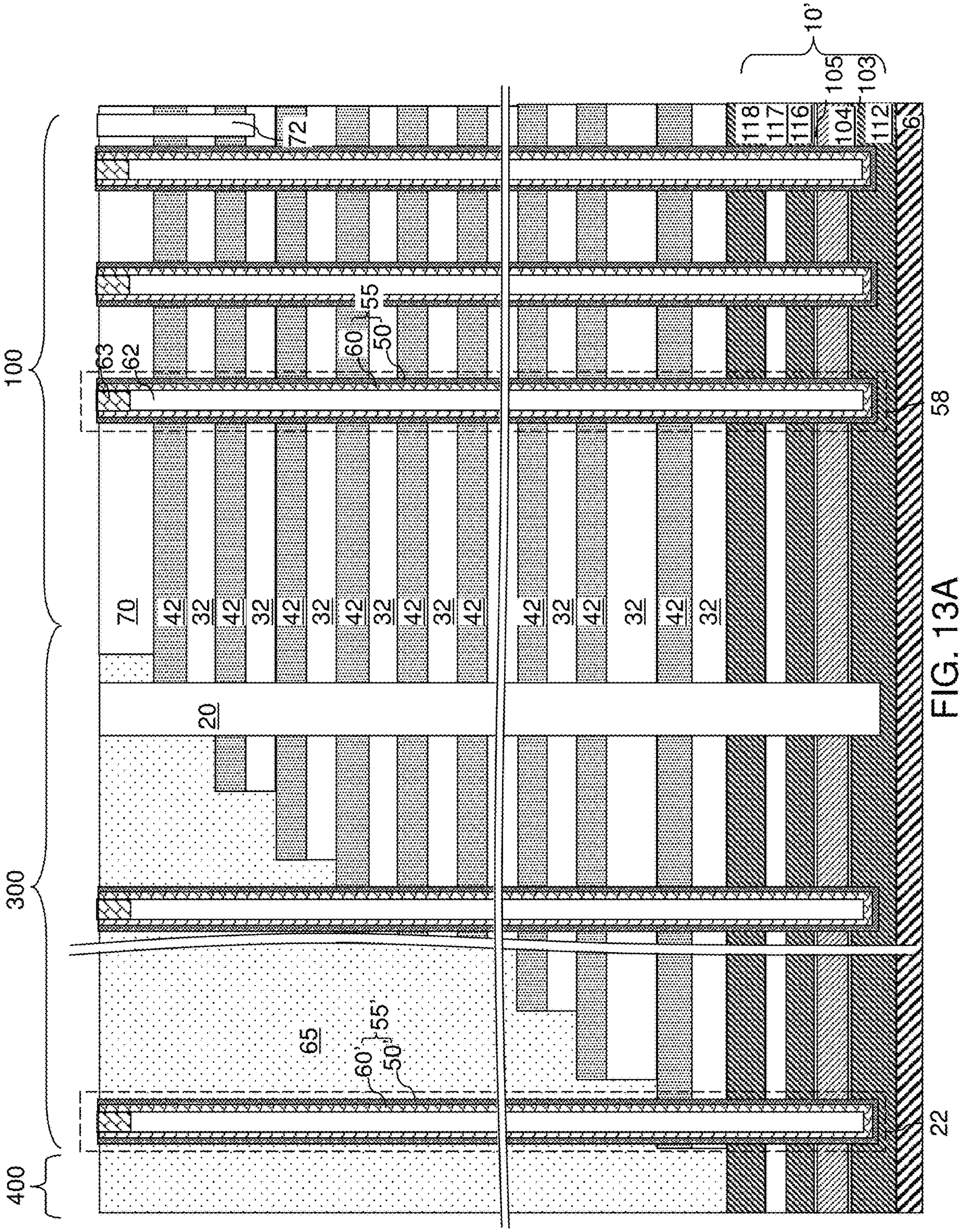
FIG. 13A is a schematic vertical cross-sectional view of a first configuration of the first exemplary structure after formation of memory opening fill structures and support pillar structures according to the first embodiment of the present disclosure.
Figure 13B:
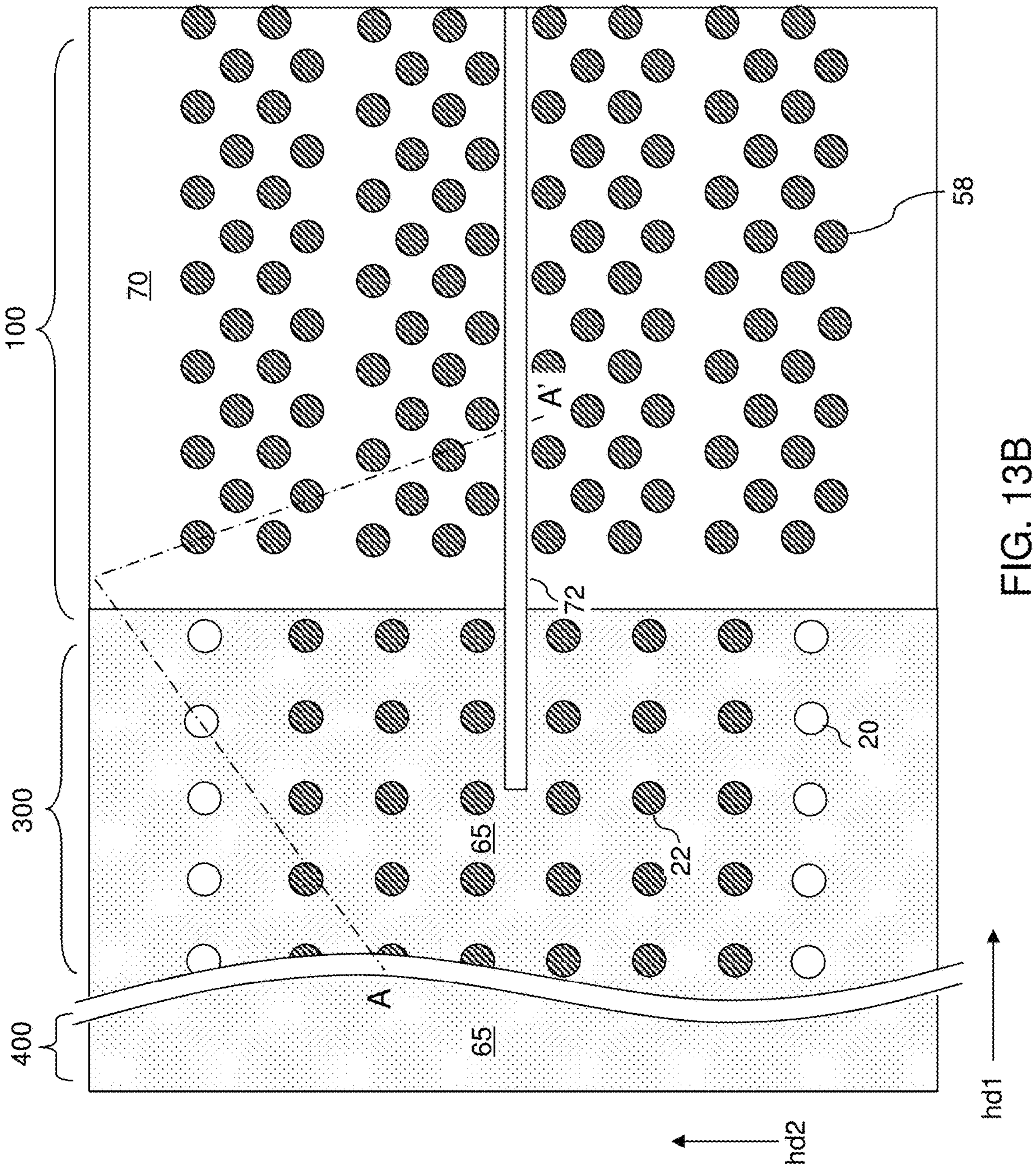
FIG. 13B is a top-down view of the exemplary configuration of FIG. 13A.
Figure 14A:
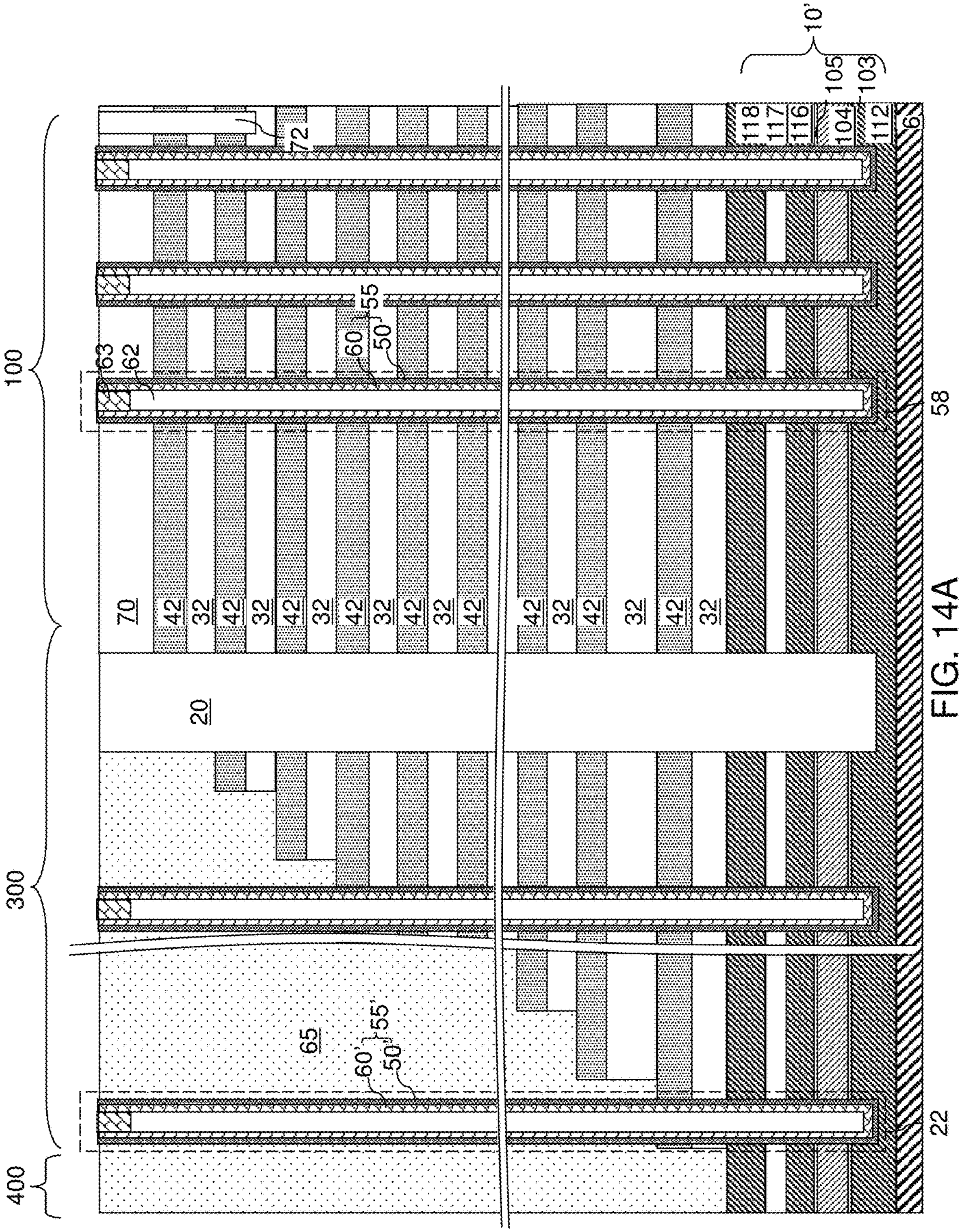
FIG. 14A is a schematic vertical cross-sectional view of a second configuration of the first exemplary structure after formation of memory opening fill structures and support pillar structures according to the second embodiment of the present disclosure.
Figure 14B:
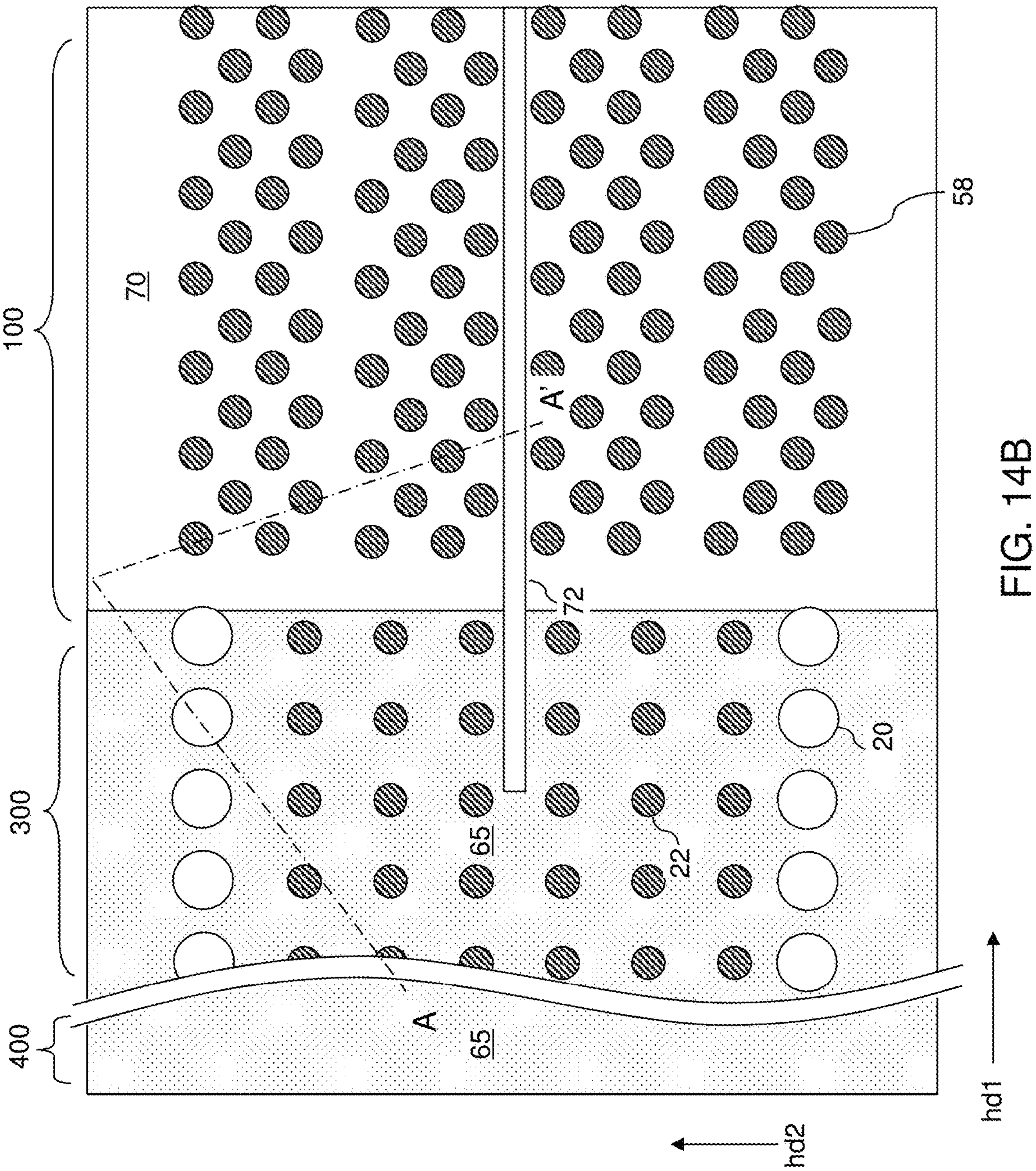
FIG. 14B is a top-down view of the exemplary configuration of FIG. 14A.
Figure 15A:
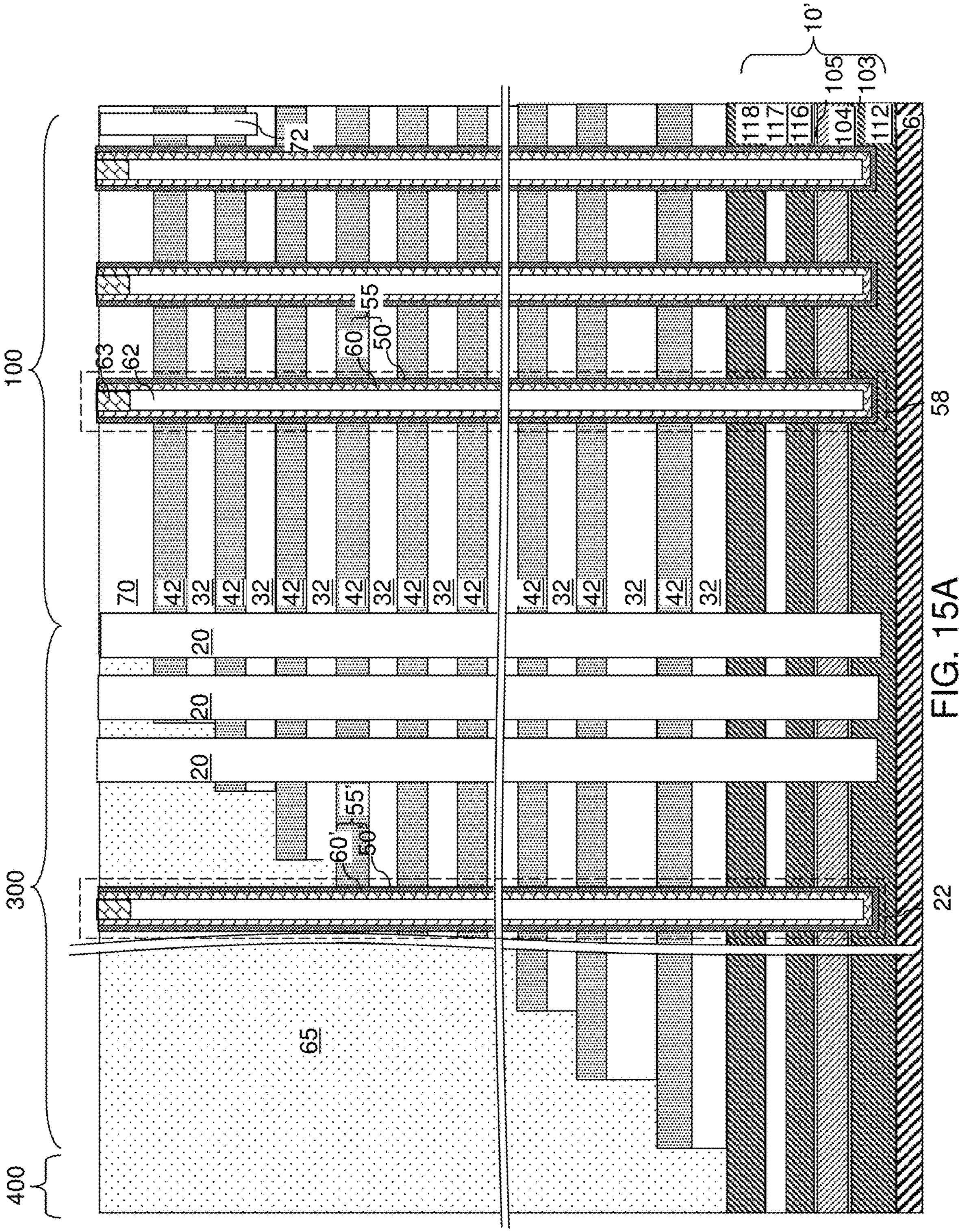
FIG. 15A is a schematic vertical cross-sectional view of a third configuration of the first exemplary structure after formation of memory opening fill structures and support pillar structures according to the third embodiment of the present disclosure.
Figure 15B:
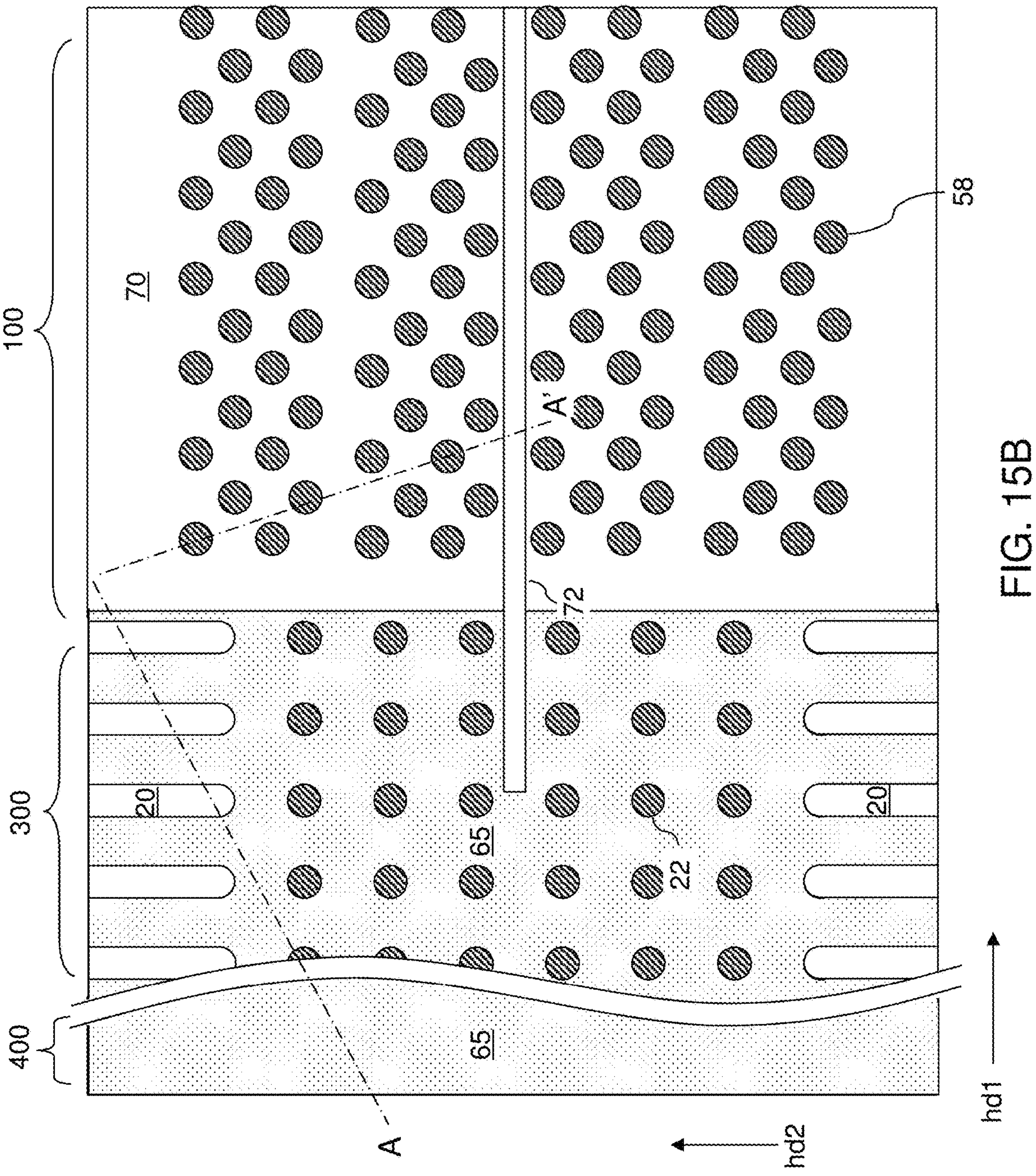
FIG. 15B is a top-down view of the exemplary configuration of FIG. 15A.
Figure 16A:
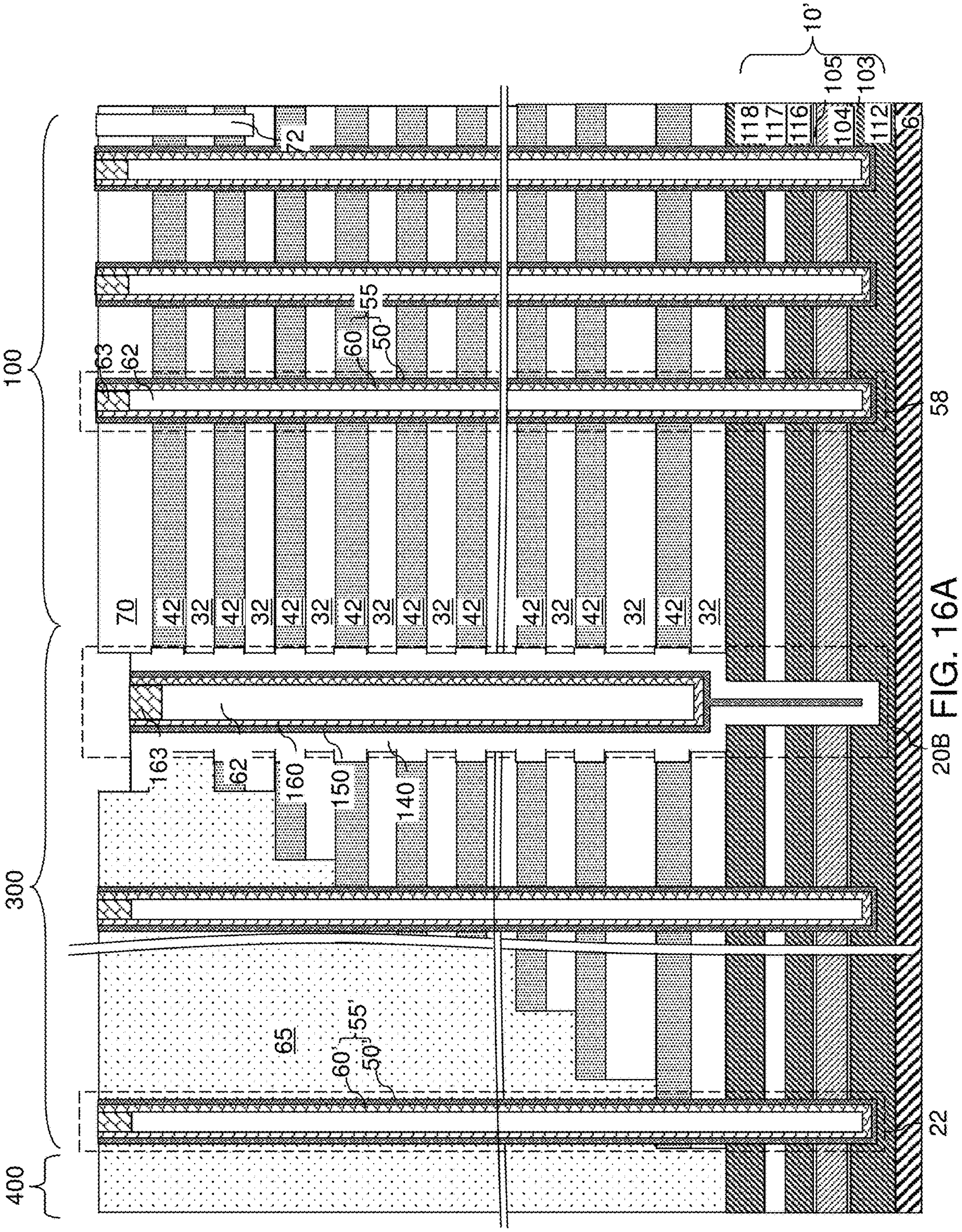
FIG. 16A is a schematic vertical cross-sectional view of a fourth configuration of the first exemplary structure after formation of memory opening fill structures and support pillar structures according to the fourth embodiment of the present disclosure.
Figure 16B:
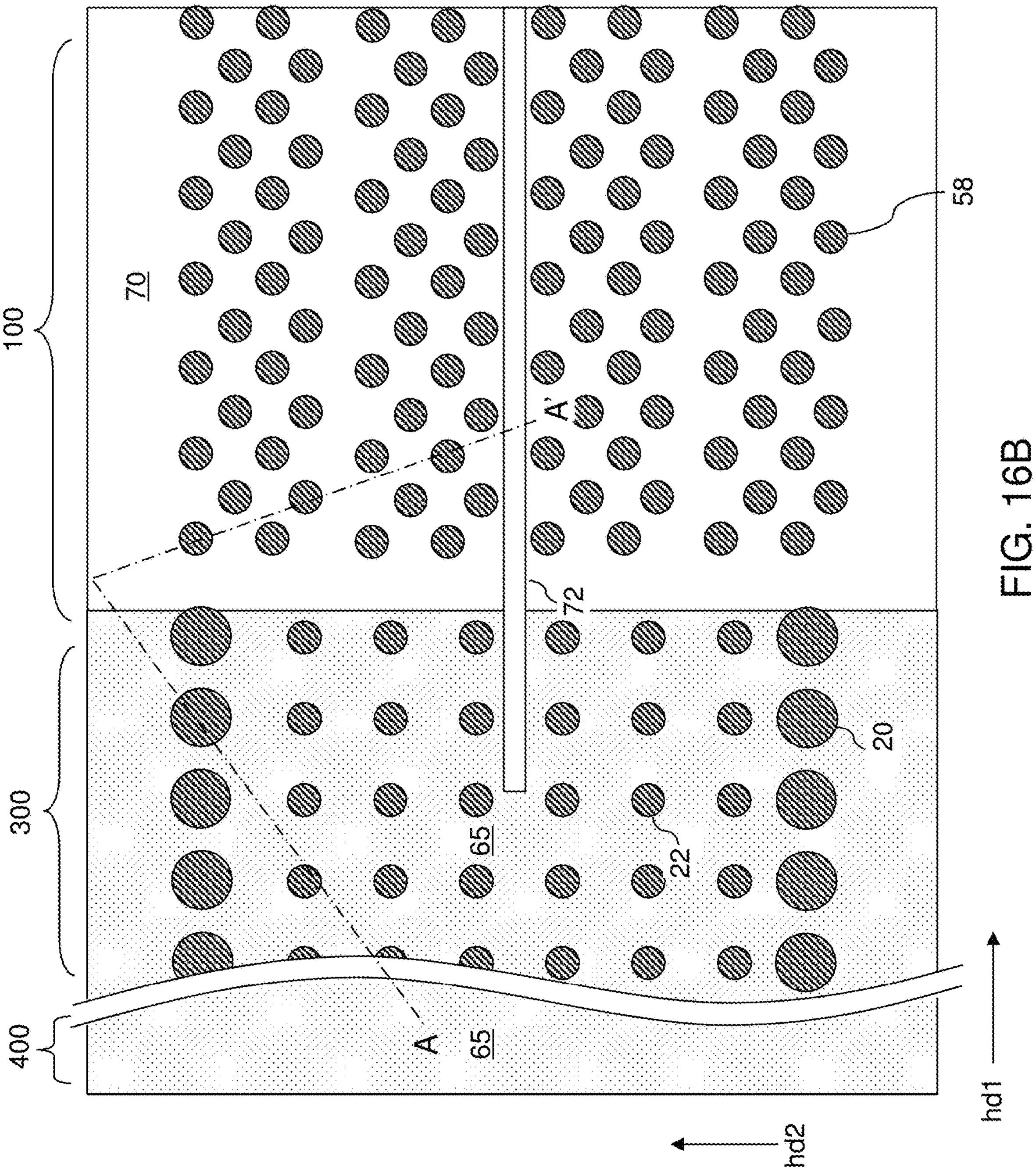
FIG. 16B is a top-down view of the exemplary configuration of FIG. 16A.
Figure 17A:
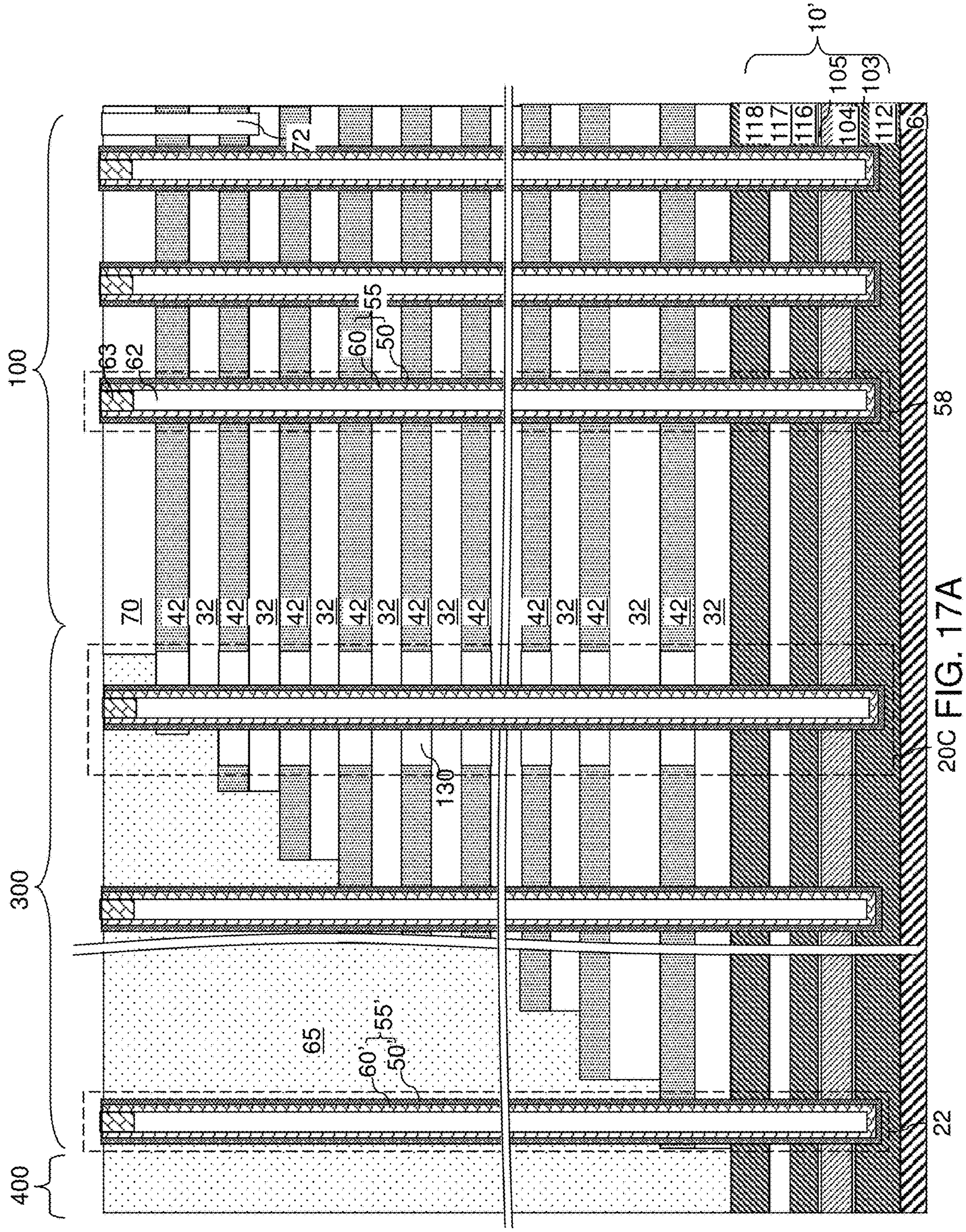
FIG. 17A is a schematic vertical cross-sectional view of a fifth configuration of the first exemplary structure after formation of memory opening fill structures and support pillar structures according to the fifth embodiment of the present disclosure.
Figure 17B:
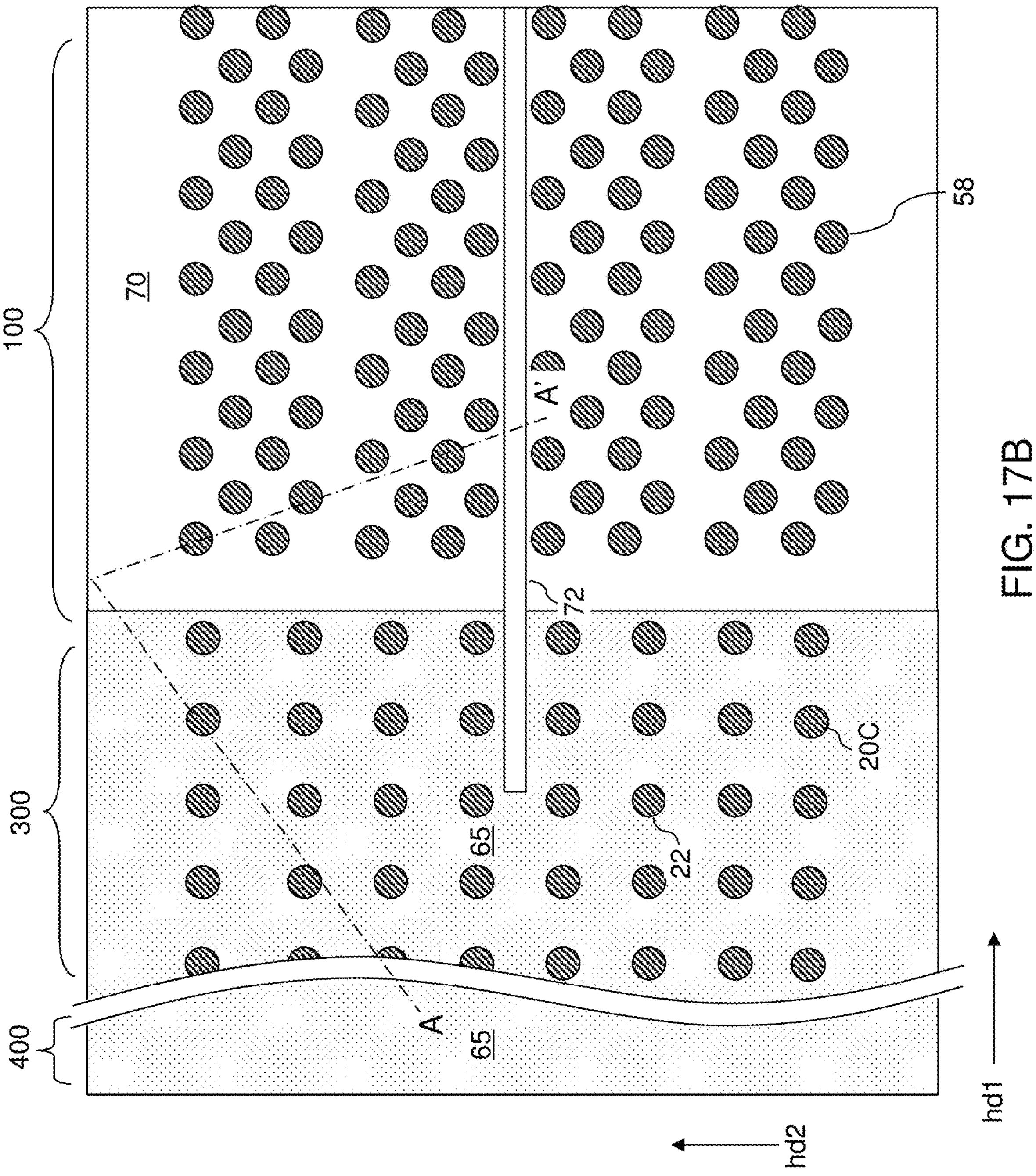
FIG. 17B is a top-down view of the exemplary configuration of FIG. 17A.

As shown in FIG. 12C, a dielectric core 62 can be formed within each of the memory openings 49 and within each of the first-type support openings 19A. The dielectric core 62 is recessed by selective etching.

Referring to FIGS. 7E and 12D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the dielectric liner 56, the memory material layer 54, and the continuous blocking dielectric layer 52L that overlie the horizontal plane including the top surface of the insulating cap layer 70 may be removed by etch back, such as reactive ion etching (RIE), chemical dry etching (CDE) or other suitable dry etching method. Each remaining portion of the doped semiconductor material of the second conductivity type constitutes a drain region 63.

Each continuous combination of remaining portions of the continuous dielectric layer 52L, the continuous memory material layer 54, and the optional dielectric liner layer 56 that remain in a memory opening 49 constitute a memory film 50 as shown in FIG. 12D. Each continuous combination of remaining portions of the continuous blocking dielectric layer 52, the continuous memory material layer 54, and the optional dielectric liner that remains in a first-type support opening 19A constitutes a dummy memory film 50' as shown in FIG. 7E. Each remaining portion of the semiconductor channel material layer 60L that remains in a memory opening 49 constitutes a vertical semiconductor channel 60. Each remaining portion of the semiconductor channel material layer 60 that remains in a first-type support opening 19A constitutes a dummy vertical semiconductor channel 60'. Each remaining portion of the doped semiconductor material that remains in a memory opening constitutes a drain region 63. Each remaining portion of the doped semiconductor material that remains in a first-type support openings 19A constitutes a dummy drain region 63'. Generally, a "dummy" element refers to an element that is not electrically active, and is electrically floating and not electrically connected to a bit line.

Each contiguous set of material portions filling a memory opening 49 constitutes a memory opening fill structure 58, as shown in FIG. 12D. Each contiguous set of material portions filling a first-type support opening 19A constitutes a first-type support pillar structure 22, which is a composite support pillar structure including at least one dielectric material and at least one semiconductor material. Each continuous set of material portions filling a second-type support opening 19B constitutes a second-type support pillar structure 20, which is a dielectric support pillar structure consisting of at least one dielectric material such as a plurality of dielectric materials, but may exclude a semiconductor material. The support pillar structures are not electrically connected to bit lines.

Optionally, each of the dielectric support pillar structures (i.e., the second-type support pillar structures 20) and the composite support pillar structures (i.e., the first-type support pillar structures 22) comprises a respective dielectric liner 51 underlying the alternating stack (32, 42) and embedded in, and contacting, the in-process source-level material layers 10'.

Figure 8A:
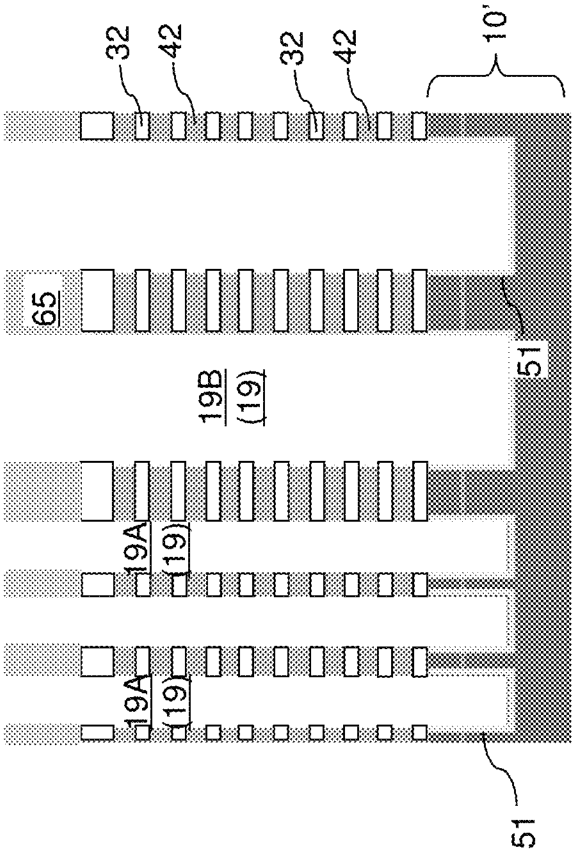
FIGS. 8A-8E are sequential vertical cross-sectional views along a hinged vertical plane X-X' of FIG. 5B during formation of first-type support pillar structures and second-type support pillar structures in a second configuration according to the second embodiment of the present disclosure.

Referring to FIG. 8A, a region of the first exemplary structure is shown along the vertical plane X-X' of FIG. 5B. The first-type support pillar structures and the second-type support pillar structures in the second configuration can be formed employing the first exemplary structure of FIGS. 5A and 5B, which includes first-type support openings 19A and second-type support openings 19B that are arranged in the second layout. The second-type support openings 19B can have a greater lateral dimension than the first-type support openings 19A. Optionally, an oxidation process such as a thermal oxidation process or a plasma oxidation process can be performed to convert physically exposed surfaces portions of semiconductor materials in the in-process source-level material layers 10'. In this case, dielectric liners 51 may be formed at the bottom of each of the first-type support openings 19A, the second-type support openings 19B, and the memory openings 49. The thickness of each dielectric liner 51 may be in a range from 1 nm to 10 nm, such as from 2 nm to 6 nm, although lesser and greater thicknesses may also be employed.

Figure 8B:
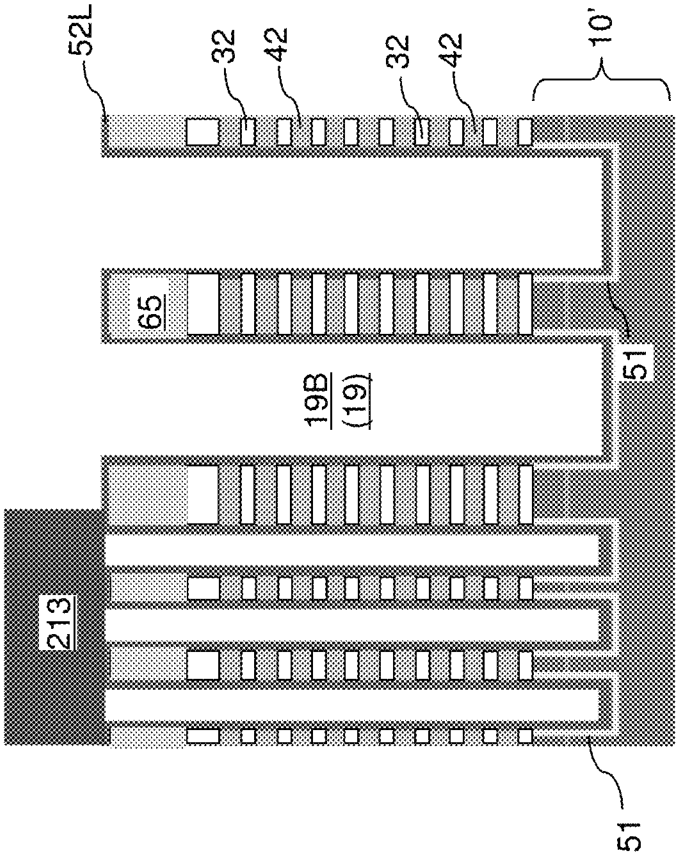

Referring to FIG. 8B, a continuous blocking dielectric layer 52L can be conformally formed on physically exposed sidewalls of the alternating stack (32, 42) within each of the first-type support openings 19A, and the second-type support openings 19B, and the memory openings 49 (not illustrated in FIG. 7B). The processing steps of FIG. 7B can be performed to form the continuous blocking dielectric layer 52L.

A mask material layer 213 can be formed over the first exemplary structure, and can be lithographically patterned to cover each of the first-type support openings 19A and the memory openings 49, and not to cover the second-type support openings 19B. The processing steps of FIG. 7B can be employed to form the mask material layer 213.

Figure 8C:
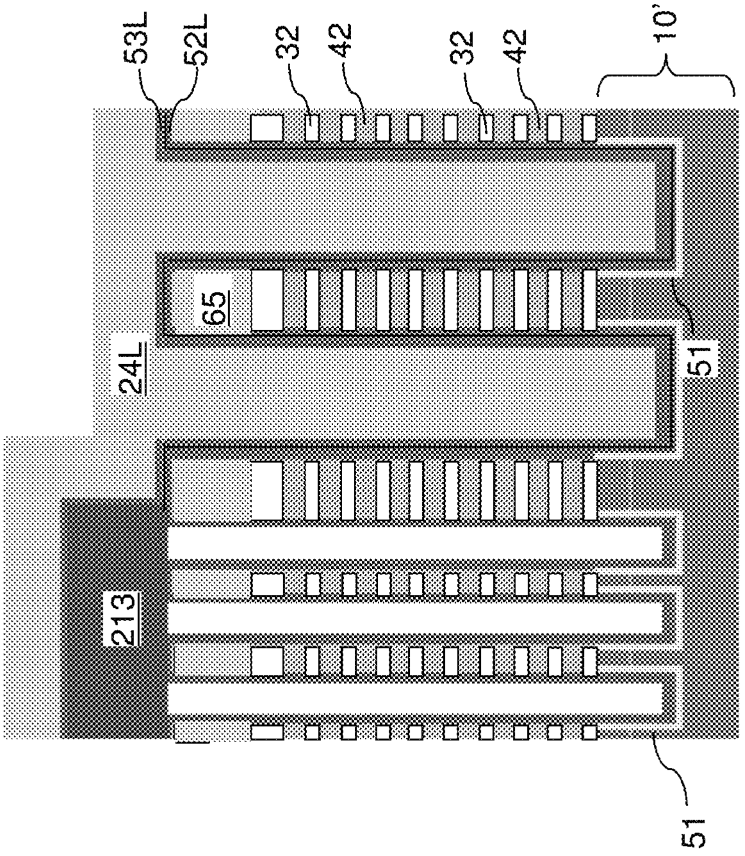

Referring to FIG. 8C, a silicon oxide liner layer 53L may be optionally deposited on the physically exposed surfaces of the continuous blocking dielectric layer 52L and over the mask material layer 213. A dielectric fill material layer 24L can be deposited in the second-type support openings 19B and over the mask material layer 213 over the silicon oxide liner layer 53L (if present) or directly on physically exposed surfaces of the continuous blocking dielectric layer 52L (in case the silicon oxide liner layer 53L is not employed). The processing steps of FIG. 7C can be employed.

Figure 8D:
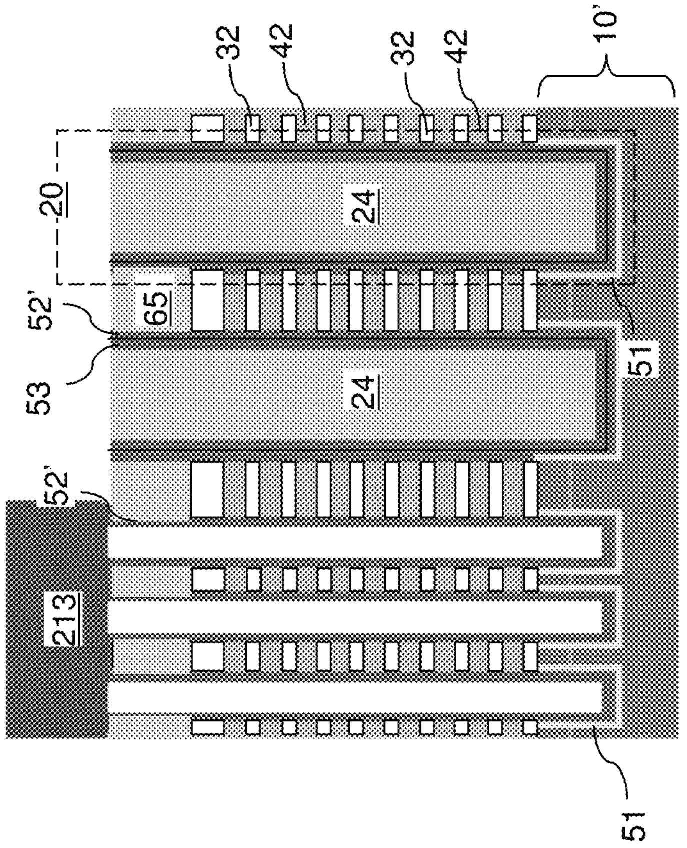

Referring to FIG. 8D, an etch back process can be performed to remove portions of the dielectric fill material layer 24L and the optional silicon oxide liner layer 53L that are located above the horizontal plane including the top surface of the retro-stepped dielectric material portion 65 and the top surface of the insulating cap layer 70. The processing steps of FIG. 7D can be performed.

Each remaining portion of the continuous blocking dielectric layer 52L that remains in a first-type support openings 19A or in a second-type support opening 19B constitutes a dummy blocking dielectric layer 52'. Each remaining portion of the silicon oxide liner layer 53L that remains in a second-type support opening 19B constitutes a silicon oxide liner 53. Each remaining portion of the dielectric fill material layer 24L that remains in a second-type support opening 19B constitutes a dielectric fill material portion 24, which can be a dielectric pillar structure having a cylindrical sidewall. Each contiguous combination of an optional dielectric liner 51, a dummy blocking dielectric layer 52', an optional silicon oxide liner 53, and a dielectric fill material portion 24 constitutes a dielectric support pillar structure 20 consisting of at least one dielectric material, such as a plurality of dielectric materials.

Figure 8E:
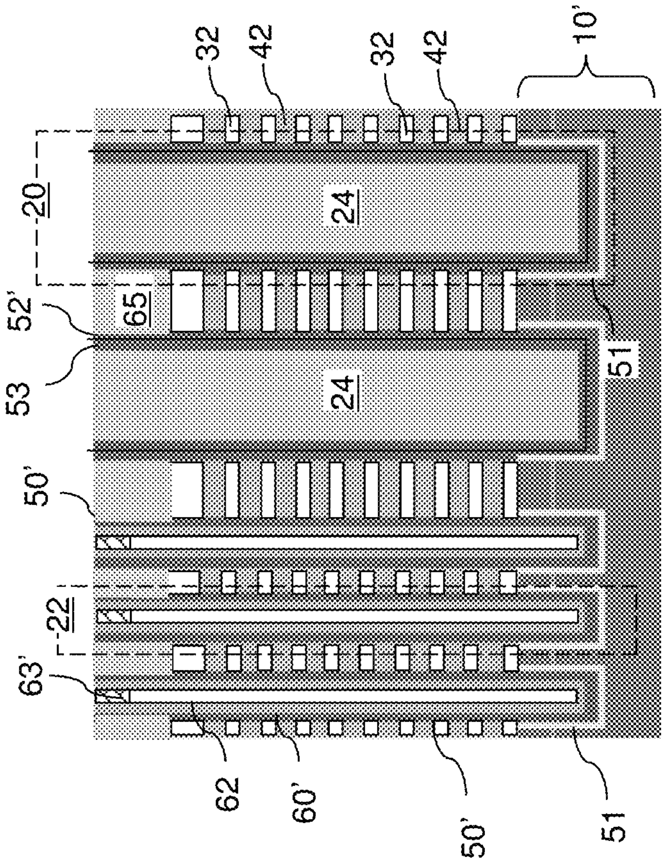

Referring to FIG. 8E, the processing steps FIG. 7E can be performed to form memory opening fill structures 58 (shown in FIG. 12D), first-type support pillar structures 22 (which are composite support pillar structures), and second-type support pillar structures 20 (which are dielectric support pillar structures consisting of at least one dielectric material such as a plurality of dielectric materials). Optionally, each of the dielectric support pillar structures (i.e., the second-type support pillar structures 20) and the composite support pillar structures (i.e., the first-type support pillar structures 22) comprises a respective dielectric liner 51 underlying the alternating stack (32, 42) and embedded in, and contacting, the in-process source-level material layers 10'.

Figure 9A:
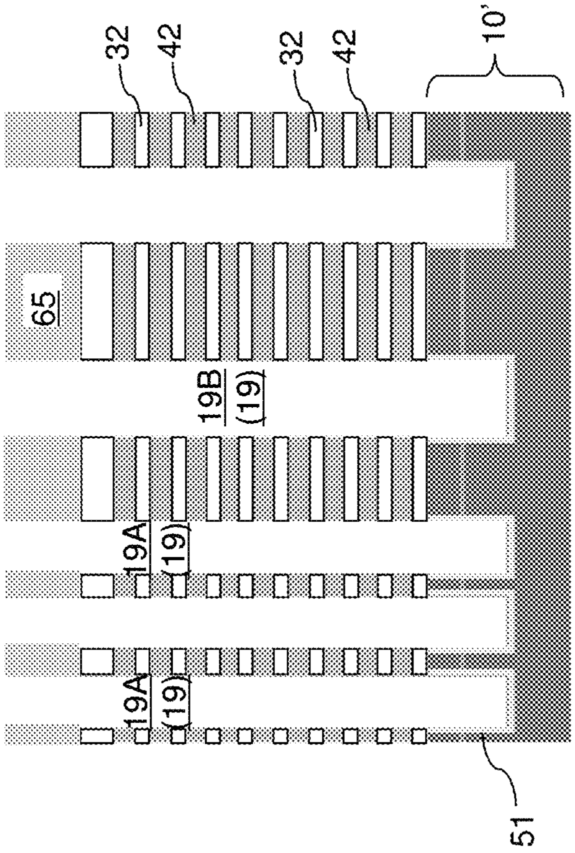
FIGS. 9A-9E are sequential vertical cross-sectional views along a hinged vertical plane X-X' of FIG. 6B during formation of first-type support pillar structures and second-type support pillar structures in a third configuration according to the third embodiment of the present disclosure.

Referring to FIG. 9A, a region of the first exemplary structure is shown along the vertical plane X-X' of FIG. 6B. The first-type support pillar structures and the second-type support pillar structures in the third configuration can be formed employing the first exemplary structure of FIGS. 6A and 6B, which includes first-type support openings 19A and second-type support openings 19B that are arranged in the third layout. The second-type support openings 19B can be elongated along the second horizontal direction hd2. The ratio of the lateral dimension of each second-type support opening 19B along the second horizontal direction hd2 may be in a range from twice the lateral dimension of the respective second-type support opening 19B along the first horizontal direction hd1 to 20 times the lateral dimension of the respective second-type support opening 19B along the first horizontal direction hd1.

Optionally, an oxidation process such as a thermal oxidation process or a plasma oxidation process can be performed to convert physically exposed surfaces portions of semiconductor materials in the in-process source-level material layers 10'. In this case, dielectric liners 51 may be formed at the bottom of each of the first-type support openings 19A, the second-type support openings 19B, and the memory openings 49. The thickness of each dielectric liner 51 may be in a range from 1 nm to 10 nm, such as from 2 nm to 6 nm, although lesser and greater thicknesses may also be employed.

Figure 9B:
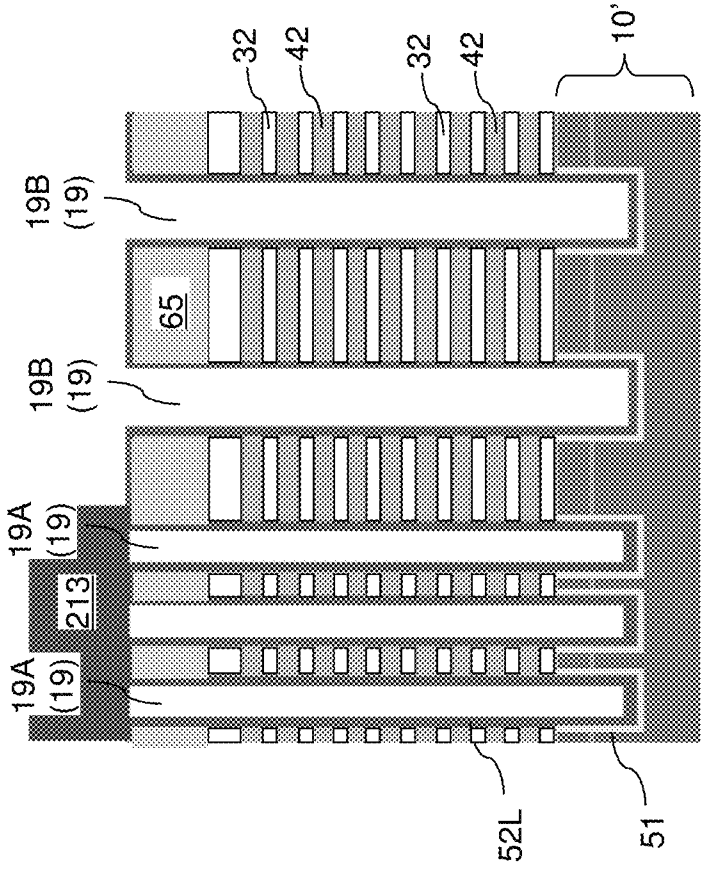

Referring to FIG. 9B, a continuous blocking dielectric layer 52L can be conformally formed on physically exposed sidewalls of the alternating stack (32, 42) within each of the first-type support openings 19A, and the second-type support openings 19B, and the memory openings 49. The processing steps of FIG. 7B can be performed to form the continuous blocking dielectric layer 52L.

A mask material layer 213 can be formed over the first exemplary structure, and can be lithographically patterned to cover each of the first-type support openings 19A and the memory openings 49, and not to cover the second-type support openings 19B. The processing steps of FIG. 7B can be employed to form the mask material layer 213.

Figure 9C:
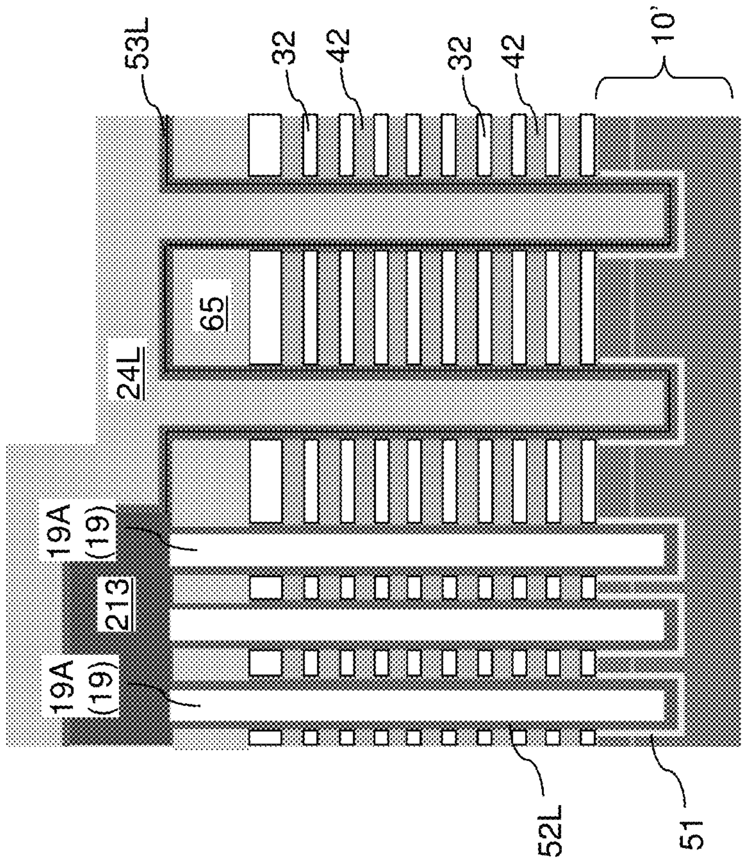

Referring to FIG. 9C, a silicon oxide liner layer 53L may be optionally deposited on the physically exposed surfaces of the continuous blocking dielectric layer 52L and over the mask material layer 213. A dielectric fill material layer 24L can be deposited in the second-type support openings 19B and over the mask material layer 213 over the silicon oxide liner layer 53L (if present) or directly on physically exposed surfaces of the continuous blocking dielectric layer 52L (in case the silicon oxide liner layer 53L is not employed). The processing steps of FIG. 7C can be employed.

Figure 9D:
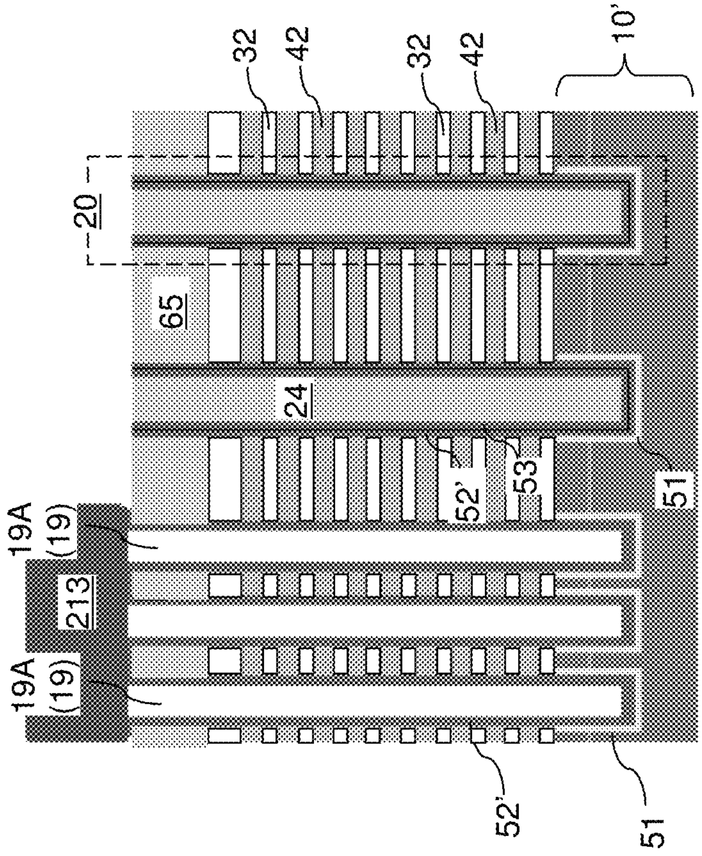

Referring to FIG. 9D, an etch back process can be performed to remove portions of the dielectric fill material layer 24L and the optional silicon oxide liner layer 53L that are located above the horizontal plane including the top surface of the retro-stepped dielectric material portion 65 and the top surface of the insulating cap layer 70. The processing steps of FIG. 7D can be performed.

Each remaining portion of the continuous blocking dielectric layer 52L that remains in a first-type support openings 19A or in a second-type support opening 19B constitutes a dummy blocking dielectric layer 52'. Each remaining portion of the silicon oxide liner layer 53L that remains in a second-type support opening 19B constitutes a silicon oxide liner 53. Each remaining portion of the dielectric fill material layer 24L that remains in a second-type support opening 19B constitutes a dielectric fill material portion 24, which can be an elongated dielectric pillar structure having two planar sidewalls along the second horizontal direction hd2 and curved convex sidewalls along the first horizontal direction hd1. Each contiguous combination of an optional dielectric liner 51, a dummy blocking dielectric layer 52', an optional silicon oxide liner 53, and a dielectric fill material portion 24 constitutes a dielectric support pillar structure 20 consisting of at least one dielectric material, such as a plurality of dielectric materials.

Figure 9E:
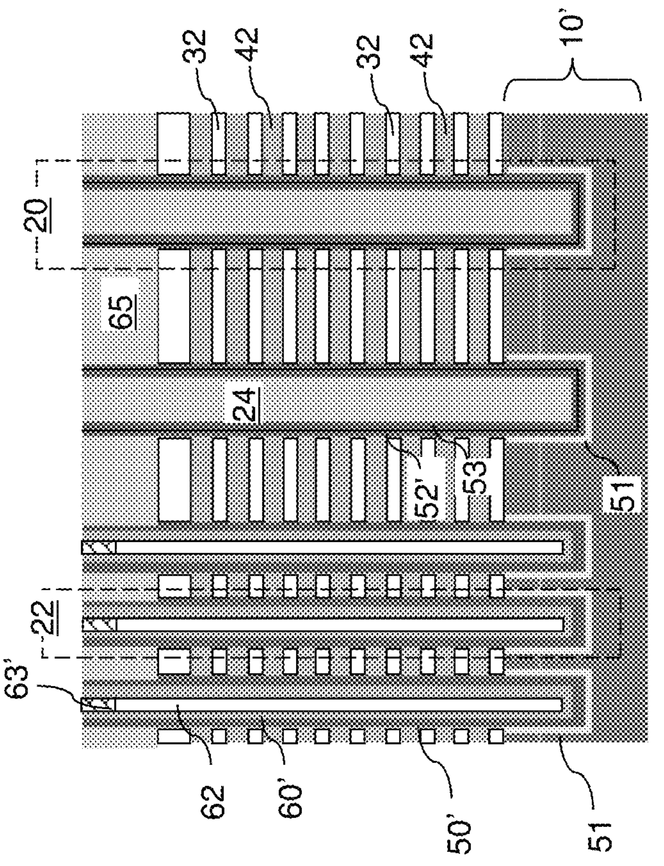

Referring to FIG. 9E, the processing steps FIG. 7E can be performed to form memory opening fill structures 58 (shown in FIG. 12D), first-type support pillar structures 22 (which are composite support pillar structures), and second-type support pillar structures 20 (which are dielectric support pillar structures consisting of at least one dielectric material such as a plurality of dielectric materials). Optionally, each of the dielectric support pillar structures (i.e., the second-type support pillar structures 20) and the composite support pillar structures (i.e., the first-type support pillar structures 22) comprises a respective dielectric liner 51 underlying the alternating stack (32, 42) and embedded in, and contacting, the in-process source-level material layers 10'.

Referring collectively to FIGS. 7A-7E, 8A-8E, 9A-9E and 12D, memory opening fill structures 58, dielectric support pillar structures (comprising the second-type support pillar structures 20), and composite support pillar structures (comprising the first-type support pillar structures 22) can be formed in the memory openings 49, the second-type support openings 19B, and the first-type support openings 19A, respectively. Material layers comprising a memory material layer and a semiconductor channel material layer can be deposited and planarized during formation of the memory opening fill structures 58 and the composite support pillar structures 22.

Memory opening fill structures 58 can be formed within a respective memory opening 49, and can vertically extend through the alternating stack (32, 42) in the memory array region 100. Each of the memory opening fill structures 58 comprises a respective vertical semiconductor channel 60 and a respective memory film 60 containing at least a memory material layer 54. The dielectric support pillar structures (comprising the second-type support pillar structures 20) can be located in the staircase region 300, and can vertically extend through the alternating stack (32, 42), and can be free of any semiconductor material therein. The composite support pillar structures (comprising the first-type support pillar structures 22) can be located in the staircase region 300, and can vertically extending through the alternating stack (32, 42). Each of the composite support pillar structures comprises a dummy vertical semiconductor channel 60' including a same material as the vertical semiconductor channels 60.

In one embodiment, each of the memory material layers 50 comprises a respective a memory material layer 54, and each of the composite support pillar structures comprises a respective dummy memory material layer. In one embodiment, the dielectric support pillar structures are free of the memory material.

Figure 10A:
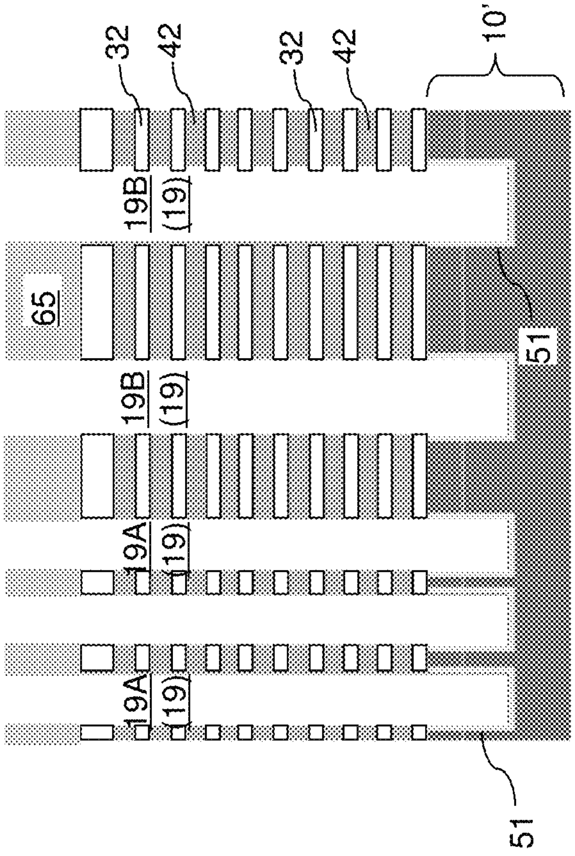
FIGS. 10A-10I are sequential vertical cross-sectional views along a hinged vertical plane X-X' of FIG. 4B, 5B, or 6B during formation of first-type support pillar structures and second-type support pillar structures in a fourth configuration according to a fourth embodiment of the present disclosure.

Referring to FIG. 10A, a region of the first exemplary structure is shown along the vertical plane X-X' of FIG. 4B or 5B. The first-type support pillar structures and the second-type support pillar structures in the fourth configuration can be formed employing the first exemplary structure of FIGS. 4A and 4B, or employing the structure of FIGS. 5A and 5B. Thus, the first-type support openings 19A and the second-type support openings 19B may be arranged in the first layout illustrated in FIGS. 4A and 4B, or in the second layout illustrated in FIGS. 5A and 5B. Preferably, the first-type support openings 19A and the second-type support openings 19B are arranged in the first layout illustrated in FIGS. 4A and 4B.

Optionally, an oxidation process such as a thermal oxidation process or a plasma oxidation process can be performed to convert physically exposed surfaces portions of semiconductor materials in the in-process source-level material layers 10'. In this case, dielectric liners 51 may be formed at the bottom of each of the first-type support openings 19A, the second-type support openings 19B, and the memory openings 49. The thickness of each dielectric liner 51 may be in a range from 1 nm to 10 nm, such as from 2 nm to 6 nm, although lesser and greater thicknesses may also be employed.

Figure 10B:
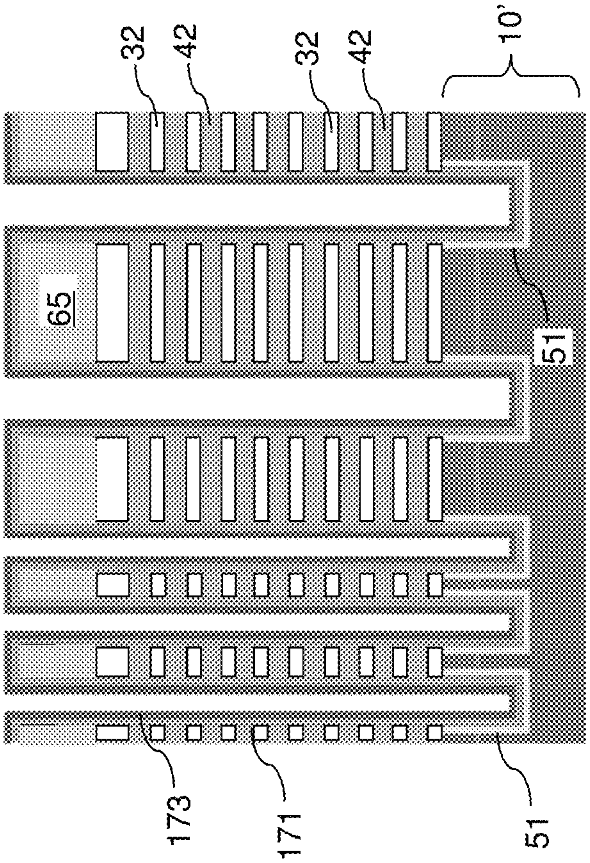

Referring to FIG. 10B, at least one cover material layer (171, 173) can be conformally deposited in the first-type support openings 19A, the second-type support openings 19B, and the memory openings 49. In one embodiment, the at least one cover material layer (171, 173) can include a first cover material layer 171, and a second cover material layer 173. In one embodiment, the first cover material layer 171 can include a semiconductor material, such as amorphous silicon, and the second cover material layer 173 can include a dielectric material, such as silicon oxide. Generally, the material(s) of the at least one cover material layer (171, 173) can be selected such that the at least one cover material layer (171, 173) can function as a respective etch stop layer in subsequent etch processes.

Figure 10C:
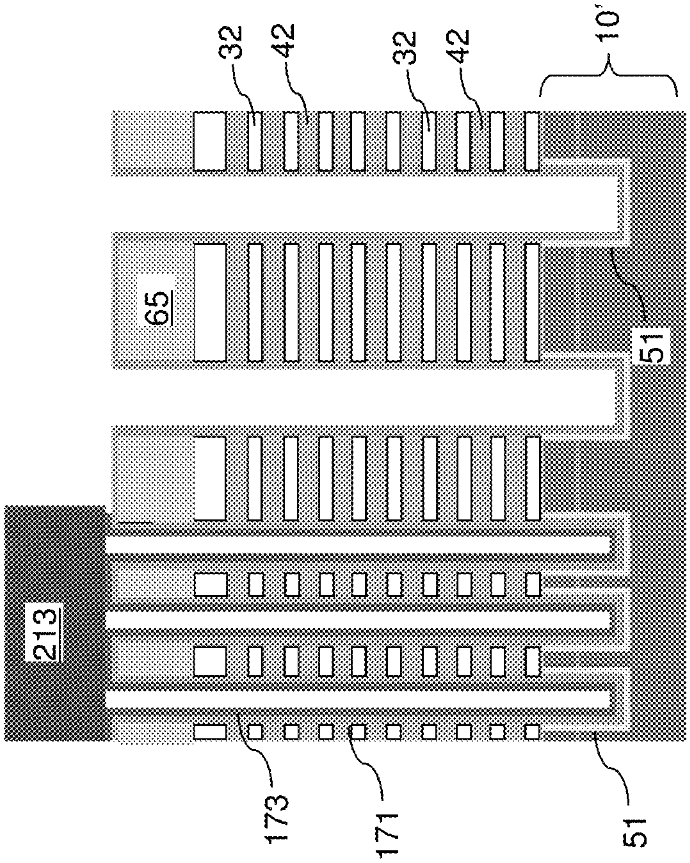

Referring to FIG. 10C, a mask material layer 213 can be formed over the first exemplary structure, and can be lithographically patterned to cover each of the first-type support openings 19A and the memory openings 49, and not to cover the second-type support openings 19B. The processing steps of FIG. 7B can be employed to form the mask material layer 213.

An isotropic etch process such as a wet etch process can be performed to remove physically exposed portions of the second cover material layer 173, if present. For example, if the second cover material layer 173 includes silicon oxide, a wet etch process employing hydrofluoric acid can be performed to remove unmasked portions of the second cover material layer selective to the first cover material layer 171.

Figure 10D:
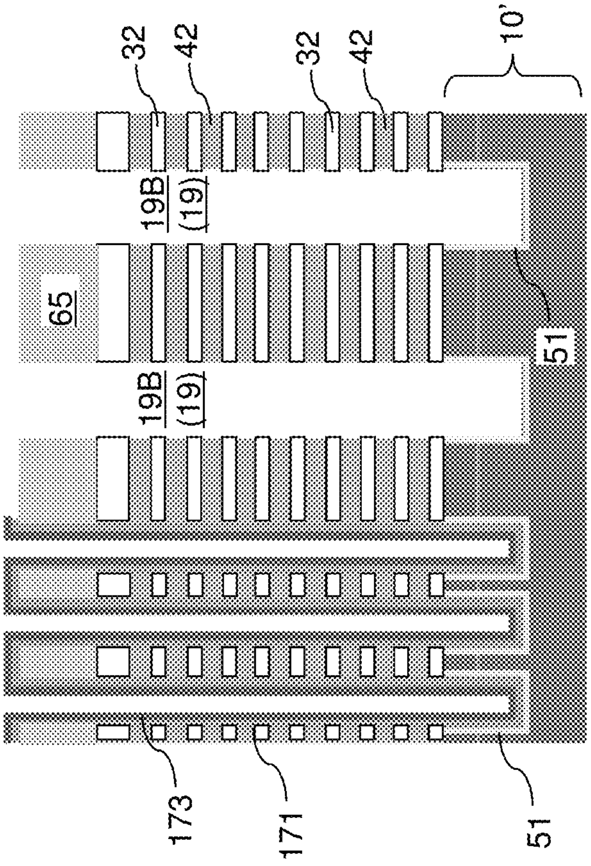

Referring to FIG. 10D, the mask material layer 213 can be removed, for example, by ashing selective to the material of the second cover material layer 173 and the first sacrificial cover material layer 171. Subsequently, an isotropic etch process such as a wet etch process can be performed to remove unmasked portions of the first cover material layer 171 selective to the materials of the second cover material layer 173, the insulating layers 32, the sacrificial material layers 42, and the retro-stepped dielectric material portion 65. For example, if the first cover material layer 171 includes amorphous silicon, a wet etch process using hot trimethyl-2 hydroxyethyl ammonium hydroxide ("hot TMY") or tetramethyl ammonium hydroxide (TMAH) may be used to remove physically exposed portions of the first cover material layer 171. Sidewalls of the insulating layers 32 and the sacrificial material layers 42 can be physically exposed around each of the second-type support openings 19B. The remaining second cover material layer 173 covers the first cover material layer 171 in the first-type support openings 19A and the memory openings 49 such that the least one cover material layer (171, 173) is not removed from the first-type support openings 19A and the memory openings 49.

Figure 10E:
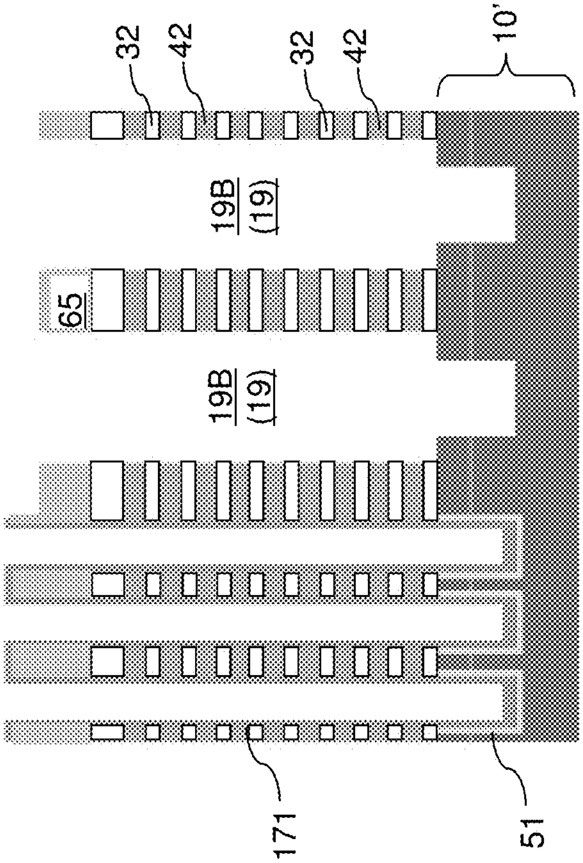

Referring to FIG. 10E, at least one isotropic etch process can be performed to isotropically recess the insulating layers 32 and the sacrificial material layers 42 around each of the second-type support openings 19B. The insulating cap layer 70 and the retro-stepped dielectric material portion 65 may be collaterally recessed during isotropic recessing of the insulating layers 32 and the sacrificial material layers 42.

The second-type support openings 19B are laterally expanded at levels of the alternating stack (32, 42) while the sidewalls of the first-type support openings 19A and the memory openings 49 are covered with a cover material layer (such as the least one cover material layer (171, 173)) and are not recessed. In an illustrative example, if the insulating layers 32, the insulating cap layer 70, and the retro-stepped dielectric material portion 65 include silicon oxide and if the sacrificial material layers 42 include silicon nitride, a first wet etch process employing dilute hydrofluoric acid can be performed to isotropically recess the insulating layers 32, the insulating cap layer 70, and the retro-stepped dielectric material portion 65, and a second wet etch process employing hot phosphoric acid can be performed to isotropically recess the sacrificial material layers 42. In an illustrative example, the recess distance of the first wet etch process may be in a range from 5 nm to 100 nm, and the recess distance of the second wet etch process may be in a range from 5 nm to 100 nm, although lesser and greater recess distances may also be employed.

If the second cover material layer 173 comprises silicon oxide, then it may be collaterally etched during the first wet etch process, as shown in FIG. 10E. However, the first cover material layer 171 remains on the sidewalls of the first-type support openings 19A and the memory openings 49 and prevents the sidewalls from being recessed during the first and second wet etch processes.

An upper portion of each second-type support openings 19B overlying the horizontal plane including the top surface of the in-process source-level material layers 10' can have a greater lateral extent than a lower portion of the respective second-type support opening 19B underlying the horizontal plane including the top surface of the in-process source-level material layers 10'. In one embodiment, the second-type support openings 19B are laterally expanded at levels of the alternating stack (32, 42) and are not laterally expanded at the level of the in-process source-level material layers 10' because both wet etch processes are not selective for the semiconductor material (e.g., silicon) of the in-process source-level material layers 10'.

Figure 10F:
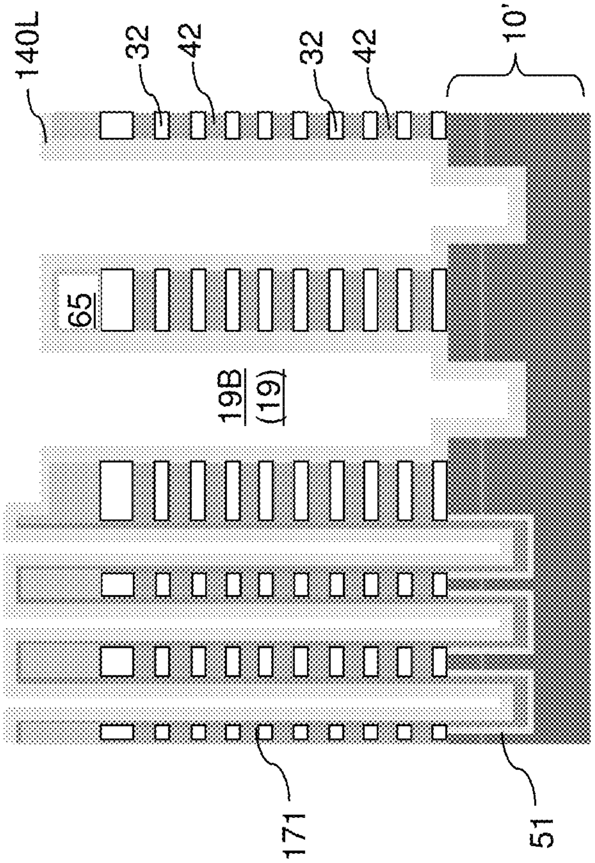

Referring to FIG. 10F, a dielectric spacer material layer 140L including a dielectric material, such as silicon oxide, can be deposited in peripheral portions of each of the second-type support openings 19B, the first-type support openings 19A, and the memory openings 49 by a conformal deposition process. The thickness of the dielectric spacer material layer 140L can be selected such that an unfilled cavity is present within each of the second-type support openings 19B, the first-type support openings 19A, and the memory openings 49. In one embodiment, the dielectric spacer material layer 140L includes a silicate glass material such as undoped silicate glass or a doped silicate glass. The thickness of the dielectric spacer material layer 140L may be in a range from 5 nm to 100 nm, such as from 10 nm to 50 nm, although lesser and greater thicknesses may also be employed.

Figure 10G:
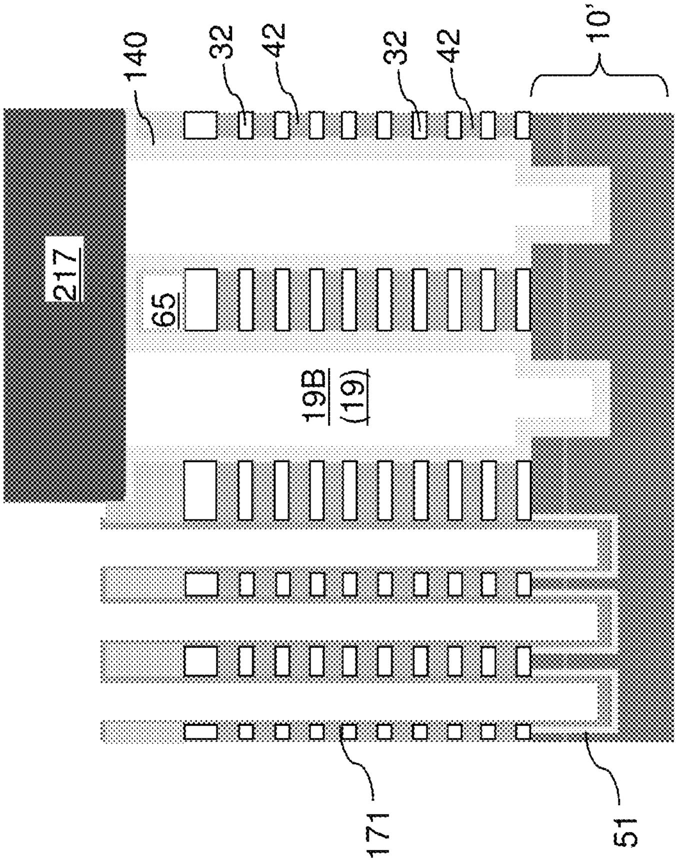

Referring to FIG. 10G, a mask material layer 217 can be formed over the first exemplary structure, and can be lithographically patterned to cover each of the second-type support openings 19B without covering the first-type support openings 19A or the memory openings 49. The mask material layer 217 includes a material that can be subsequently removed selective to the material of the dielectric spacer material layer 140L and the alternating stack (32, 42). For example, the mask material layer 217 may include amorphous carbon, diamond-like carbon, a semiconductor material (such as silicon or a silicon-germanium alloy), or a polymer material (e.g., photoresist). The material of the mask material layer 217 can be deposited anisotropically so that voids are formed within the volumes of the second-type support openings 19B. The mask material layer 217 can be patterned, for example, by applying and lithographically patterning a photoresist material layer (not shown) so that the photoresist material layer covers each of the second-type support openings 19B, and not to cover the first-type support openings 19A and the memory openings 49, and by performing an etch process that etches unmasked portions of the mask material layer 217 employing an etch process (which may employ an isotropic etch process or an anisotropic etch process). The patterned photoresist layer can be subsequently removed, for example, by ashing. If the mask material layer 217 comprises photoresist, then the etch and ashing processes may be omitted. Thus, the second-type support openings 19B can be covered with the mask material layer 217 without covering the memory opening 49 and the first-type support openings 19A.

An etch process can be performed to etch portions of the dielectric spacer material layer 140L that are not masked by the mask material layer 217. For example, anisotropic etch process may be performed to etch the unmasked portions of the dielectric spacer material layer 140L selective to the first cover material layer 171 from within the first-type support openings 19A and from within the memory openings 49. The second-type support openings 19B contain a remaining portion of the dielectric spacer material layer 140L, which is hereafter referred to as a dielectric spacer material layer 140.

Generally, at least one respective dielectric spacer material portion (which can comprise the dielectric spacer material layer 140) can be formed within each of the second-type support openings 19B by depositing and patterning a dielectric spacer material such that the dielectric spacer material is present within the second-type support openings 19B, and is not present within the memory openings 49 and the first-type support openings 49A.

The dielectric spacer material layer 140 vertically extends continuously through the alternating stack (32, 42) and into the in-process source-level material layers 10'. The dielectric spacer material layer 140 comprises a downward-protruding portion that protrudes into semiconductor material layers within the in-process source-level material layers 10'. Each downward-protruding portion of the dielectric spacer material layer 140 has a lesser lateral extent than an overlying portion of the dielectric spacer material layer 140 that vertically extends through the alternating stack (32, 42).

Figure 10H:
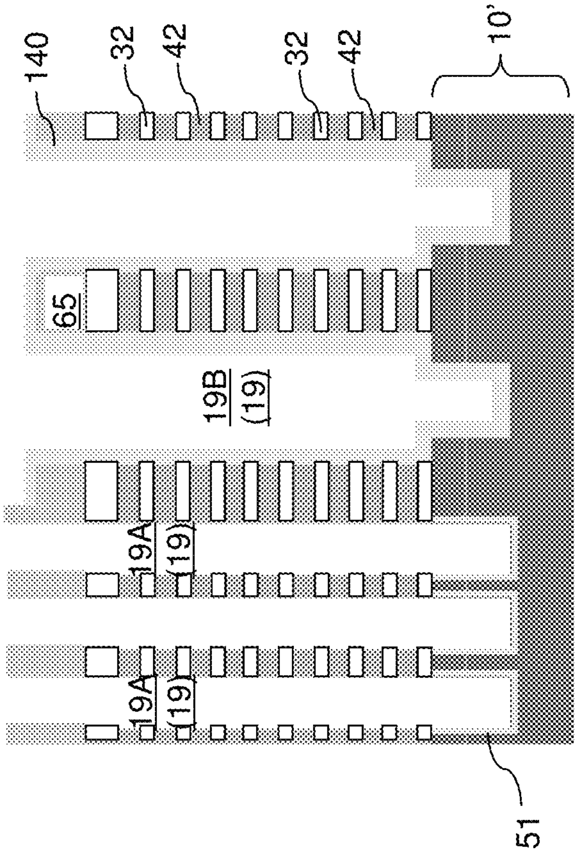

Referring to FIG. 10H, the mask material layer 217 can be removed selective to the material of the dielectric spacer material layer 140, for example, by ashing or selective etching. Subsequently, the first cover material layer 171 can be removed selective to the materials of the alternating stack (32, 42) and the dielectric spacer material layer 140 by performing a selective isotropic etch process, such as a wet etch process employing hot trimethyl-2 hydroxyethyl ammonium hydroxide ("hot TMY") or tetramethyl ammonium hydroxide (TMAH).

Figure 10I:
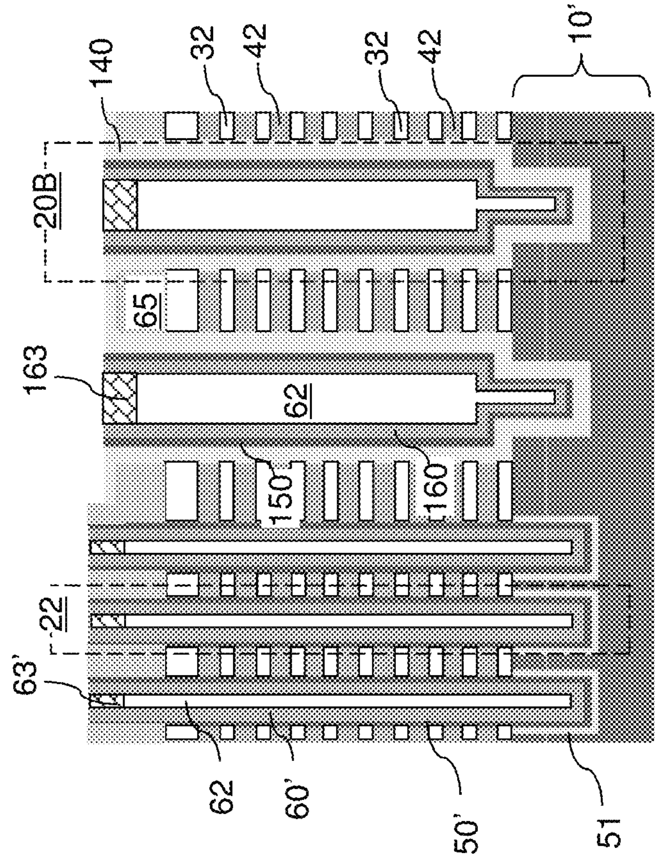

Referring to FIG. 10I, a layer stack of material layers can be sequentially deposited in the first-type support openings 19A, the second-type support openings 19B, and the memory openings 49. The layer stack of material layers can include, for example, a continuous blocking dielectric layer 52L, a continuous memory material layer 54, an optional dielectric liner 46, and a semiconductor channel material layer 60L, as shown in FIG. 12B. Subsequently, a dielectric core 62 can be formed within each of the memory openings 49, within each of the first-type support openings 19A, and within each of the second-type support openings 19B, as shown in FIG. 12C. The dielectric core 62 is then recessed. A doped semiconductor material can be deposited over each dielectric core 62, and excess portions of the layer stack of material layers and the doped semiconductor material can be removed from above the horizontal plane including the top surface of the insulating cap layer 70 by etch back, such as reactive ion etching (RIE), chemical dry etching (CDE) or other suitable dry etching method planarization process, as shown in FIGS. 10I and 12D.

Each continuous combination of remaining portions of the continuous blocking dielectric layer, the continuous memory material layer, and the optional dielectric liner that remains in a memory opening constitutes a memory film 50, as shown in FIG. 12D. Each continuous combination of remaining portions of the continuous blocking dielectric layer, the continuous memory material layer, and the optional dielectric liner that remains in a first-type support opening 19A constitutes a first dummy memory film 50'. Each continuous combination of remaining portions of the continuous blocking dielectric layer, the continuous memory material layer, and the optional dielectric liner that remains in a second-type support opening 19B constitutes a second dummy memory film 150.

Each remaining portion of the semiconductor channel material layer that remains in a memory opening constitutes a vertical semiconductor channel 60. Each remaining portion of the semiconductor channel material layer that remains in a first-type support opening 19A constitutes a first dummy vertical semiconductor channel 60'. Each remaining portion of the semiconductor channel material layer that remains in a second-type support opening 19A constitutes a second dummy vertical semiconductor channel 160.

Each remaining portion of the doped semiconductor material that remains in a memory opening constitutes a drain region 63. Each remaining portion of the doped semiconductor material that remains in a first-type support openings 19A constitutes a first dummy drain region 63'. Each remaining portion of the doped semiconductor material that remains in a second-type support openings 19B constitutes a second dummy drain region 163.

Each contiguous set of material portions filling a memory opening 49 constitutes a memory opening fill structure 58. Each contiguous set of material portions filling a first-type support opening 19A constitutes a first-type support pillar structure 22, which is a composite support pillar structure including at least one dielectric material and at least one semiconductor material. Each continuous set of material portions filling a second-type support opening 19B constitutes a second-type support pillar structure 20B, which is another composite support pillar structure including at least one dielectric material and at least one semiconductor material.

Within the fourth configuration of the first exemplary structure of the first embodiment, memory opening fill structures 58, first-type support pillar structures 22, and second-type support pillar structures 20B can be formed in the memory opening 49, the first-type support openings 19A, and the second-type support openings 19B, respectively, by depositing material layers comprising a memory film (50, 50', 150') and a semiconductor channel material layer 60L within the memory openings 49, the first-type support openings 19A, and remaining volumes of the second-type support openings 19B and by planarizing the material layers.

Figure 11A:
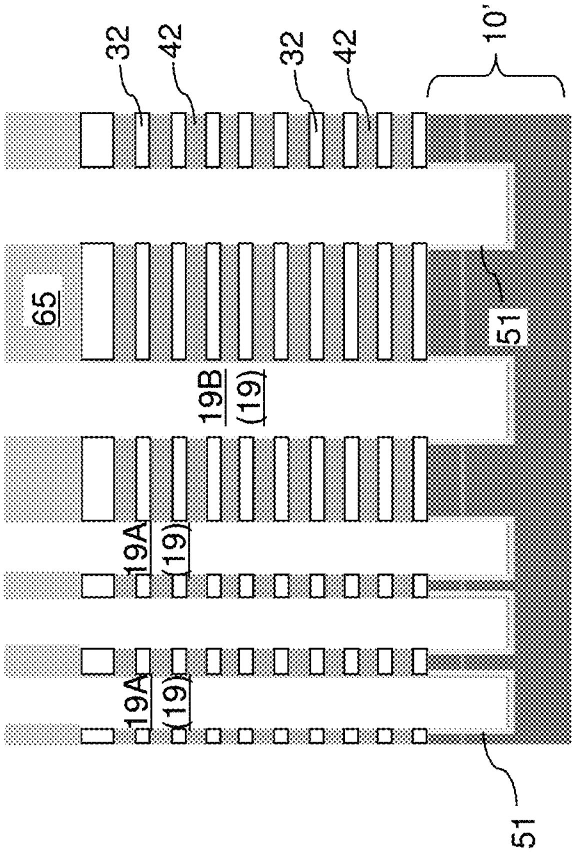
FIGS. 11A-11E are sequential vertical cross-sectional views along a hinged vertical plane X-X' of FIG. 4B, 5B, or 6B during formation of first-type support pillar structures and second-type support pillar structures in a fifth configuration according to a fifth embodiment of the present disclosure.

Referring to FIG. 11A, a region of the first exemplary structure is shown along the vertical plane X-X' of FIG. 4B or 5B. The first-type support pillar structures and the second-type support pillar structures in the fifth configuration can be formed employing the first exemplary structure of FIGS. 4A and 4B, or employing the structure of FIGS. 5A and 5B. Thus, the first-type support openings 19A and the second-type support openings 19B may be arranged in the first layout illustrated in FIGS. 4A and 4B, or in the second layout illustrated in FIGS. 5A and 5B.

Optionally, an oxidation process such as a thermal oxidation process or a plasma oxidation process can be performed to convert physically exposed surfaces portions of semiconductor materials in the in-process source-level material layers 10'. In this case, dielectric liners 51 may be formed at the bottom of each of the first-type support openings 19A, the second-type support openings 19B, and the memory openings 49. The thickness of each dielectric liner 51 may be in a range from 1 nm to 10 nm, such as from 2 nm to 6 nm, although lesser and greater thicknesses may also be employed.

Figure 11B:
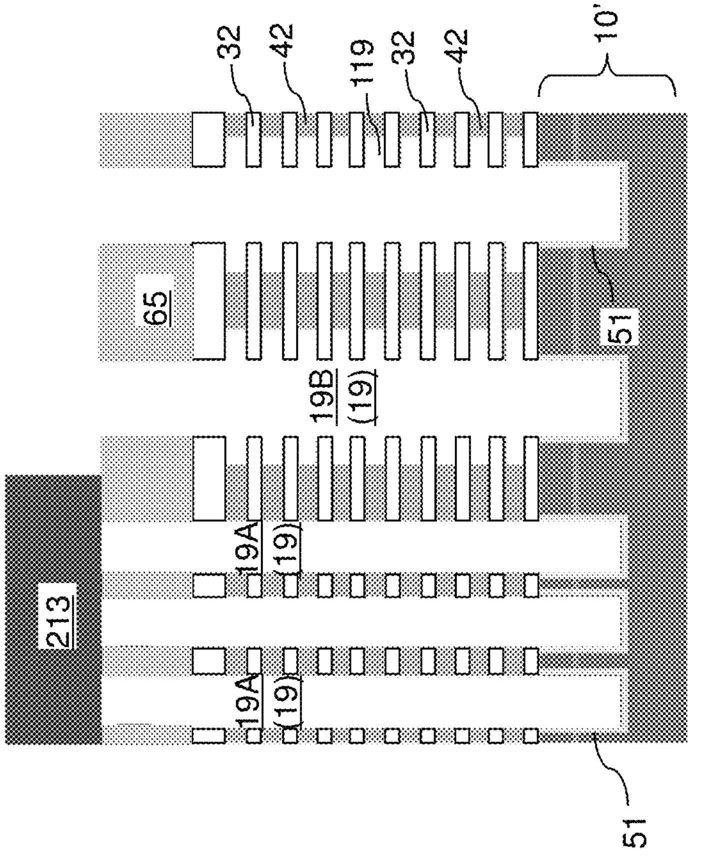

Referring to FIG. 11B, a cover material layer can be formed over the first-type support openings 19A and the memory openings 49. For example, the cover material layer may include a mask material layer 213 that is deposited over the first exemplary structure, and can be lithographically patterned to cover each of the first-type support openings 19A and the memory openings 49, and not to cover the second-type support openings 19B, as described above with respect to FIG. 7B. Thus, the memory opening 49 and the first-type support openings 19A can be covered with the mask material layer 213 without covering the second-type support openings 19B.

The sacrificial material layers 42 can be laterally recessed around each of the second-type support openings 19B while the memory openings 49 and the first-type support openings 19A are covered with a cover material layer, such as the mask material layer 213. In an illustrative example, the insulating layers 32 can include silicon oxide and the sacrificial material layers 42 can include silicon nitride, and a wet etch process employing hot phosphoric acid can be performed to laterally recess sidewalls of the sacrificial material layers 42 selective to the insulating layers 32 around each of the second-type support openings 19B. A second-type support opening 19B may include a vertical stack of annular cavities 119 adjoined to a cylindrical cavity after the isotropic etch process.

Figure 11C:
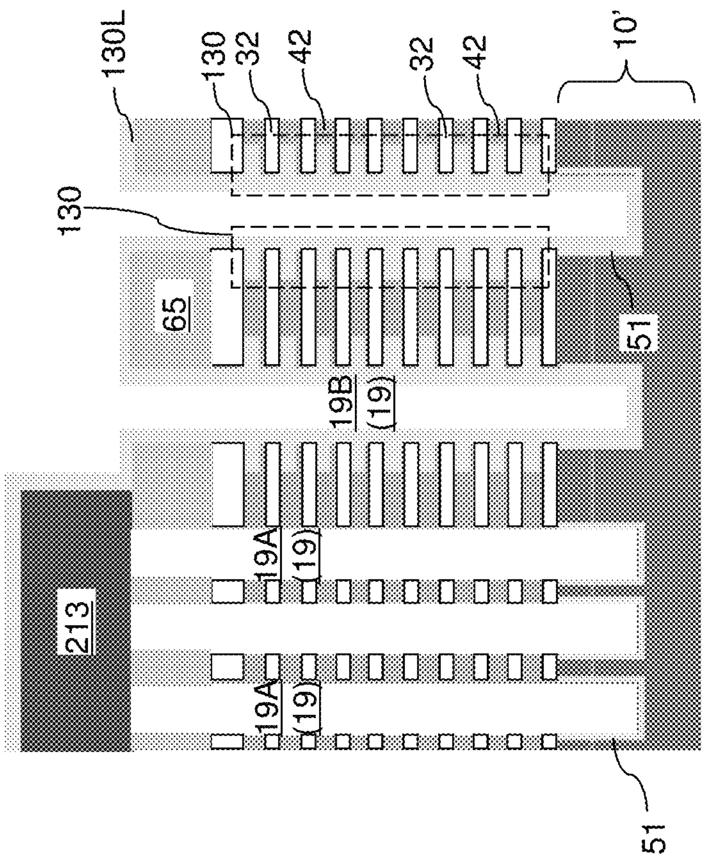

Referring to FIG. 11C, a dielectric spacer material layer 130L including a dielectric material, such as silicon oxide, can be deposited in peripheral portions of each of the second-type support openings 19B and over the cover material layer (such as the mask material layer 213). The thickness of the dielectric spacer material layer 130L is greater than one half of the thickness of each sacrificial material layer 42 such that the dielectric spacer material layer 130L completely fills the of annular cavities 119. In one embodiment, the dielectric spacer material layer 130L includes a silicate glass material such as undoped silicate glass or a doped silicate glass. The thickness of the dielectric spacer material layer 130L may be in a range from 5 nm to 100 nm, such as from 10 nm to 50 nm, although lesser and greater thicknesses may also be employed. Generally, the dielectric spacer material layer 130L can be conformally deposited in volumes of annular cavities 119 formed by laterally recessing the sacrificial material layers 42 around each of the second-type support openings 19B.

Figure 11D:
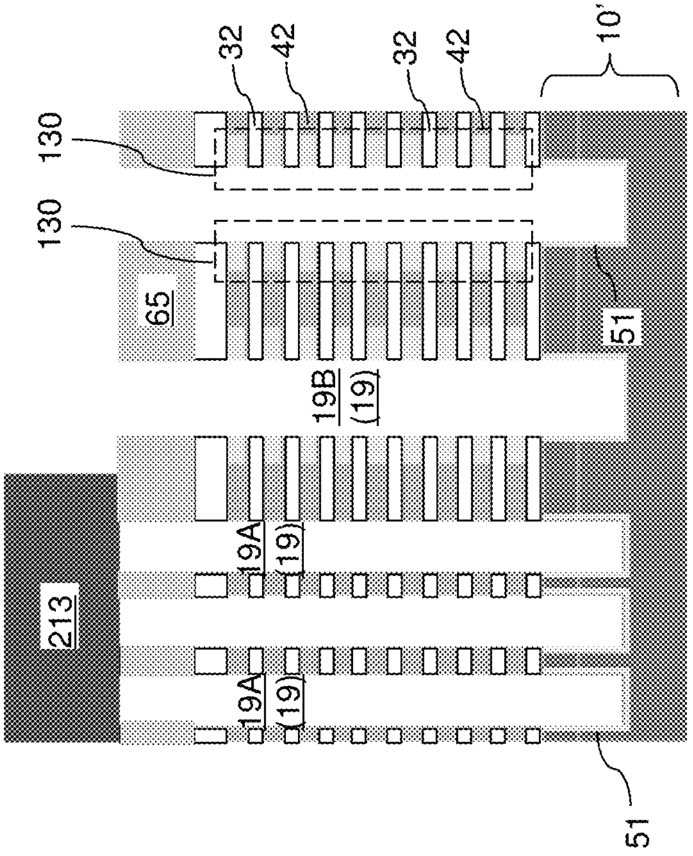

Referring to FIG. 11D, portions of the dielectric spacer material layer 130L located outside the volumes of the annular cavities 119 formed by laterally recessing the sacrificial material layers 42 can be etched around each of the second-type support openings 19B. The dielectric spacer material layer 130L can be etched back by an etch process, which may include an isotropic etch process. In an illustrative example, if the dielectric spacer material layer 130L includes silicon oxide, a wet etch process employing hydrofluoric acid may be performed to isotropically etch the portions of the dielectric spacer material layer 130L located outside the annular cavities of the second-type support openings 19B as formed at the processing steps of FIG. 11B. The dielectric liners 51 located at the bottom of the second-type support openings 19B may, or may not, be collaterally removed during the etch back process employed to remove portions of the dielectric spacer material layer 130L located outside the vertical stacks of annular cavities.

Remaining portions of the dielectric spacer material layer 130L comprise vertical stacks of dielectric spacer fins 130. Generally, at least one dielectric spacer material portion (such as a vertical stack of dielectric spacer fins 130) can be formed within each of the second-type support openings 19B by depositing and patterning a dielectric spacer material such that the dielectric spacer material is present within the second-type support openings 19B and is not present within the memory openings 49 and the first-type support openings 19A. In one embodiment, the at least one respective dielectric spacer material portion within each of the second-type support openings 19B comprises a vertical stack of dielectric spacer fins 130 located at levels of the sacrificial material layers 42 and extending in the horizontal direction between adjacent insulating layers 32. In one embodiment, at least a bottommost dielectric spacer fin (such as a plurality of dielectric spacer fins) within each vertical stack of dielectric spacer fins 130 may have an annular cylindrical shape.

Figure 11E:
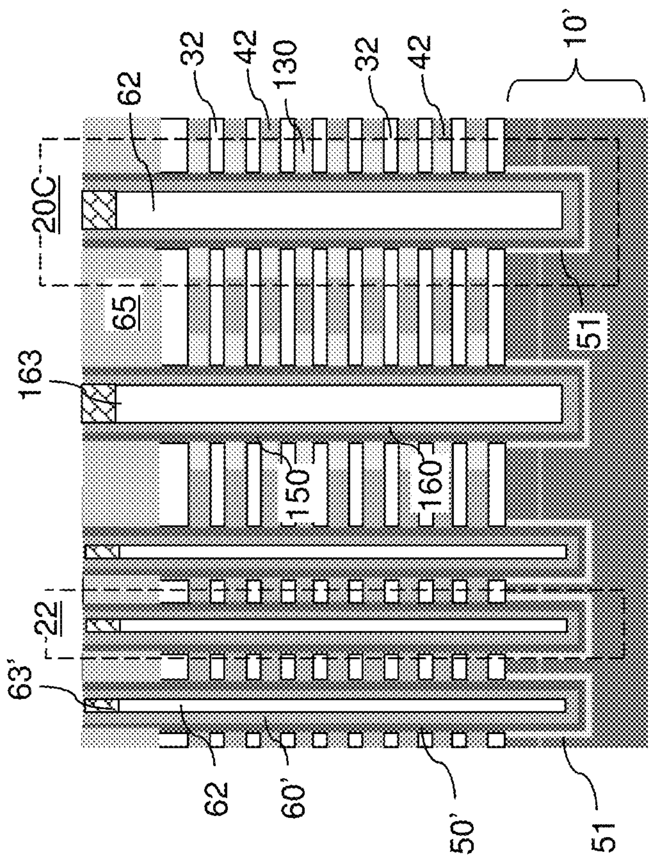

Referring to FIG. 11E, the cover material layer (such as the mask material layer 213) can be removed selective to the materials of the alternating stack (32, 42), the vertical stacks of dielectric spacer fins 130, and the retro-stepped dielectric material portion 65, for example, by ashing.

A layer stack of material layers can be sequentially deposited in the first-type support openings 19A, the second-type support openings 19B, and the memory openings. The layer stack of material layers can include, for example, a continuous blocking dielectric layer 52L, a continuous memory material layer 54, an optional dielectric liner 56, and a semiconductor channel material layer 60L, as shown in FIG. 12B. Subsequently, a dielectric core 62 can be formed within each of the memory openings 49, within each of the first-type support openings 19A, and within each of the second-type support openings 19B, and then vertically recessed, as shown in FIG. 12C. A doped semiconductor material can be deposited over each dielectric core 62, and excess portions of the layer stack of material layers and the doped semiconductor material can be removed from above the horizontal plane including the top surface of the insulating cap layer 70 by performing a planarization process, as shown in FIG. 12D. The planarization process may employ a chemical mechanical polishing process and/or a recess etch process.

Each continuous combination of remaining portions of the continuous blocking dielectric layer 52L, the continuous memory material layer 54, and the optional dielectric liner 56 that remains in a memory opening 49 constitutes a memory film 50 as shown in FIG. 12D. Each continuous combination of remaining portions of the continuous blocking dielectric layer, the continuous memory material layer, and the optional dielectric liner that remains in a first-type support opening 19A constitutes a first dummy memory film 50'. Each continuous combination of remaining portions of the continuous blocking dielectric layer, the continuous memory material layer, and the optional dielectric liner that remains in a second-type support opening 19B constitutes a second dummy memory film 150.

Each remaining portion of the semiconductor channel material 60L layer that remains in a memory opening constitutes a vertical semiconductor channel 60L, as shown in FIG. 12D. Each remaining portion of the semiconductor channel material layer that remains in a first-type support opening 19A constitutes a first dummy vertical semiconductor channel 60'. Each remaining portion of the semiconductor channel material layer that remains in a second-type support opening 19A constitutes a second dummy vertical semiconductor channel 160.

Each remaining portion of the doped semiconductor material that remains in a memory opening constitutes a drain region 63. Each remaining portion of the doped semiconductor material that remains in a first-type support openings 19A constitutes a first dummy drain region 63'. Each remaining portion of the doped semiconductor material that remains in a second-type support openings 19B constitutes a second dummy drain region 163.

Each contiguous set of material portions filling a memory opening 49 constitutes a memory opening fill structure 58. Each contiguous set of material portions filling a first-type support opening 19A constitutes a first-type support pillar structure 22, which is a composite support pillar structure including at least one dielectric material and at least one semiconductor material. Each continuous set of material portions filling a second-type support opening 19B constitutes a second-type support pillar structure 20C, which is another composite support pillar structure including at least one dielectric material and at least one semiconductor material.

Within the fifth configuration of the first exemplary structure, memory opening fill structures 58, first-type support pillar structures 22, and second-type support pillar structures 20C can be formed in the memory opening 49, the first-type support openings 19A, and the second-type support openings 19B, respectively, by depositing material layers comprising a memory film (50, 50', 150') and a semiconductor channel material layer within the memory openings 49, the first-type support openings 19A, and remaining volumes of the second-type support openings 19B and by planarizing the material layers.

In one embodiment, each of the second dummy memory films 150 may be in direct contact with sidewalls of a subset of the insulating layers 32. In one embodiment, the retro-stepped dielectric material portion 65 can overlie the stepped surfaces of the alternating stack (32, 42). A memory film (50, 150, 50') is deposited directly on physically exposed surfaces of the insulating layers 32 and inner sidewalls of the vertical stacks of dielectric spacer fins 130 around the second-type support openings 19B, and directly on physically exposed surfaces of the insulating layers 32 and the sacrificial material layers 42 around the memory openings 49 and the first-type support openings 19A.

FIGS. 12A-12D are sequential schematic vertical cross-sectional views of a memory opening 49 within the first exemplary structure during formation of a memory opening fill structure according to an embodiment of the present disclosure. The processing steps illustrated in FIGS. 12A-12D correspond to the processing steps that are performed at the processing steps of FIG. 7E, 8E, 9E, 10I, or 11E. While FIGS. 12A-12D illustrate an embodiment in which dielectric liners 51 are not employed, embodiments are expressly contemplated herein in which dielectric liners 51 are present at the bottom of each of the memory openings 49.

Referring to FIG. 12A, a continuous blocking dielectric layer 52L is formed in the memory opening 49.

Referring to FIG. 12B, a layer stack including a memory material layer 54, an optional dielectric liner 56, and a semiconductor channel material layer 60L is deposited in the memory opening.

The memory material layer 54 includes a memory material that can store at least one data bit in the form of presence or absence of electrical charges therein, a resistive state in a material that can provide multiple levels of resistivity, ferroelectric polarization within a ferroelectric material, or any other memory material that can encode information. In one embodiment, the memory material layer 54 may be a charge storage layer. In this case, the charge storage layer may be a continuous layer or patterned discrete portions of a charge trapping material, such as a dielectric charge trapping material, which may be, for example, silicon nitride. Alternatively, the charge storage layer may include a continuous layer or patterned discrete portions of a conductive material, such as doped polysilicon or a metallic material that is patterned into multiple electrically isolated portions (e.g., floating gates), for example, by being formed within lateral recesses into sacrificial material layers 42. In one embodiment, the memory material layer 54 includes a silicon nitride layer. In one embodiment, the sacrificial material layers 42 and the insulating layers 32 may have vertically coincident sidewalls, and the memory material layer 54 may be formed as a single continuous layer. Alternatively, the sacrificial material layers 42 may be laterally recessed with respect to the sidewalls of the insulating layers 32, and a combination of a deposition process and an anisotropic etch process may be used to form the memory material layer 54 as a plurality of memory material portions that are vertically spaced apart. The thickness of the memory material layer 54 may be in a range from 2 nm to 20 nm, although lesser and greater thicknesses may also be used.

The optional dielectric liner 56, if present, includes a dielectric material. In one embodiment in which the memory material layer 54 is a charge storage layer, the dielectric liner 56 comprises a tunneling dielectric layer through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The dielectric liner 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric liner 56 may include a stack of a first silicon oxide layer, a silicon oxynitride layer, and a second silicon oxide layer, which is commonly known as an ONO stack. In one embodiment, the dielectric liner 56 may include a silicon oxide layer that is substantially free of carbon or a silicon oxynitride layer that is substantially free of carbon. The thickness of the dielectric liner 56 may be in a range from 2 nm to 20 nm, although lesser and greater thicknesses may also be used. The stack of the blocking dielectric layer 52, the memory material layer 54, and the dielectric liner 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Referring to FIG. 12C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the insulating cap layer 70 may be recessed, for example, by a recess etch. The recess etch continues until top surfaces of the remaining portions of the dielectric core layer are recessed to a height between the top surface of the insulating cap layer 70 and the bottom surface of the insulating cap layer 70. Each remaining portion of the dielectric core layer constitutes a dielectric core 62.

Referring to FIG. 12D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the dielectric liner 56, the memory material layer 54, and the continuous blocking dielectric layer 52L that overlie the horizontal plane including the top surface of the insulating cap layer 70 may be removed by etch back, such as reactive ion etching (RIE), chemical dry etching (CDE) or other suitable dry etching method.

Each remaining portion of the doped semiconductor material of the second conductivity type constitutes a drain region 63. The dopant concentration in the drain regions 63 may be in a range from $5.0\times10^{18}/cm^3$ to $2.0\times10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A dielectric liner 56 is surrounded by a memory material layer 54, and laterally surrounds a vertical semiconductor channel 60. Each adjoining set of a blocking dielectric layer 52, a memory material layer 54, and a dielectric liner 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours. Alternatively, data may be stored based on the ferroelectric polarization direction of a ferroelectric memory material layer, such as orthorhombic phase hafnium oxide layer doped with Zr, Al or Si.

Each combination of a memory film 50 and a vertical semiconductor channel 60 (which is a vertical semiconductor channel) within a memory opening 49 constitutes a memory stack structure 55. The memory stack structure 55 is a combination of a vertical semiconductor channel 60, a dielectric liner 56, a plurality of memory elements comprising portions of the memory material layer 54, and an optional blocking dielectric layer 52. Each combination of a memory stack structure 55, a dielectric core 62, and a drain region 63 within a memory opening 49 constitutes a memory opening fill structure 58.

Referring to FIGS. 13A and 13B, 14A and 14B, 15A and 15B, 16A and 16B, and 17A and 17B, various configurations of the first exemplary structure are illustrated after formation of the memory opening fill structures 58, first-type support pillar structures 22, and second-type support pillar structures (e.g., 20, 20B, or 20C). Generally, the memory opening fill structures 58 are formed within the memory openings 49 concurrently with formation of the first-type support pillar structures 22 and second-type support pillar structures (e.g., 20, 20B, or 20C). The first configuration of the first exemplary structure illustrated in FIGS. 13A and 13B can be formed by employing the processing steps illustrated in FIGS. 7A-7E and 12A-12D. The second configuration of the first exemplary structure illustrated in FIGS. 14A and 14B can be formed by employing the processing steps illustrated in FIGS. 8A-8E and 12A-12D. The third configuration of the first exemplary structure illustrated in FIGS. 15A and 15B can be formed by employing the processing steps illustrated in FIGS. 9A-9E and 12A-12D. The fourth configuration of the first exemplary structure illustrated in FIGS. 16A and 16B can be formed by employing the processing steps illustrated in FIGS. 10A-10I and 12A-12D. The fifth configuration of the first exemplary structure illustrated in FIGS. 17A and 17B can be formed by employing the processing steps illustrated in FIGS. 11A-11E and 12A-12D.

Figure 18A:
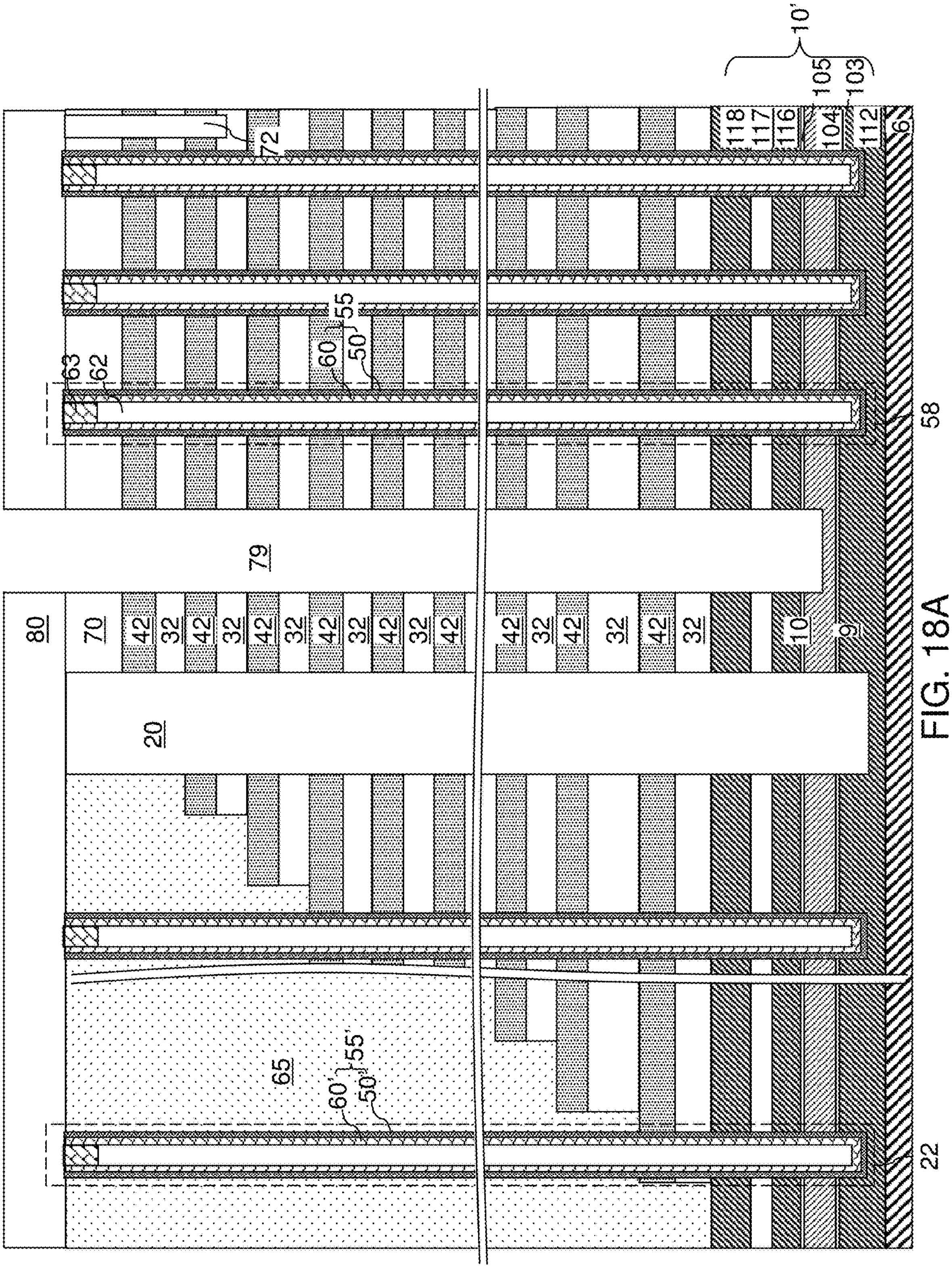
FIG. 18A is a schematic vertical cross-sectional view of the first exemplary structure after formation of a contact-level dielectric layer and backside trenches according to an embodiment of the present disclosure.
Figure 18B:
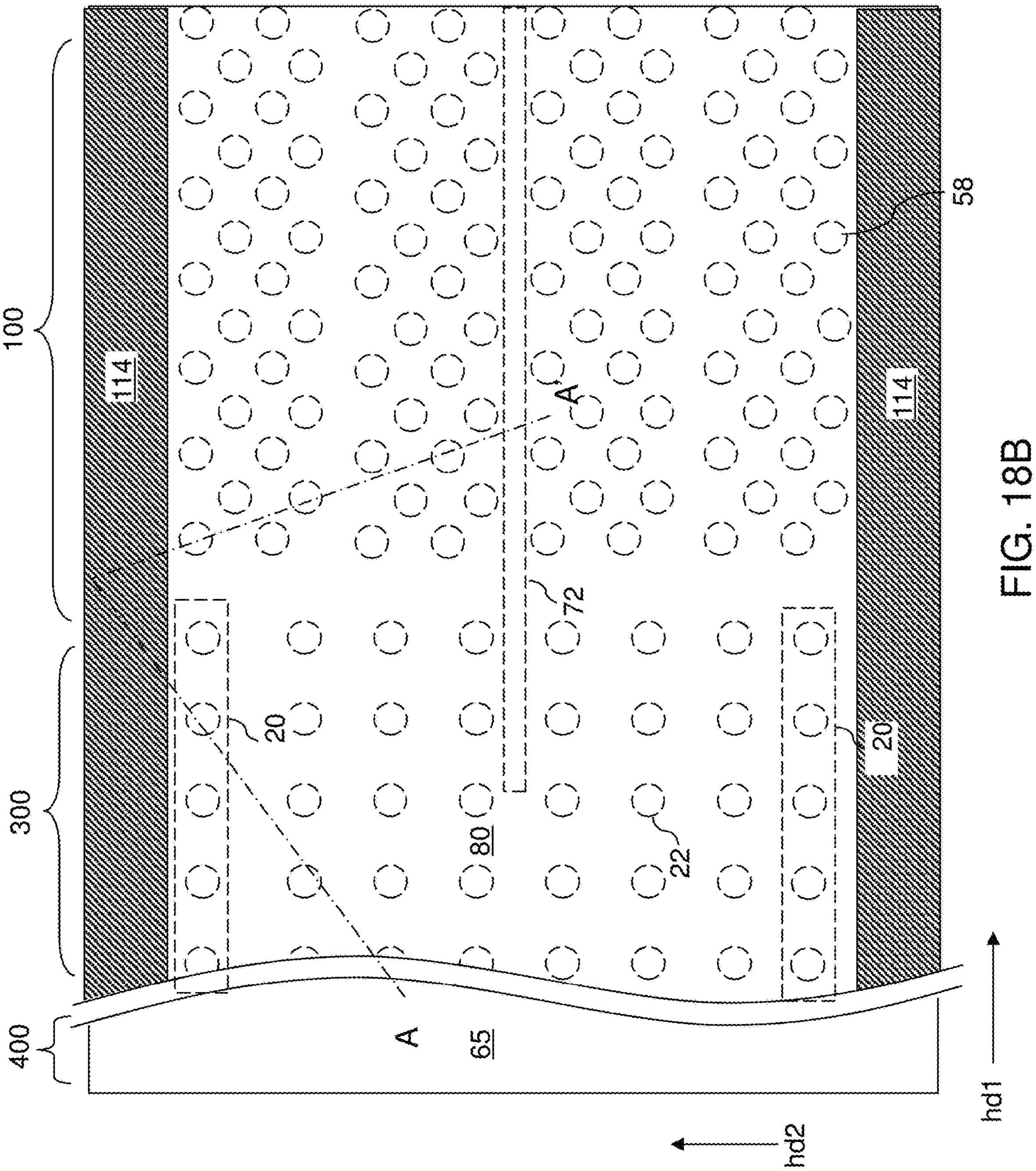
FIG. 18B is a top-down view of the exemplary configuration of FIG. 18A.

Referring to FIGS. 18A and 18B, a contact-level dielectric layer 80 may be formed over the alternating stack (32, 42) and the retro-stepped dielectric material portion 65. The contact-level dielectric layer 80 includes a dielectric material such as silicon oxide, and may be formed by a conformal or non-conformal deposition process. For example, the contact-level dielectric layer 80 may include undoped silicate glass and may have a thickness in a range from 100 nm to 600 nm, although lesser and greater thicknesses may also be used.

A photoresist layer (not shown) may be applied over the contact-level dielectric layer 80, and may be lithographically patterned to form elongated openings that extend along the first horizontal direction hd1 between clusters of memory opening fill structures 58. Backside trenches 79 may be formed by transferring the pattern in the photoresist layer (not shown) through the contact-level dielectric layer 80, the alternating stack (32, 42), and the retro-stepped dielectric material portion 65, and into the in-process source-level material layers 10'. Portions of the contact-level dielectric layer 80, the alternating stack (32, 42), the retro-stepped dielectric material portion 65, and the in-process source-level material layers 10' that underlie the openings in the photoresist layer may be removed to form the backside trenches 79. In one embodiment, the backside trenches 79 may be formed at borders between the repetition units RU that laterally extend along the first horizontal direction hd1. The clusters of the memory openings fill structures 58 may be laterally spaced apart along the second horizontal direction hd2 by the backside trenches 79. In case the third layout is employed for the second-type support openings 19B, the backside trenches 79 may dissect each of the second-type support pillar structures 20 into a respective pair of divided support pillar structures 20 that are laterally spaced apart along the second horizontal direction hd2.

The second-type support pillar structures (20, 20B, 20C) are more proximal to the backside trenches 79 than the first-type support pillar structures 22. In some embodiment, sidewalls of the second-type support pillar structures (20, 20B, 20C) may be physically exposed to the backside trenches 79, and the first-type support pillar structures 22 can be laterally spaced from the backside trenches 79. Generally, the second-type support pillar structures (20, 20B, 20C) (which may comprise dielectric support pillar structures or composite support pillar structures) are more proximal to a most proximal one of the backside trenches 79 than the first-type support pillar structures 22 (which comprise composite support pillar structures) are to the backside trenches 79.

FIGS. 19A-19H illustrate sequential vertical cross-sectional views of memory opening fill structures 58 and a backside trench 79 during formation of source-level material layers 10, electrically conductive layers 46, and a backside trench fill structure 76 according to an embodiment of the present disclosure.

Figure 19A:
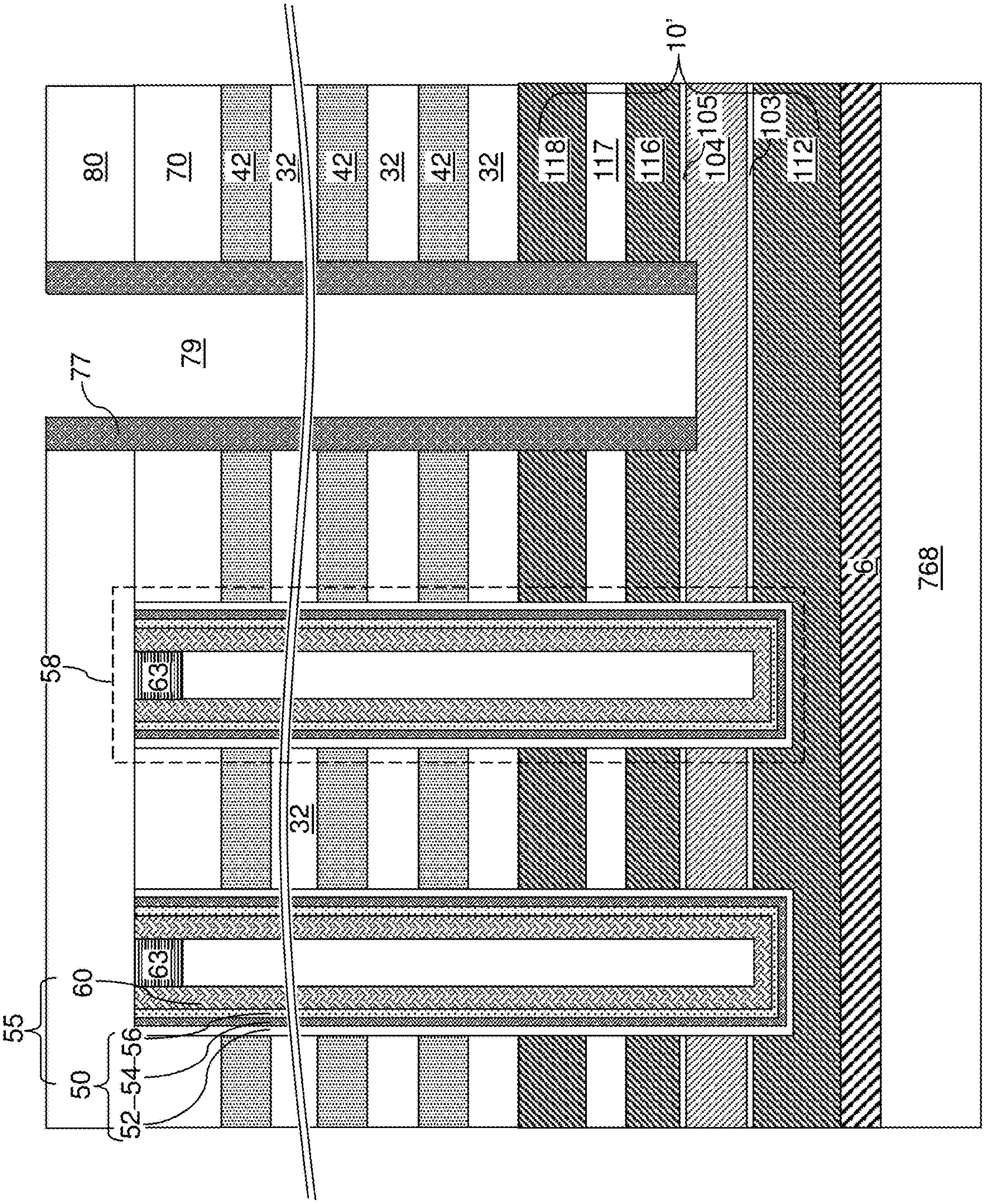
FIGS. 19A-19H illustrate sequential vertical cross-sectional views of memory opening fill structures and a backside trench during formation of source-level material layers, electrically conductive layers, and a backside trench fill structure according to an embodiment of the present disclosure.

Referring to FIG. 19A, a backside trench spacer 77 may be formed on sidewalls of each backside trench 79. For example, a conformal spacer material layer may be deposited in the backside trenches 79 and over the contact-level dielectric layer 80, and may be anisotropically etched to form the backside trench spacers 77. The backside trench spacers 77 include a material that is different from the material of the source-level sacrificial layer 104. For example, the backside trench spacers 77 may include silicon nitride.

Figure 19B:
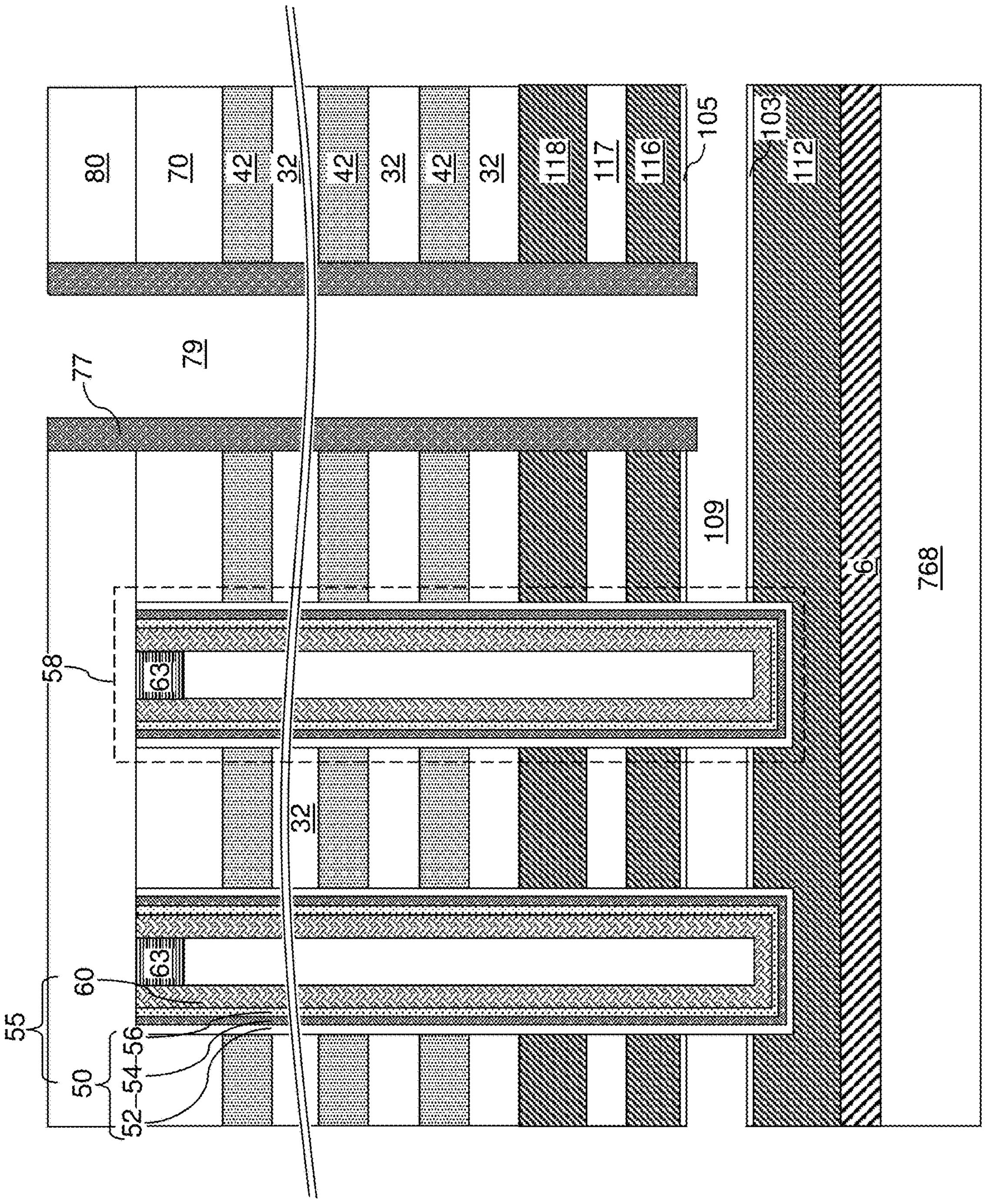

Referring to FIG. 19B, an etchant that etches the material of the source-level sacrificial layer 104 selective to the materials of the alternating stack (32, 42), the insulating cap layer 70, the contact-level dielectric layer 80, the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy, the backside trench spacers 77 include silicon nitride, and the upper and lower sacrificial liners (105, 103) include silicon oxide, a wet etch process using hot trimethyl-2 hydroxyethyl ammonium hydroxide (“hot TMY”) or tetramethyl ammonium hydroxide (TMAH) may be used to remove the source-level sacrificial layer 104 selective to the backside trench spacers 77 and the upper and lower sacrificial liners (105, 103). A source cavity 109 is formed in the volume from which the source-level sacrificial layer 104 is removed.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, even if sidewalls of the upper source-level semiconductor layer 116 are physically exposed or even if a surface of the lower source-level semiconductor layer 112 is physically exposed upon formation of the source cavity 109 and/or the backside trench spacers 77, collateral etching of the upper source-level semiconductor layer 116 and/or the lower source-level semiconductor layer 112 is minimal, and the structural change to the first exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and that are physically exposed to the source cavity 109.

Figure 19C:
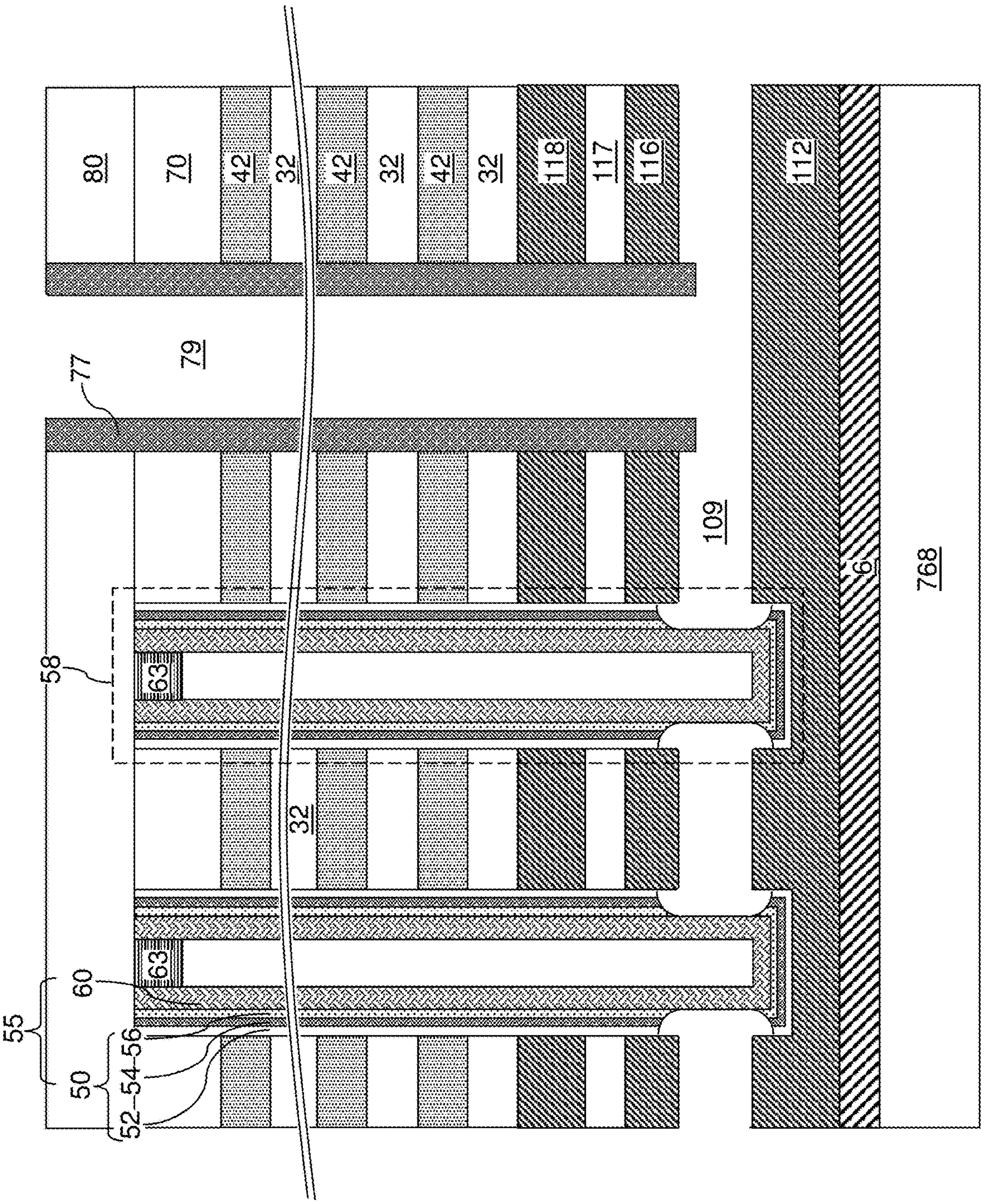

Referring to FIG. 19C, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 19D:
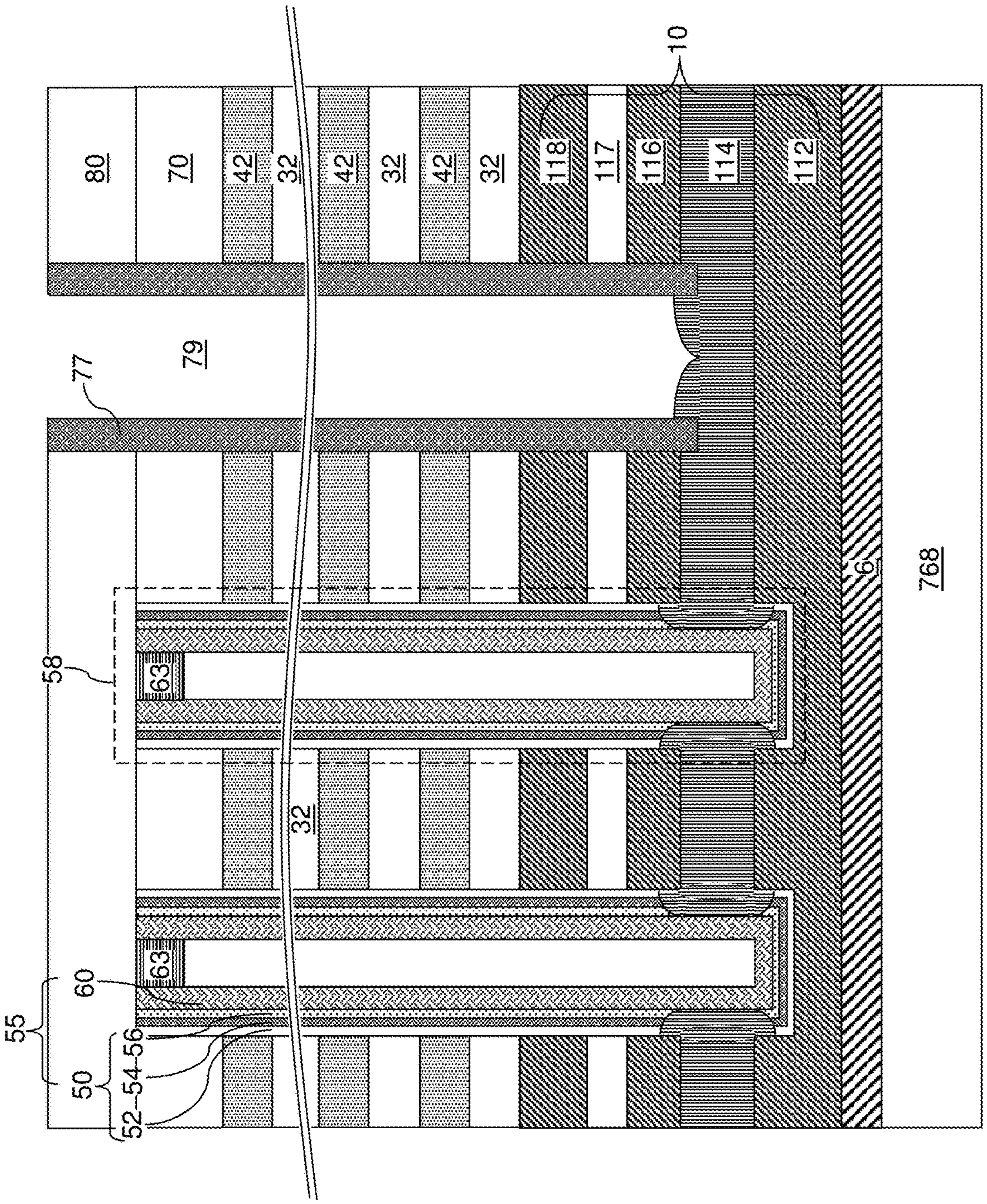

Referring to FIG. 19D, a semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the first exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0\times10^{20}/cm^3$ to $2.0\times10^{21}/cm^3$, such as from $2.0\times10^{20}/cm^3$ to $8.0\times10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114, and the source contact layer 114 contacts bottom end portions of inner sidewalls of the backside trench spacers 77. In one embodiment, the source contact layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 116 constitutes a buried source layer (112, 114, 116). The set of layers including the buried source layer (112, 114, 116), the source-level insulating layer 117, and the source-select-level conductive layer 118 constitutes source-level material layers 10, which replaces the in-process source-level material layers 10'.

Figure 19E:
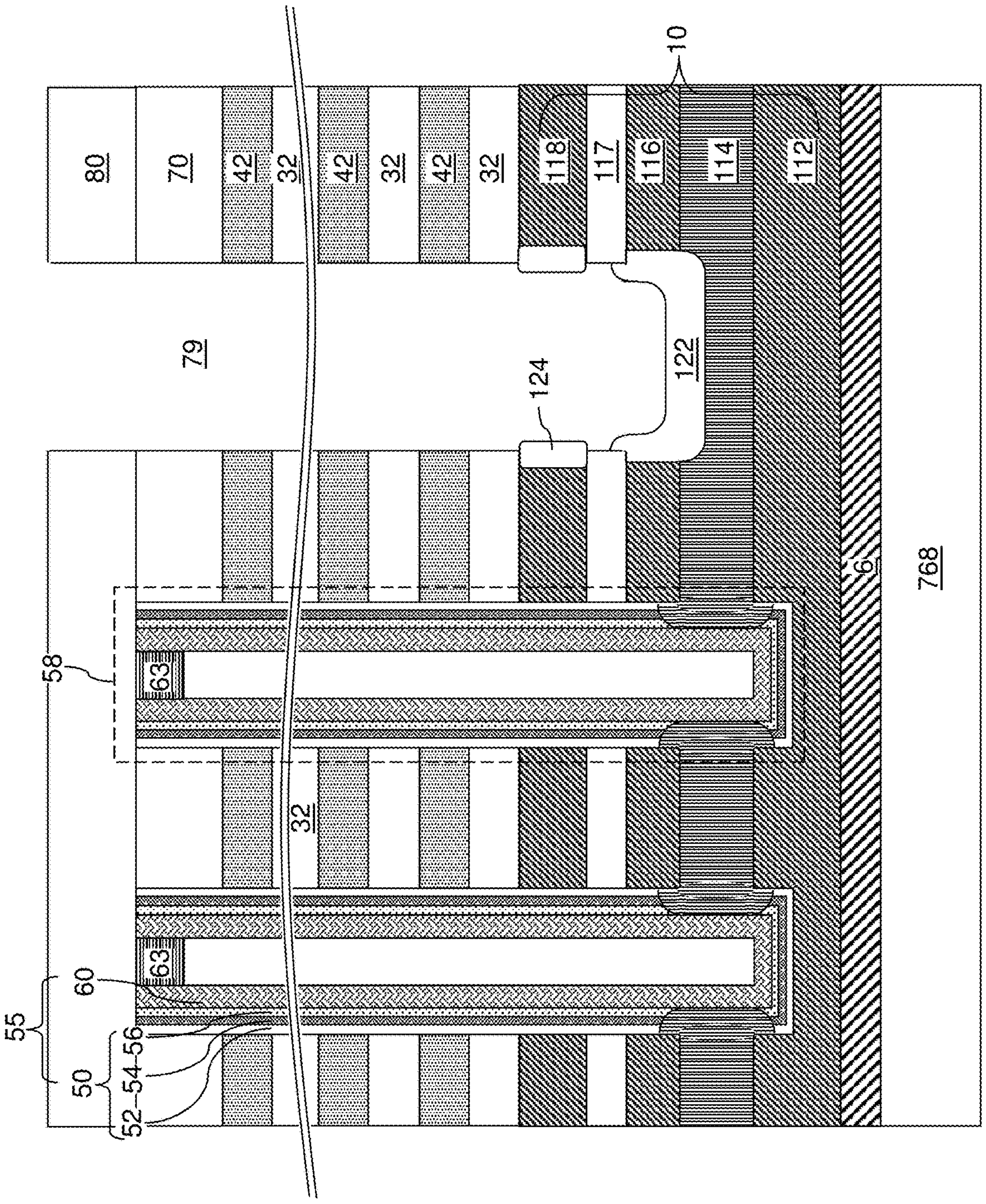

Referring to FIG. 19E, the backside trench spacers 77 may be removed selective to the insulating layers 32, the insulating cap layer 70, the contact-level dielectric layer 80, and the source contact layer 114 using an isotropic etch process. For example, if the backside trench spacers 77 include silicon nitride, a wet etch process using hot phosphoric acid may be performed to remove the backside trench spacers 77. In one embodiment, the isotropic etch process that removes the backside trench spacers 77 may be combined with a subsequent isotropic etch process that etches the sacrificial material layers 42 selective to the insulating layers 32, the insulating cap layer 70, the contact-level dielectric layer 80, and the source contact layer 114.

An oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122, and surface portions of the source-select-level conductive layer 118 may be converted into annular dielectric semiconductor oxide spacers 124.

Figure 19F:
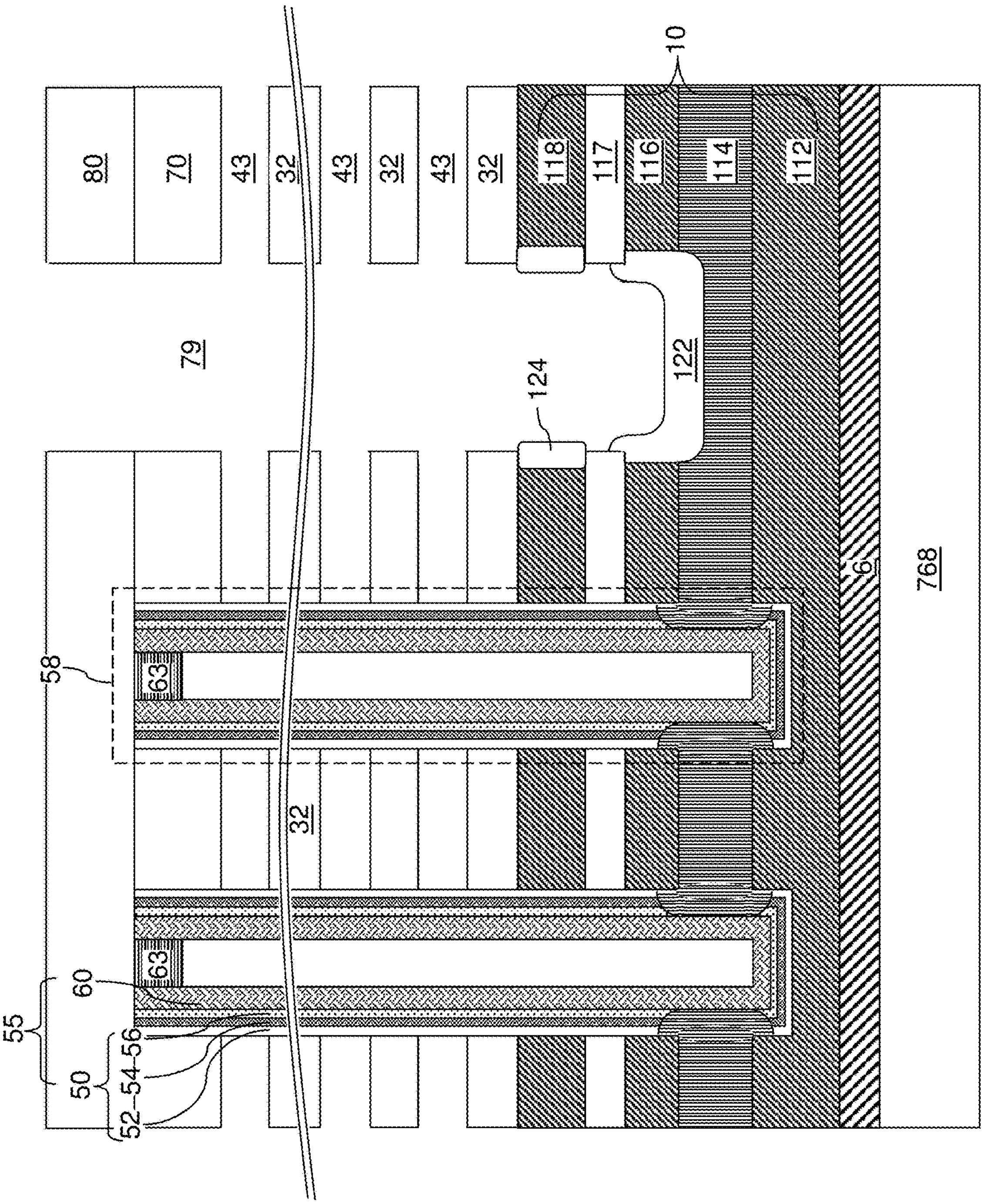

Referring to FIG. 19F, the sacrificial material layers 42 are removed selective to the insulating layers 32, the insulating cap layer 70, the contact-level dielectric layer 80, and the source contact layer 114, the dielectric semiconductor oxide plates 122, and the annular dielectric semiconductor oxide spacers 124. For example, an etchant that selectively etches the materials of the sacrificial material layers 42 with respect to the materials of the insulating layers 32, the insulating cap layer 70, the retro-stepped dielectric material portion 65, and the material of the outermost layer of the memory films 50 may be introduced into the backside trenches 79, for example, using an isotropic etch process. For example, the sacrificial material layers 42 may include silicon nitride, the materials of the insulating layers 32, the insulating cap layer 70, the retro-stepped dielectric material portion 65, and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers 42 include silicon nitride, the etch process may be a wet etch process in which the first exemplary structure is immersed within a wet etch tank including phosphoric acid, which etches silicon nitride selective to silicon oxide, silicon, and various other materials used in the art.

Backside recesses 43 are formed in volumes from which the sacrificial material layers 42 are removed. Each of the backside recesses 43 may be a laterally extending cavity having a lateral dimension that is greater than the vertical extent of the cavity. In other words, the lateral dimension of each of the backside recesses 43 may be greater than the height of the respective backside recess 43. A plurality of backside recesses 43 may be formed in the volumes from which the material of the sacrificial material layers 42 is removed. Each of the backside recesses 43 may extend substantially parallel to the top surface of the substrate semiconductor layer 9. A backside recess 43 may be vertically bounded by a top surface of an underlying insulating layer 32 and a bottom surface of an overlying insulating layer 32. In one embodiment, each of the backside recesses 43 may have a uniform height throughout.

Figure 19G:
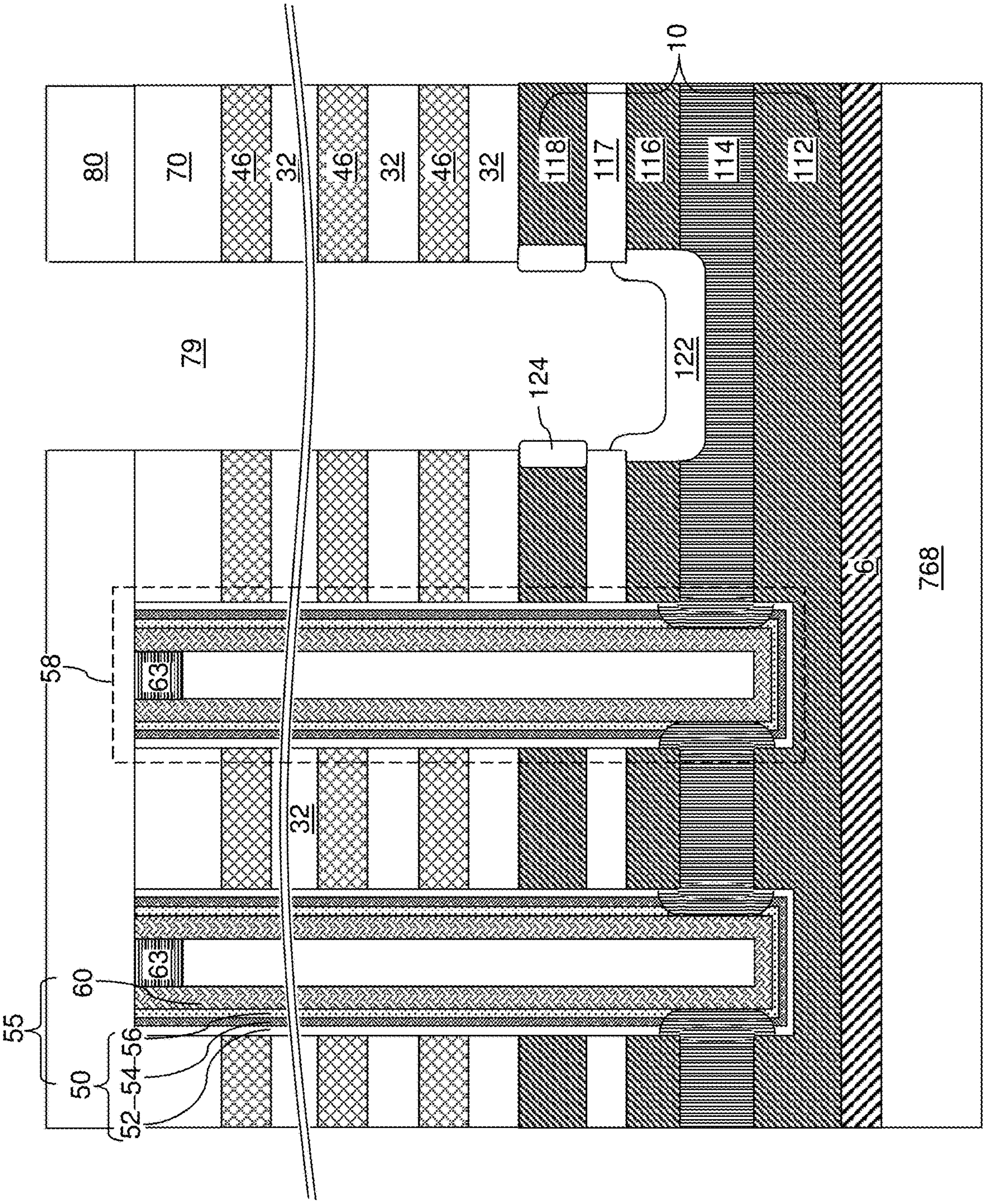

Referring to FIG. 19G, a backside blocking dielectric layer (not shown) may be optionally deposited in the backside recesses 43 and the backside trenches 79 and over the contact-level dielectric layer 80. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses 43, on the sidewalls of the backside trenches 79, and over the contact-level dielectric layer 80. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses 43 include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses 43 may be a combination of titanium nitride layer and a tungsten fill material.

Electrically conductive layers 46 may be formed in the backside recesses 43 by deposition of the at least one conductive material. Each of the electrically conductive layers 46 may include a respective conductive metallic nitride liner and a respective conductive fill material. Thus, the sacrificial material layers 42 may be replaced with the electrically conductive layers 46, respectively. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the contact-level dielectric layer 80, for example, by an anisotropic or isotropic etch. Each remaining portion of the deposited metallic material in the backside recesses 43 constitutes an electrically conductive layer 46. Sidewalls of the electrically conductive layers 46 may be physically exposed to the backside trenches 79. In some embodiments, the backside trenches 79 may have a pair of curved sidewalls having a non-periodic width variation along the first horizontal direction hd1 and a non-linear width variation along the vertical direction.

Each electrically conductive layer 46 may be a conductive sheet including openings therein. A first subset of the openings through each electrically conductive layer 46 may be filled with memory opening fill structures 58. A second subset of the openings through each electrically conductive layer 46 may be filled with the first-type support pillar structures 22. In some embodiments, the second-type support pillar structures (20, 20B, 20C) may be located within a third subset of the openings through one or more of the electrically conductive layers 46. Alternatively, the second-type support pillar structures (20, 20B, 20C) may be physically exposed to the backside trenches 79. Each electrically conductive layer 46 may have a lesser area than any underlying electrically conductive layer 46 because of the stepped surfaces underlying the retro-stepped dielectric material portion 65. Each electrically conductive layer 46 may have a greater area than any overlying electrically conductive layer 46 because of the stepped surfaces underlying the retro-stepped dielectric material portion 65.

Each of the memory stack structures 55 comprises a vertical stack of memory elements located at each level of the electrically conductive layers 46. A subset of the electrically conductive layers 46 may comprise word lines for the memory elements. The semiconductor devices in the underlying peripheral device region 700 may comprise word line switch devices configured to control a bias voltage to respective word lines. A memory-level assembly is located over the substrate semiconductor layer 9. The memory-level assembly includes the alternating stack of insulating layers 32 and electrically conductive layers 46 and memory stack structures 55 vertically extending through the alternating stack (32, 46).

Figure 19H:
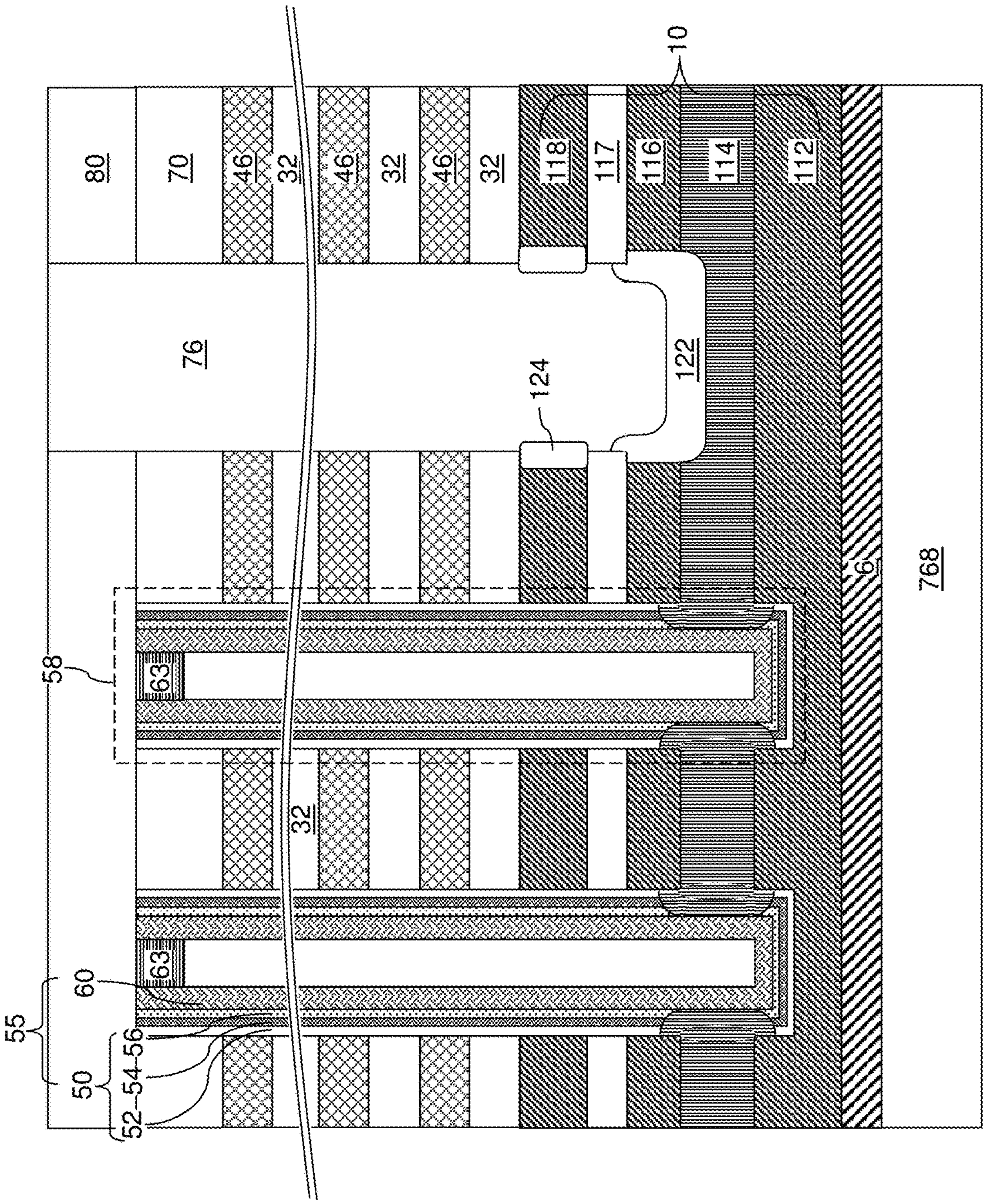
Figure 20:
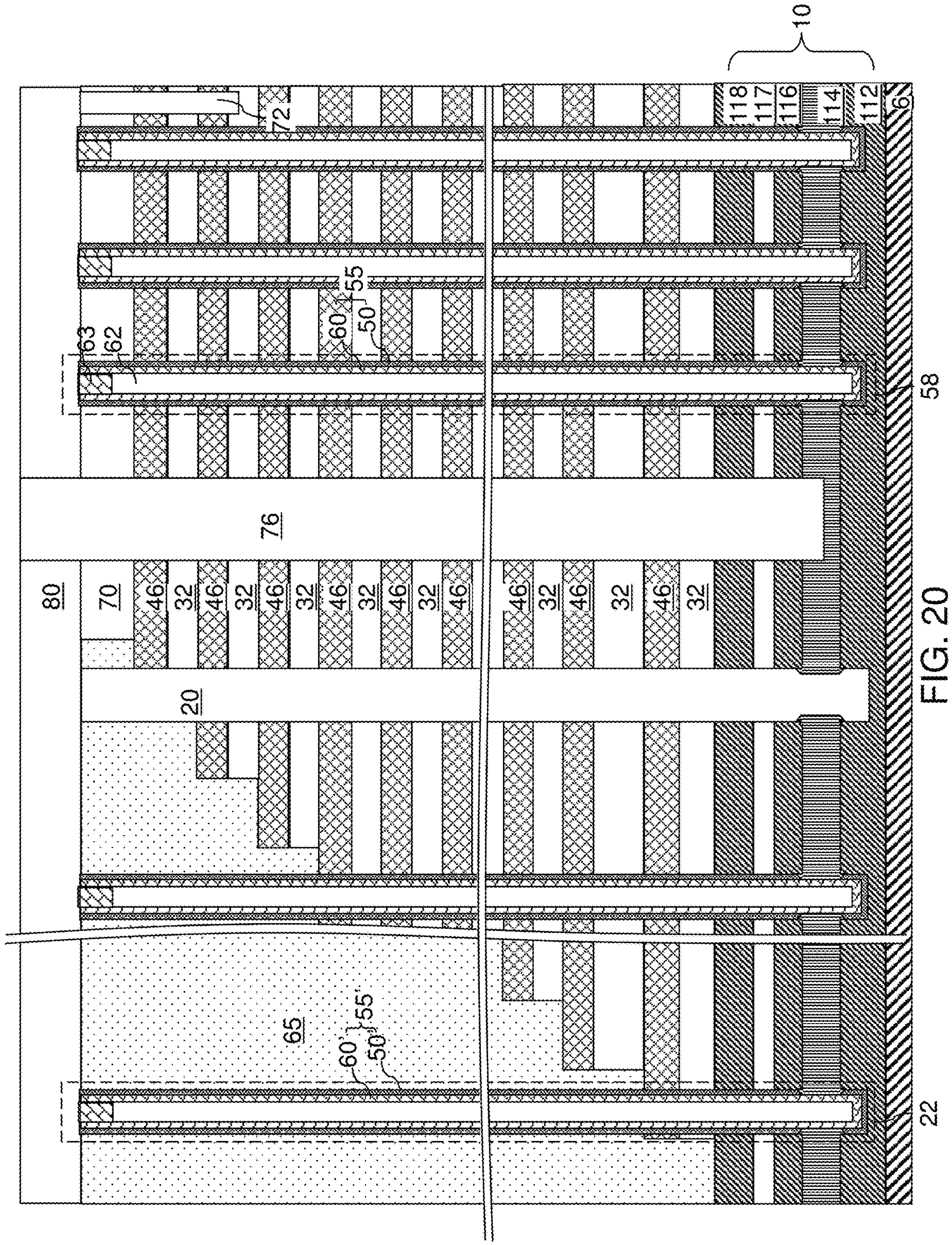
FIG. 20 is a schematic vertical cross-sectional view of the first exemplary structure after formation of backside trench fill structures according to an embodiment of the present disclosure.
Figure 21A:
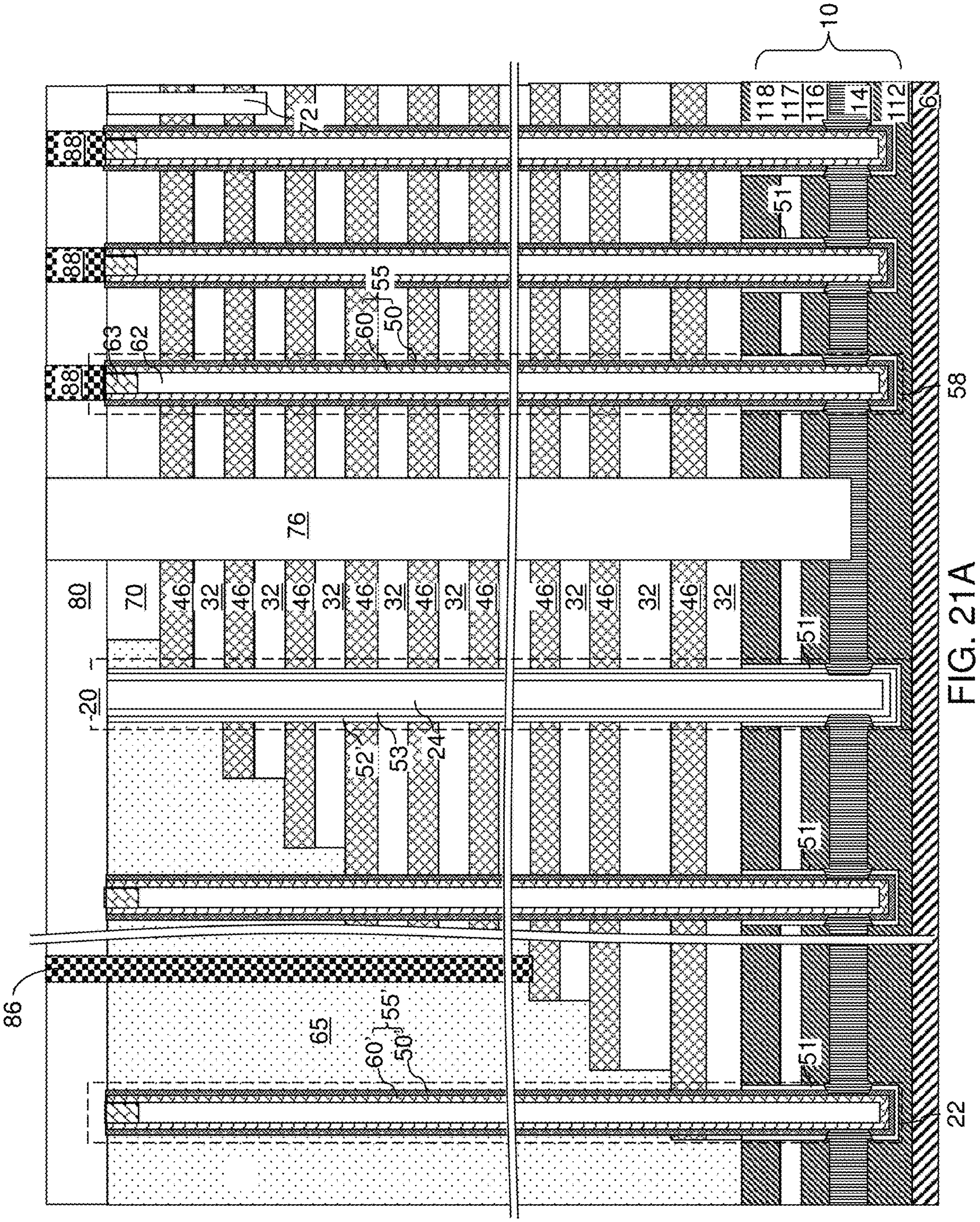
FIG. 21A is a schematic vertical cross-sectional view of a first configuration of the first exemplary structure after formation of contact via structures according to the first embodiment of the present disclosure.
Figure 21B:
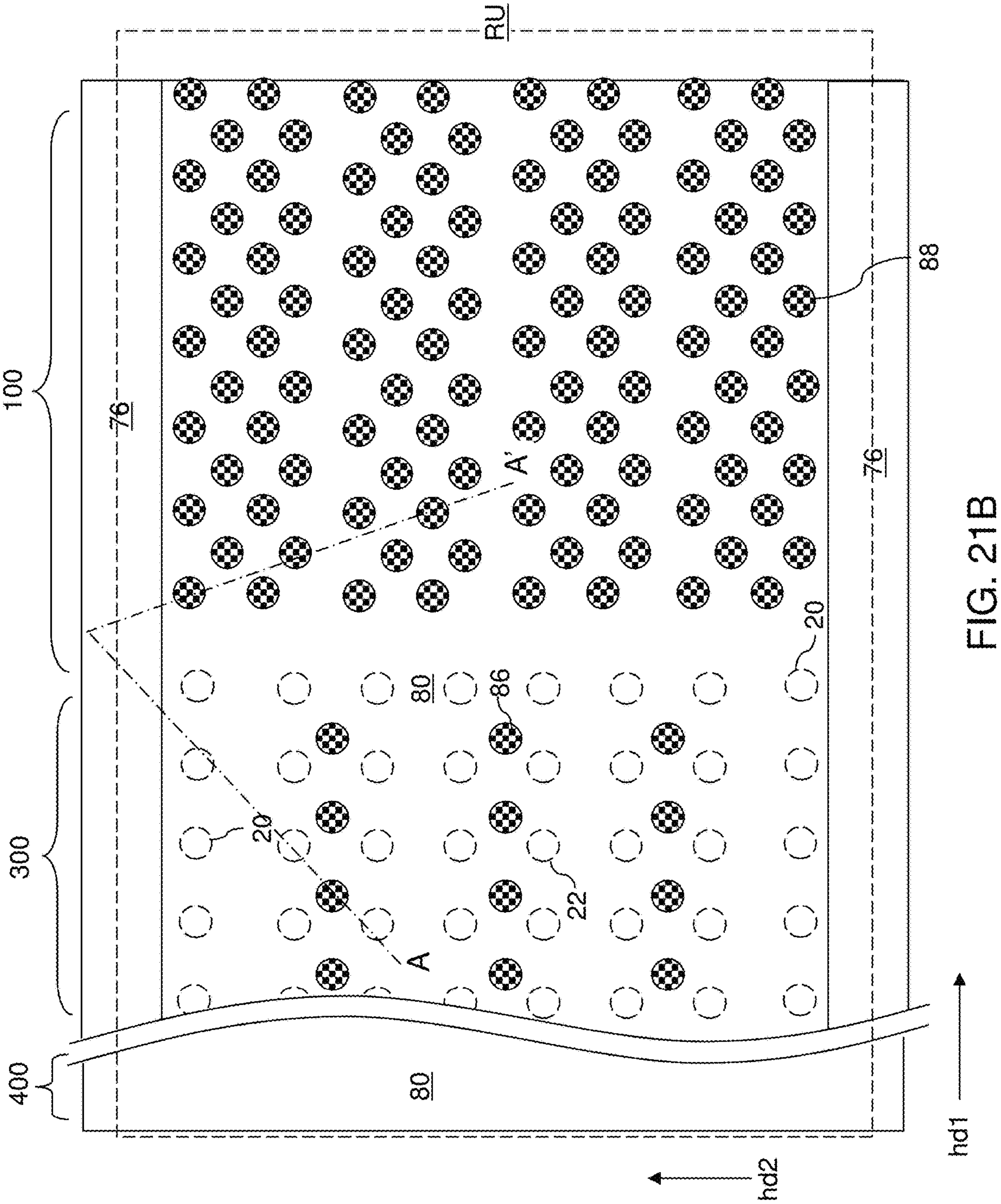
FIG. 21B is a top-down view of the exemplary configuration of FIG. 21A.
Figure 22A:
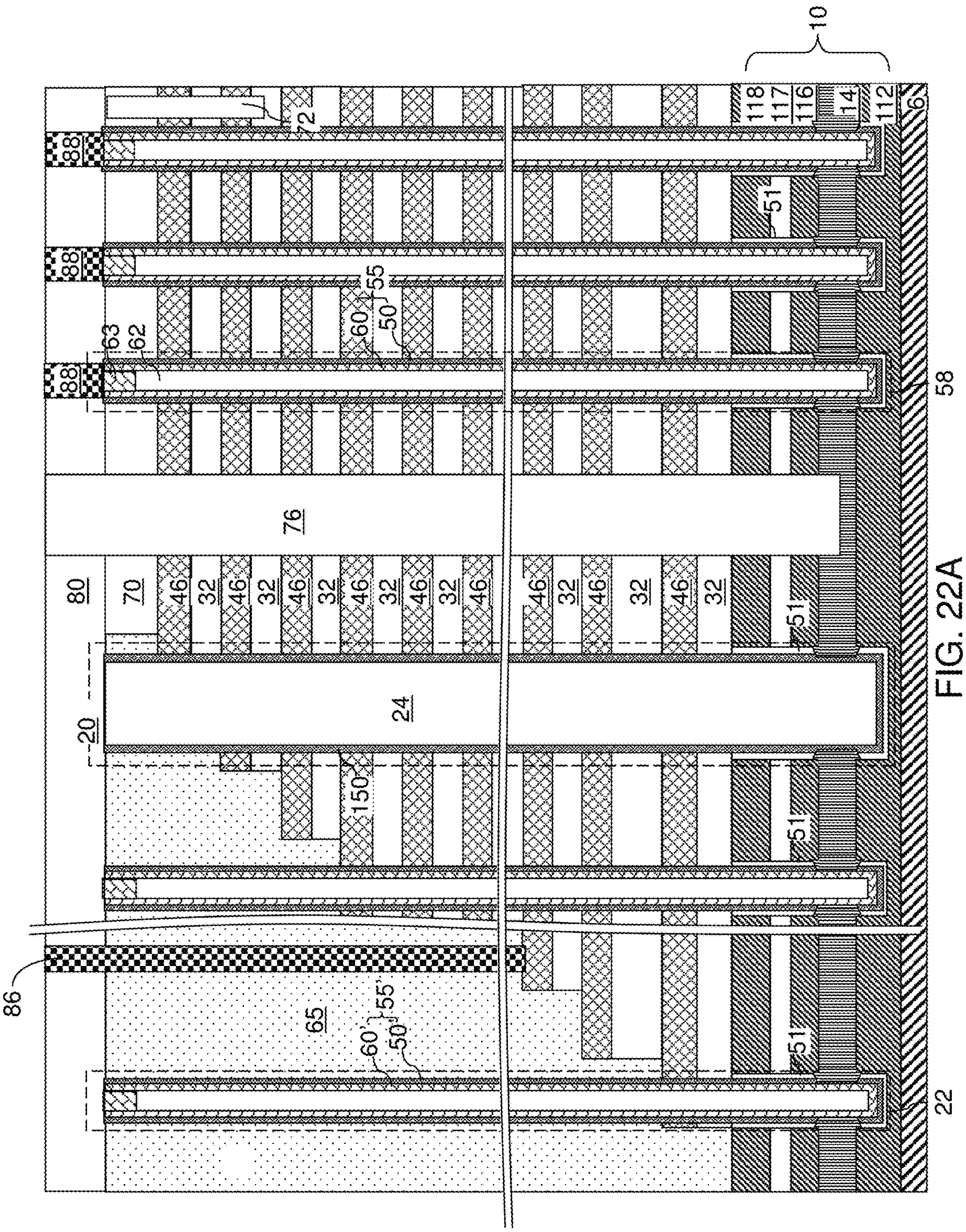
FIG. 22A is a schematic vertical cross-sectional view of a second configuration of the first exemplary structure after formation of contact via structures according to the second embodiment of the present disclosure.
Figure 22B:
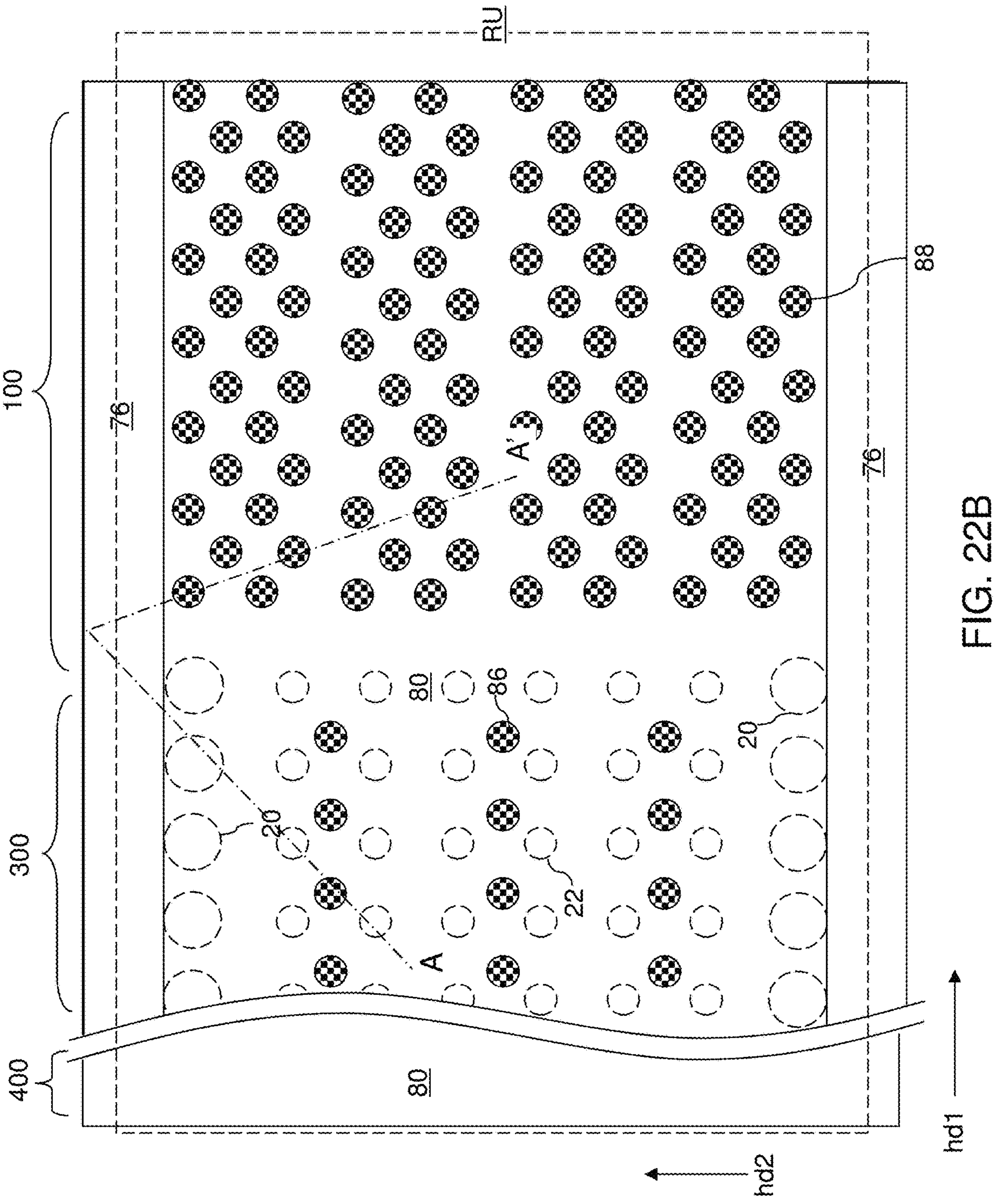
FIG. 22B is a top-down view of the exemplary configuration of FIG. 22A.

Referring to FIGS. 19H and 20, a dielectric fill material layer may be conformally deposited in the backside trenches 79 and over the contact-level dielectric layer 80 by a conformal deposition process. The dielectric fill material layer may include, for example, silicon oxide. Each portion of the dielectric fill material layer that fills a backside trench 79 constitutes a backside trench fill structure 76. Alternatively, the backside trench fill structure 76 may include dielectric sidewall spacers surrounding an electrically conductive local interconnect (i.e., source line or electrode) which contacts the buried source layer (112, 114, 116), A horizontally-extending portion of the dielectric fill material layer that is deposited over the contact-level dielectric layer 80 may be removed, for example, by a recess etch process, or may be incorporated into the contact-level dielectric layer 80, i.e., may become an upper portion of the contact-level dielectric layer 80.

FIGS. 21A and 21B, FIGS. 22A and 22B, FIGS. 23A and 23B, FIGS. 24A and 24B, and FIGS. 25A and 25B illustrated the first configuration, the second configuration, the third configuration, the fourth configuration, and the fifth configuration of the first exemplary structure, respectively, after formation of various contact via structures (88, 86). The contact via structures (88, 86, 8P) can include drain contact via structures 88 vertically extending through the contact-level dielectric layer 80 and contacting a top surface of a respective one of the drain regions 63 located in the memory opening fill structure 58, and layer contact via structures 86 vertically extending through the contact-level dielectric layer 80 and the retro-stepped dielectric material portion 65 and contacting a respective one of the electrically conductive layers 86. Connection via structures (not shown) may be formed through the retro-stepped dielectric material layer 65 to provide electrical connection to lower-level metal interconnect structures 780.

Figure 24A:
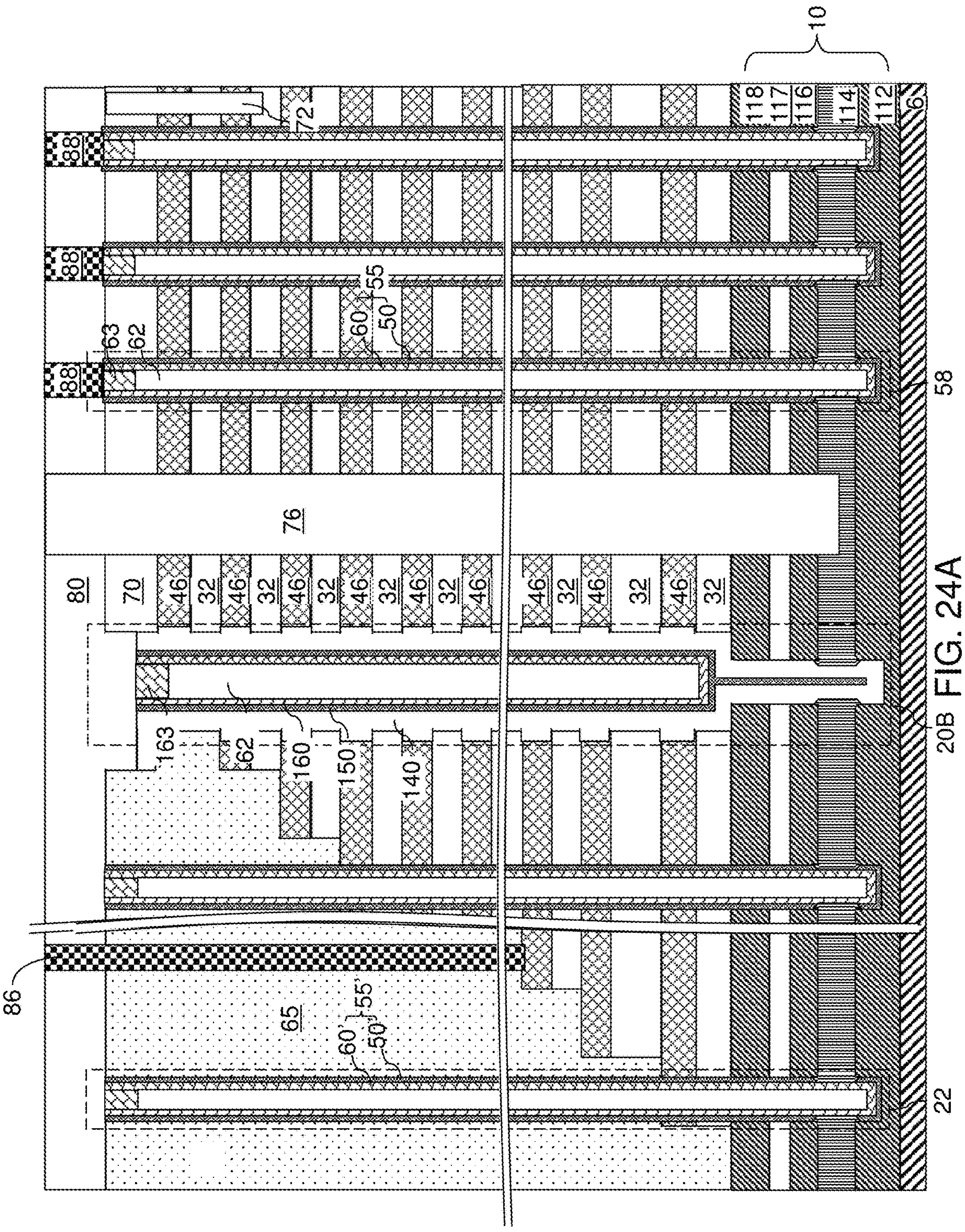
FIG. 24A is a schematic vertical cross-sectional view of a fourth configuration of the first exemplary structure after formation of contact via structures according to the fourth embodiment of the present disclosure.
Figure 24B:
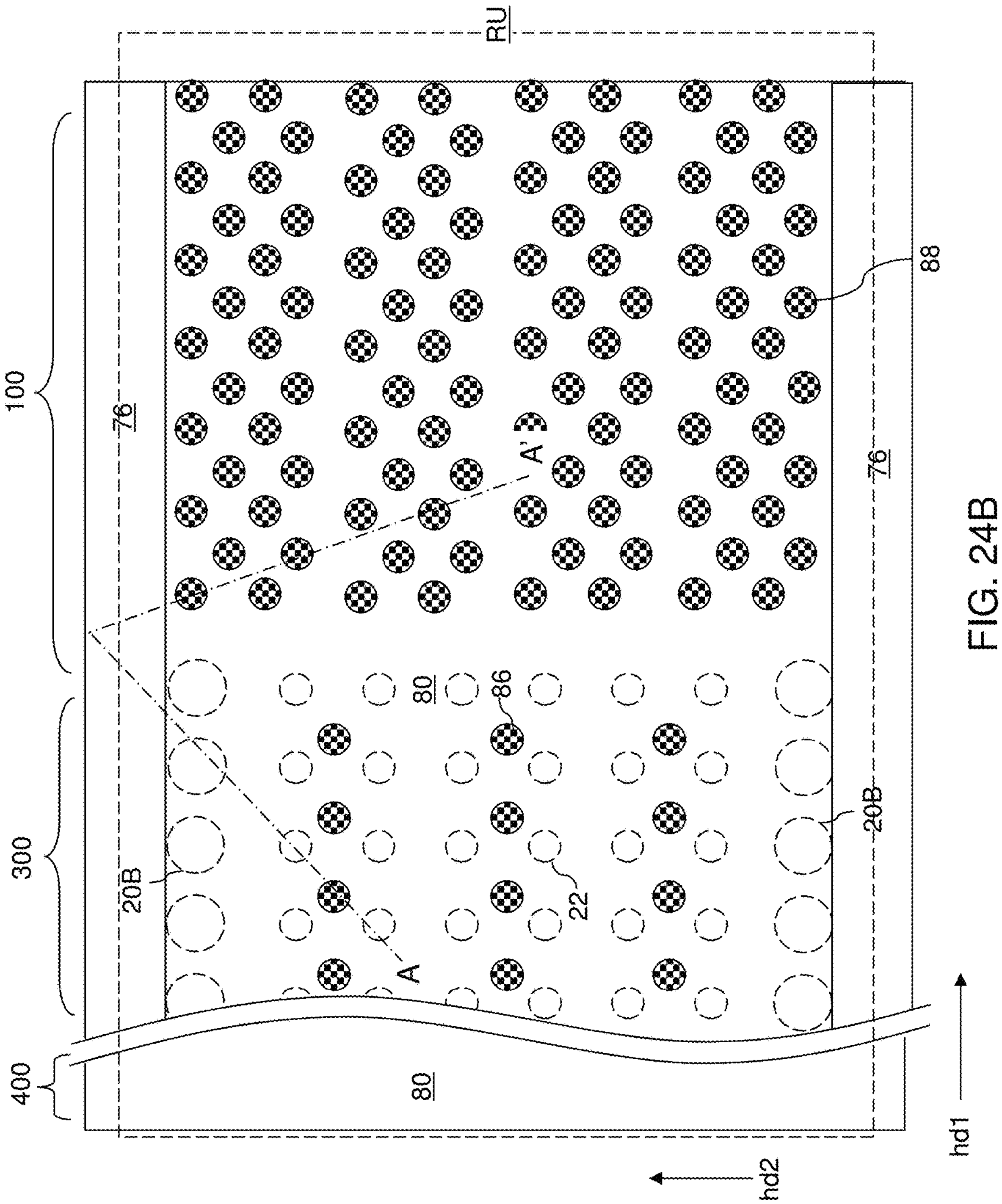
FIG. 24B is a top-down view of the exemplary configuration of FIG. 24A.
Figure 24C:
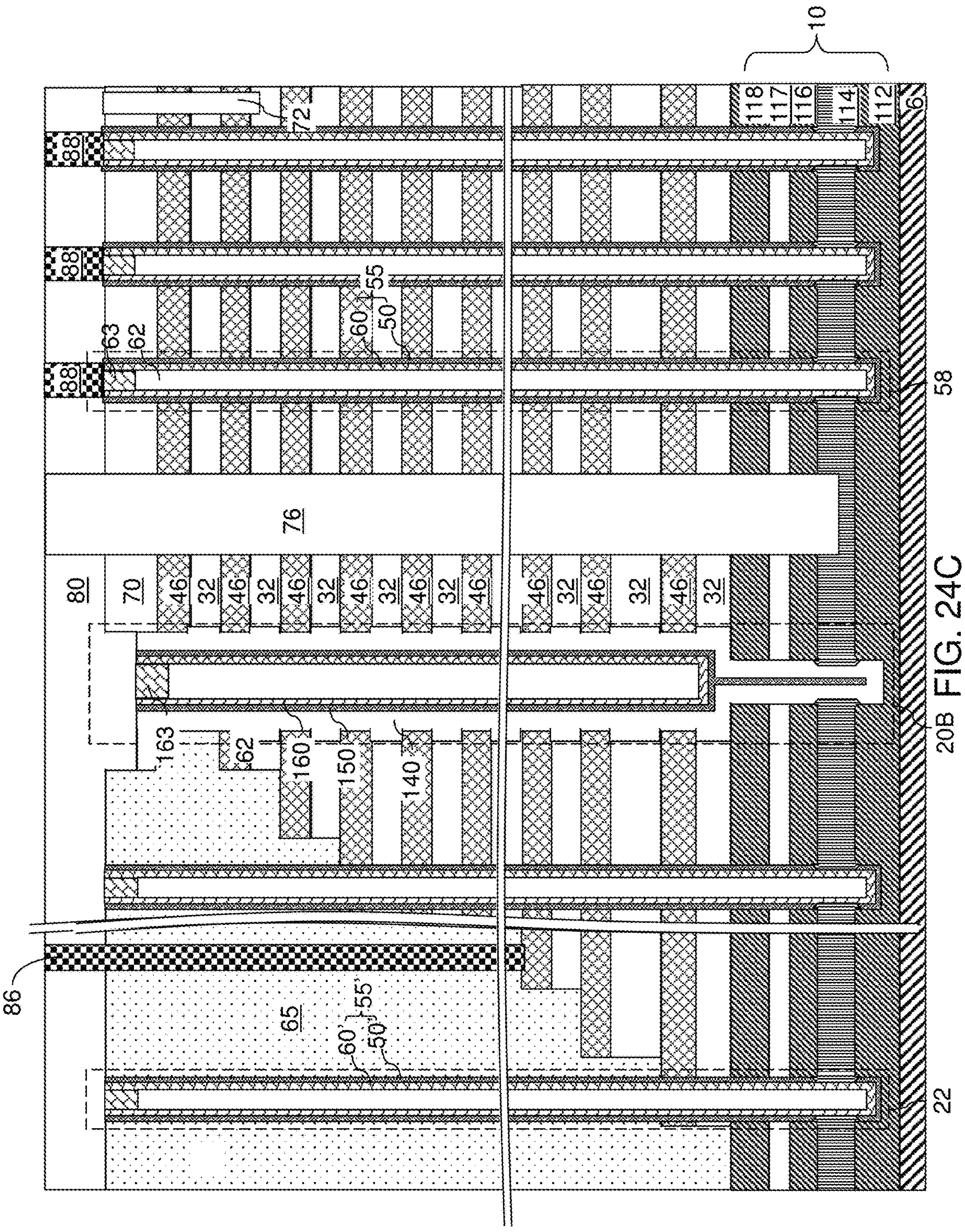
FIG. 24C is a schematic vertical cross-sectional view of an alternative configuration of the first exemplary structure after formation of contact via structures.
Figure 25A:
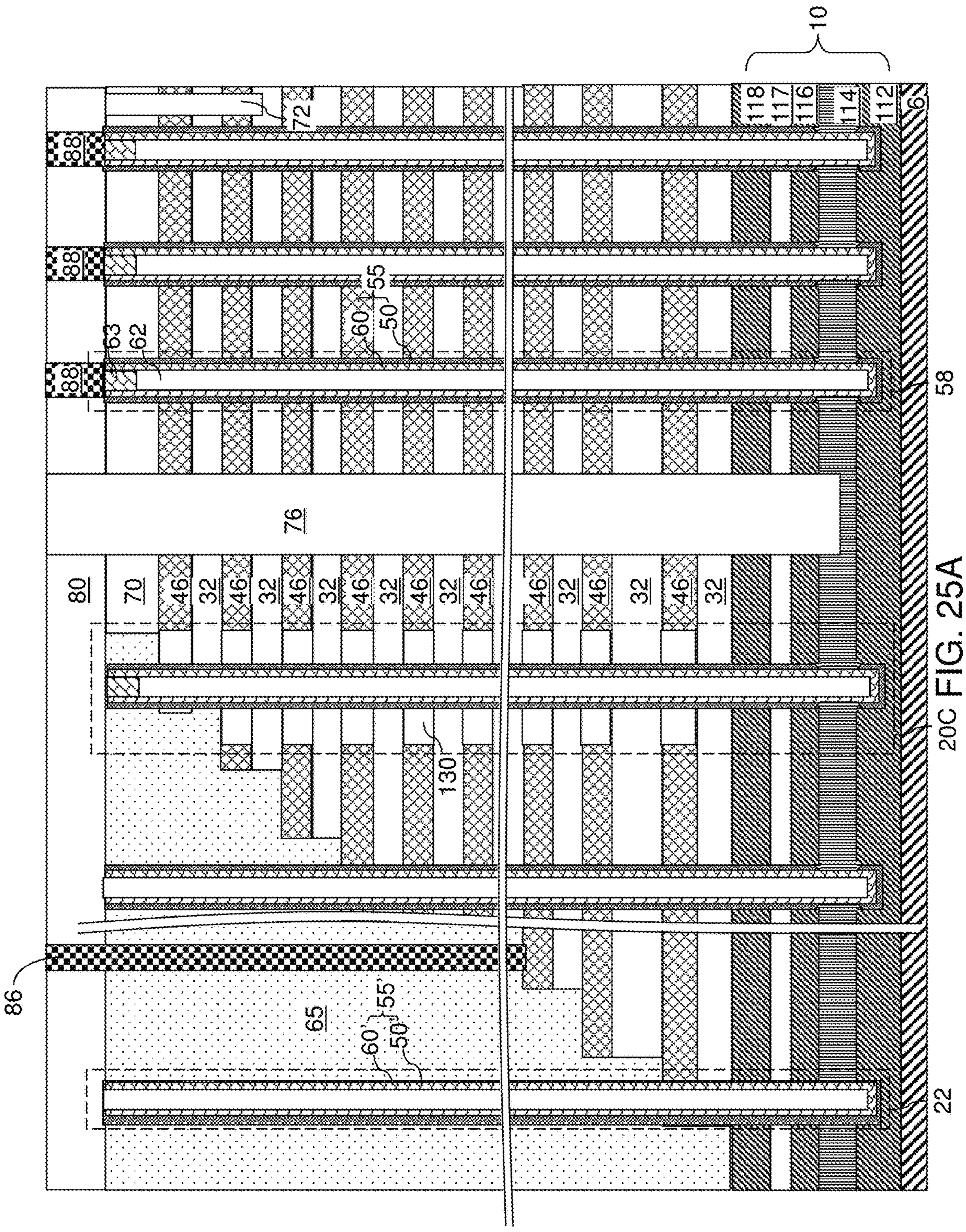
FIG. 25A is a schematic vertical cross-sectional view of a fifth configuration of the first exemplary structure after formation of contact via structures according to the fifth embodiment of the present disclosure.
Figure 25B:
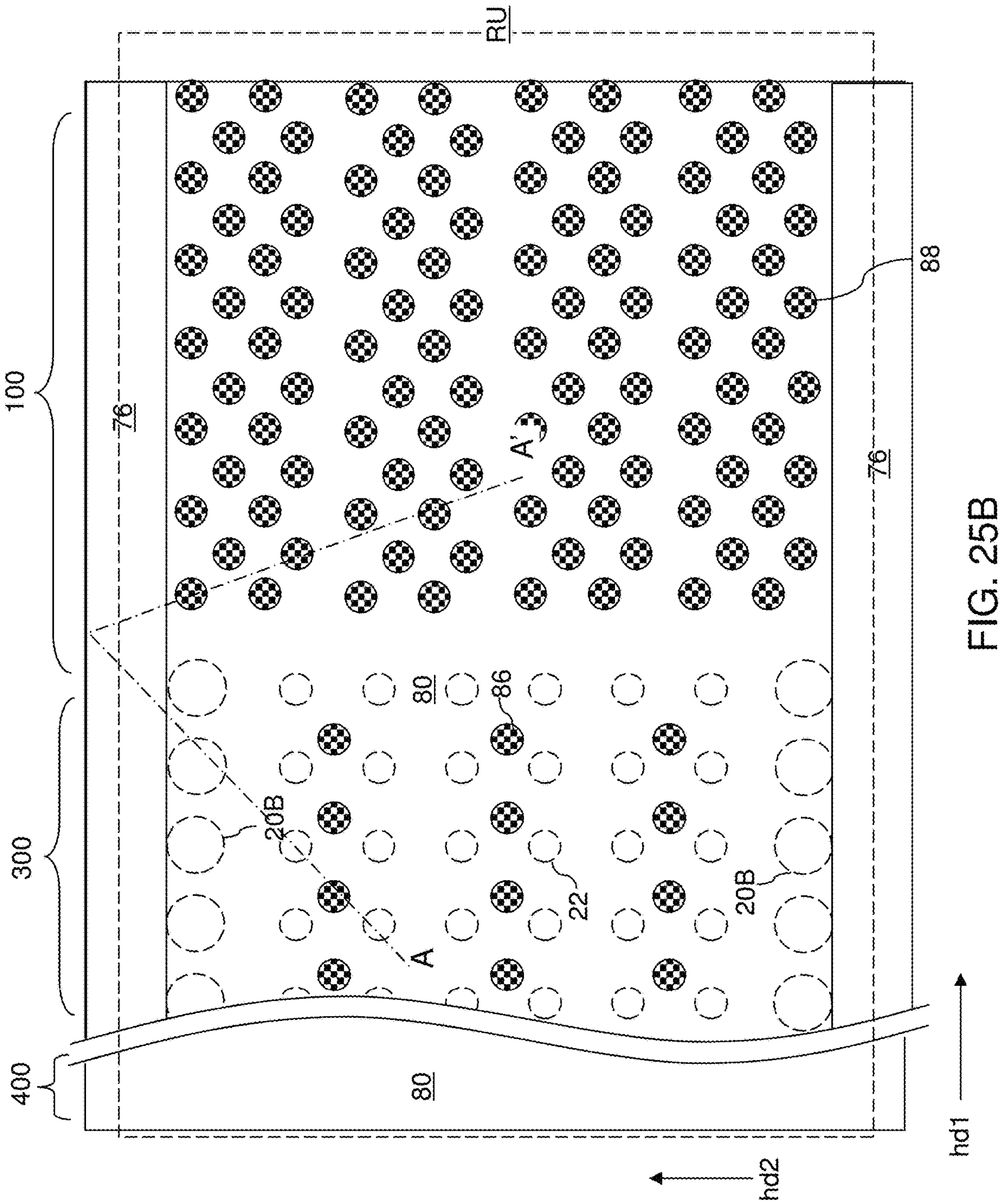
FIG. 25B is a top-down view of the exemplary configuration of FIG. 25A.

Generally, the isotropic etch processes employed to laterally recess the sacrificial material layers 42 and the insulating layers 32 at the processing steps of FIG. 10E may laterally recess the sacrificial material layers 42 farther than the insulating layers 32, or may laterally recess the insulating layers 32 farther than the sacrificial material layers 42. In case the sacrificial material layers 42 are laterally recessed farther than the insulating layers 32, the structure illustrated in FIGS. 24A and 24B can be formed. In case the insulating layers 32 are laterally recessed farther than the sacrificial material layers 42, the structure illustrated in FIG. 24C can be formed, in which each dielectric spacer material layer 140 laterally protrudes farther outward at levels of the insulating layers 32 than at levels of the electrically conductive layers 46.

Referring to the first, second and third embodiments of the present disclosure, a three-dimensional memory comprises: an alternating stack of insulating layers 32 and electrically conductive layers 46 located over a substrate 8, wherein each layer within the alternating stack (32, 46) is present within a memory array region 100, and the alternating stack (32, 46) comprises stepped surfaces in a staircase region 300 in which the electrically conductive layers 46 have variable lateral extents (i.e., have lateral extents that vary, such as decrease and/or increase) with (i.e., as a function of) a vertical distance from the substrate 8; memory opening fill structures 58 located within a respective memory opening 49 vertically extending through the alternating stack (32, 46) in the memory array region 100, wherein each of the memory opening fill structures 58 comprises a respective vertical semiconductor channel 60 and a respective memory film 50; dielectric support pillar structures 20 located in the staircase region 300, vertically extending through the alternating stack (32, 46), and free of any semiconductor material therein; and composite support pillar structures 22 located in the staircase region 300 and vertically extending through the alternating stack (32, 46), wherein each of the composite support pillar structures 22 comprises a dummy vertical semiconductor channel 60' including a same material as the vertical semiconductor channels 60.

In one embodiment, each of the memory films 50 comprises a memory material layer 54 containing a respective layer of a memory material; and each of the composite support pillar structures 22 comprises a respective dummy memory material layer including a respective additional layer of the memory material. In one embodiment, the dielectric support pillar structures 20 are free of the memory material. In one embodiment, each of the dielectric support pillar structures 20 has a greater maximum lateral extent than each of the composite support pillar structures 22.

In one embodiment, the three-dimensional memory device comprises: a retro-stepped dielectric material portion 65 overlying the stepped surfaces of the alternating stack (32, 46); and a contact-level dielectric layer 80 overlaying the alternating stack (32, 46) and the retro-stepped dielectric material portion 65, wherein an entire top surface of each of the dielectric support pillar structures 20 and an entire top surface of each of the composite support pillar structures 22 are in contact with a bottom surface of the contact-level dielectric layer 80.

In one embodiment, each of the memory opening fill structures 58 comprises a respective drain region 63 contacting a top end of the respective vertical semiconductor channel 60; and each of the composite support pillar structures 22 comprises a respective dummy drain region 63' contacting a top end of the respective dummy vertical semiconductor channel 60'.

In one embodiment, the three-dimensional memory device comprises: a contact-level dielectric layer 80 overlaying the alternating stack (32, 46) and the retro-stepped dielectric material portion 65; and drain contact via structures 88 vertically extending through the contact-level dielectric layer 80 and contacting a top surface of a respective one of the drain regions 63, wherein an entirety of top surfaces of the dummy drain regions 63' contacts a bottom surface of the contact-level dielectric layer 80 and the dummy drain regions 63' do not contact the drain contact via structures 88. Thus, each of the dummy vertical semiconductor channels 60' and the dummy drain regions 63' can be electrically floating.

In one embodiment, the three-dimensional memory device comprises: a first backside trench fill structure 76 laterally extending along a first horizontal direction hd1 contacting a first subset of sidewalls of the alternating stack (32, 46); and a second backside trench fill structure 76 laterally extending along the first horizontal direction hd1 and laterally spaced from the first backside trench fill structure 76 along a second horizontal direction hd2 contacting a second subset of the sidewalls of the alternating stack (32, 46).

In one embodiment, each layer within the alternating stack (32, 46) comprises a respective first sidewall in contact with the first backside trench fill structure 76 and a respective second sidewall in contact with the second backside trench fill structure 76; and each of the dielectric support pillar structures 20 is more proximal to a respective proximal one of the first backside trench fill structure 76 and the second backside trench fill structure 76 than the composite support pillar structures 22 are to a respective proximal one of the first backside trench fill structure 76 and the second backside trench fill structure 76. In some embodiments, at least one of the dielectric support pillar structures 20 contacts one of the first backside trench fill structure 76 and the second backside trench fill structure 76.

In one embodiment, a semiconductor material layer (such as the source contact layer 114, the lower source-level semiconductor layer 112, or the upper source-level semiconductor layer 116) can underlie the alternating stack (32, 46). Each of the dielectric support pillar structures 20 and the composite support pillar structures 22 comprises a respective dielectric liner 51 underlying the alternating stack (32, 46) and embedded in, and contacting, the semiconductor material layer.

In one embodiment, each of the memory films 50 comprises a layer stack including a blocking dielectric layer 52, a memory material layer 54, and a dielectric liner 56; and each of the dielectric support pillar structures 20 comprises a dummy blocking dielectric layer 52' comprising a same material as the blocking dielectric layers 52, a silicon oxide liner 53, and a dielectric fill material portion 24.

Figure 23A:
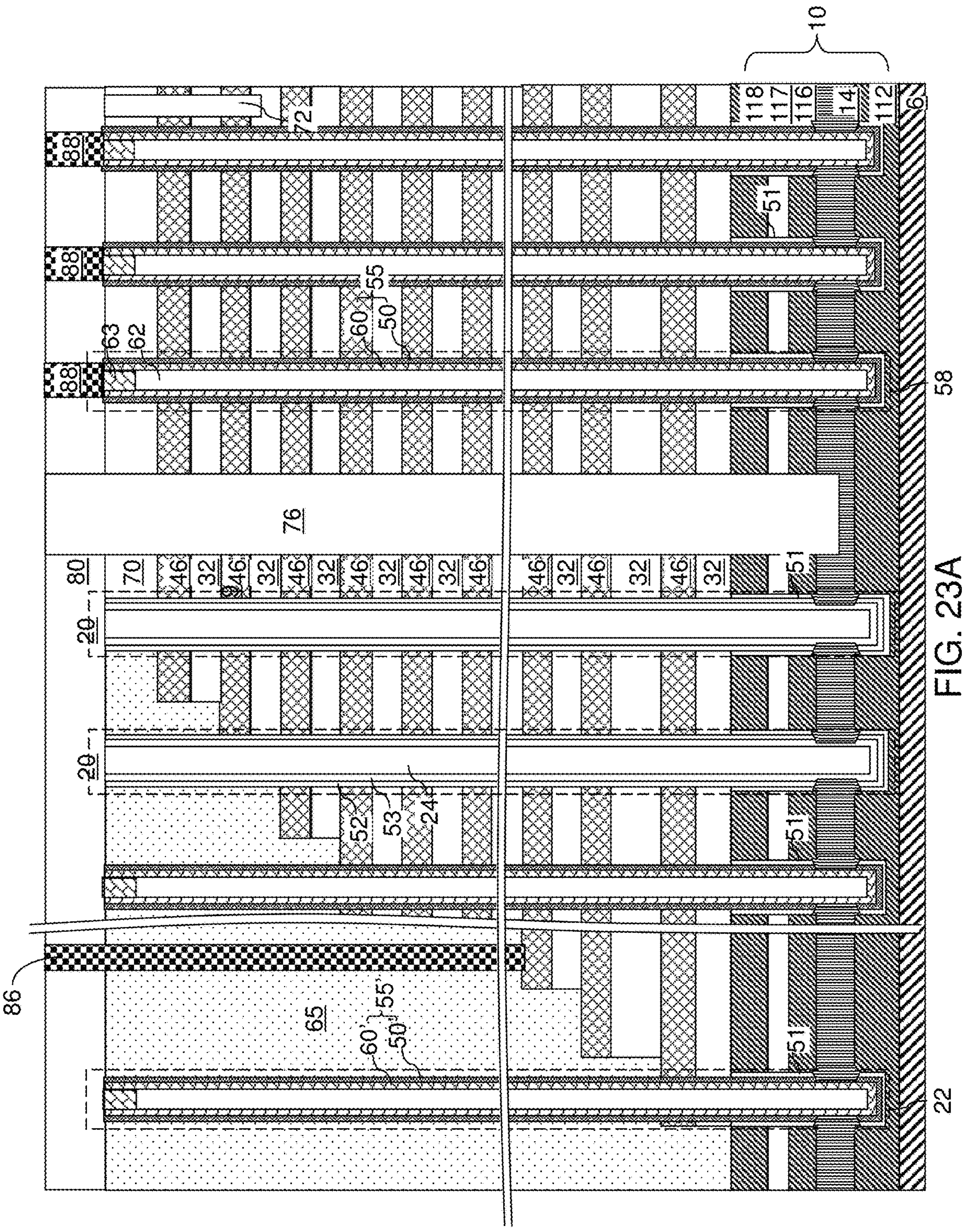
FIG. 23A is a schematic vertical cross-sectional view of a third configuration of the first exemplary structure after formation of contact via structures according to the third embodiment of the present disclosure.
Figure 23B:
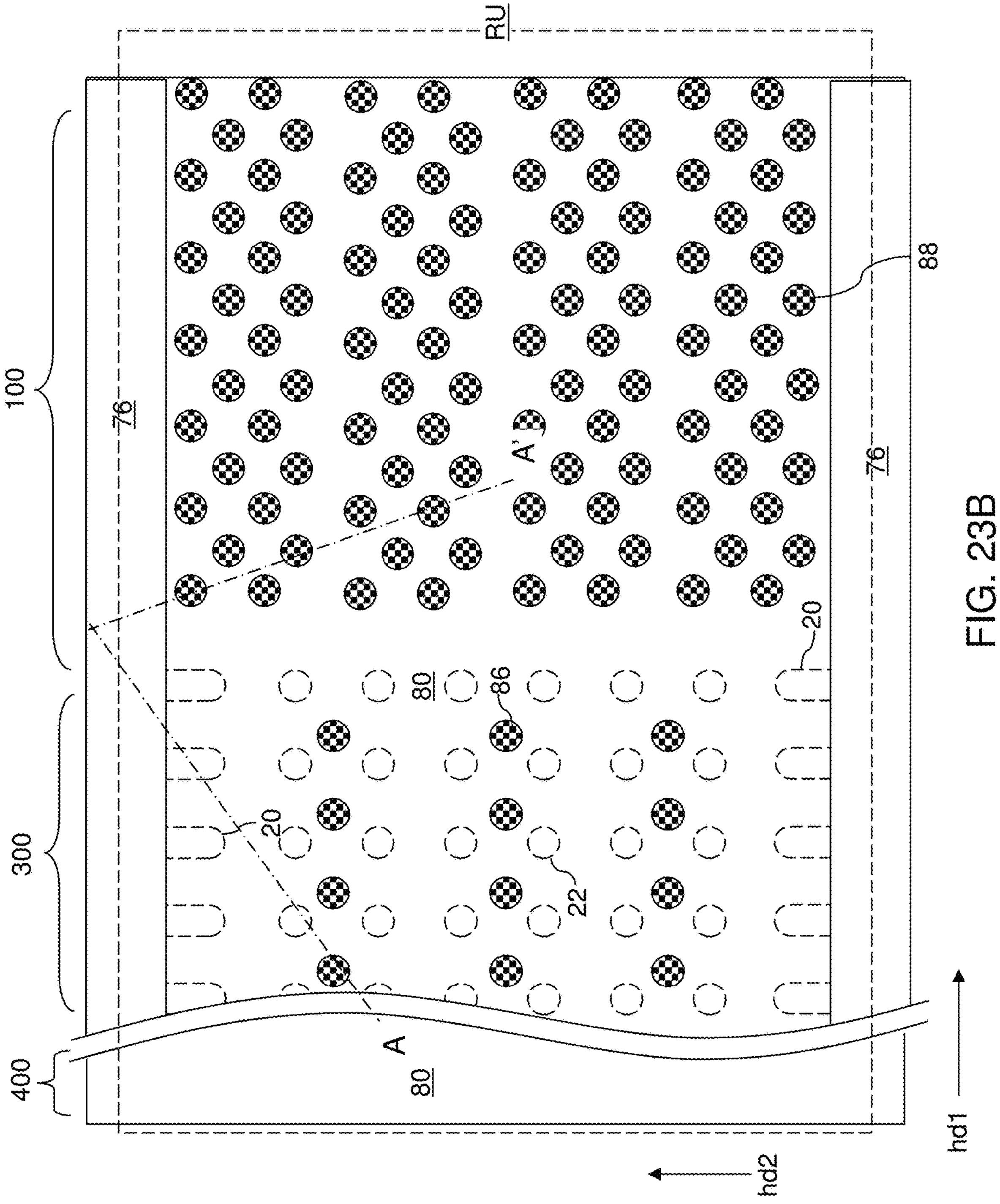
FIG. 23B is a top-down view of the exemplary configuration of FIG. 23A.

In one embodiment, the three-dimensional memory device comprises: a first backside trench fill structure 76 laterally extending along a first horizontal direction hd1; and a second backside trench fill structure 76 laterally extending along the first horizontal direction hd1 and laterally spaced from the first backside trench fill structure 76 along a second horizontal direction hd2, wherein each of the dielectric support pillar structures 20 comprises a respective planar vertical surface that contacts a respective one of the first backside trench fill structure 76 and the second backside trench fill structure 76, which can be provided in the third configuration of the first exemplary structure illustrated in FIGS. 23A and 23B.

In one embodiment, the substrate comprises a source contact layer 114 contacting a cylindrical surface segment of each of the vertical semiconductor channels 60 in the memory opening fill structures 58 and each of the dummy vertical semiconductor channels 60' in the composite support pillar structures 22; and each of the dielectric support pillar structures 20 comprises a respective cylindrical indentation region in which a cylindrical sidewall segment is laterally recessed inward relative to an overlying portion of a respective dielectric support pillar structure 20 and filled with a cylindrical portion of the source contact layer 114.

Referring to the fourth and fifth embodiments of the present disclosure, a three-dimensional memory device comprises an alternating stack of insulating layers 32 and electrically conductive layers 46 located over a substrate 8, wherein each layer within the alternating stack (32, 46) is present within a memory array region 100, and the alternating stack (32, 46) comprises stepped surfaces in a staircase region 300 in which the electrically conductive layers 46 have variable lateral extents (i.e., have lateral extents that vary, such as decrease and/or increase) with (i.e., as a function of) a vertical distance from the substrate 8; memory opening fill structures 58 located within a respective memory opening 49 vertically extending through the alternating stack (32, 46) in the memory array region 100, wherein each of the memory opening fill structures 58 comprises a respective vertical semiconductor channel 60 and a respective memory film 50; first-type support pillar structures 22 located in the staircase region 300 and vertically extending through the alternating stack (32, 46), wherein each of the first-type support pillar structures 22 comprises a respective first dummy vertical semiconductor channel 60' and a respective first dummy memory film 50'; and second-type support pillar structures (20B, 20C) located in the staircase region 300 and vertically extending through the alternating stack (32, 46), wherein each of the second-type support pillar structures (20B, 20C) comprises a respective second dummy vertical semiconductor channel 160, a respective second dummy memory film 150, and at least one respective dielectric spacer material portion (130 or 140) laterally surrounding the respective second dummy memory film 150 and interposed between the electrically conductive layers 46 and the respective second dummy memory film 150.

In one embodiment, each of the second-type support pillar structures (20B, 20C) has a greater maximum lateral extent than each of the first-type support pillar structures 22.

In one embodiment, the three-dimensional memory device comprises: a first backside trench fill structure 76 laterally extending along a first horizontal direction hd1 contacting a first subset of sidewalls of the alternating stack (32, 46); and a second backside trench fill structure 76 laterally extending along the first horizontal direction hd1 and laterally spaced from the first backside trench fill structure along a second horizontal direction hd2 contacting a second subset of the sidewalls of the alternating stack (32, 46), wherein the second-type support pillar structures (20B, 20C) are more proximal to one of the first backside trench fill structure 76 and the second backside trench fill structure 76 than the first-type support pillar structures 22 are to a respective proximal one of the first backside trench fill structure 76 and the second backside trench fill structure 76.

In one embodiment, the vertical semiconductor channels 60, the first dummy vertical semiconductor channels 60', and the second dummy vertical semiconductor channels 160 comprise a same semiconductor material and have a same first thickness; and the memory films 50, the first dummy memory films 50', and the second dummy memory films 150 comprise a same set of at least one material and have a sane second thickness.

In one embodiment, each of the second-type support pillar structures (20B, 20C) has a greater lateral extent at a level of a bottommost one of the electrically conductive layers 46 than at a level of a semiconductor material layer (such as the source contact layer 114, the lower source-level semiconductor layer 112, or the upper source-level semiconductor layer 116) underlying the alternating stack (32, 46). In one embodiment, each of the memory opening fill structures 58 and the first-type support pillar structures 22 may have a lesser lateral extent at a level of the bottommost one of the electrically conductive layers 46 than at the level of the semiconductor material layer in case a dielectric liner 51 is present in each of the memory opening fill structures 58 and the first-type support pillar structures 22. Alternatively, each of the memory opening fill structures 58 and the first-type support pillar structures 22 may have the same lateral extent at a level of the bottommost one of the electrically conductive layers 46 as at the level of the semiconductor material layer in case dielectric liners 51 are not employed.

In one embodiment, the at least one respective dielectric spacer material portion within each of the second-type support pillar structures 20B comprises a respective vertically-extending portion of a dielectric spacer material layer 140 that extends continuously from a topmost surface of a respective one of the second-type support pillar structures (20B, 20C) into a semiconductor material layer that underlies the alternating stack (32, 46).

In one embodiment, the dielectric spacer material layer 140 comprises a downward-protruding portion that protrudes into the semiconductor material layer and has a lesser lateral extent than a portion of the dielectric spacer material layer 140 vertically extending through the alternating stack (32, 46).

In one embodiment, an entirety of an outer surface of the respective second dummy memory film 150 is in contact with the respective vertically-extending portion of the dielectric spacer material layer 140.

In one embodiment, an outer sidewall of the respective vertically-extending portion of the dielectric spacer material layer 140 that vertically extends through the alternating stack (32, 46) has a laterally-undulating vertical cross-sectional profile in which the outer sidewall laterally protrudes outward, or is laterally recessed inward, at levels of the electrically conductive layers 46 relative to levels of the insulating layers 32; and an inner sidewall of the respective vertically-extending portion of the dielectric spacer material layer 140 that vertically extends through the alternating stack (32, 46) has a straight vertical cross-sectional profile.

In one embodiment, each of the first-type support pillar structures 22 comprises a respective first dummy drain region 63' contacting a top end of the respective first dummy vertical semiconductor channel 60'; each of the second-type support pillar structures (20B, 20C) comprises a respective second dummy drain region 163 contacting a top end of the respective second dummy vertical semiconductor channel 160; and top surfaces of the second dummy drain regions 163 are located below a horizontal plane including top surfaces of the first dummy drain regions 63'.

In one embodiment, the at least one respective dielectric spacer material portion within each of the second-type support pillar structures 20C comprises a vertical stack of dielectric spacer fins 130 located at levels of the electrically conductive layers 46. In one embodiment, at least a bottommost dielectric spacer fin within the vertical stack of dielectric spacer fins has an annular cylindrical shape. For example, the bottommost dielectric spacer fin may include a cylindrical sidewall, a top annular surface adjoined to an upper periphery of the cylindrical sidewall, and a bottom annular surface adjoined to a lower periphery of the cylindrical sidewall.

In one embodiment, each of the second dummy memory films 150 is in direct contact with sidewalls of a subset of the insulating layers 32. In one embodiment, the three-dimensional memory device comprises a retro-stepped dielectric material portion 65 overlying the stepped surfaces of the alternating stack (32, 46), wherein a topmost dielectric spacer fin within the vertical stack of dielectric spacer fins 130 has a sidewall that contacts the retro-stepped dielectric material portion 65.

In one embodiment, each of the first-type support pillar structures 22 lacks the dielectric spacer material portion (130 or 140), and the first dummy memory film 50' is in direct contact with sidewalls of a subset of the insulating layers 32 and the electrically conductive layers 46.

The various embodiments of the present disclosure can be employed to form two types of support pillar structures 22 and (20, 20B or 20C). The first-type support pillar structures 22 are more compact and provide a higher mechanical strength in areas that are distal from backside trenches 79, to prevent subsidence (i.e., sinking or settling) of the insulating layers 32 during formation of the backside recesses 43. The second-type support pillar structures (20, 20B, 20C) include only dielectric layers or a thicker dielectric shell around the dummy channel layer 160 than the memory film 50 or the dummy memory film 50' surrounds respective channel 60 and dummy channel 60'. Therefore, in case the backside trenches 79 are filled with a conductive material, and bow or tilt to contact second-type support pillar structures (20, 20B, 20C), there will not be a short circuit with word lines 46 due to the thick dielectric material located at least on the periphery of the second-type support pillar structures (20, 20B, 20C). The second-type support pillar structures (20, 20B, 20C) may also have a larger horizontal cross sectional size than the first-type support pillar structures 22 to reduce backside trench bowing or tilting, while the more compact first-type support pillar structures 22 provide sufficient space to form the contact via structures 86 between them.

Figure 26:
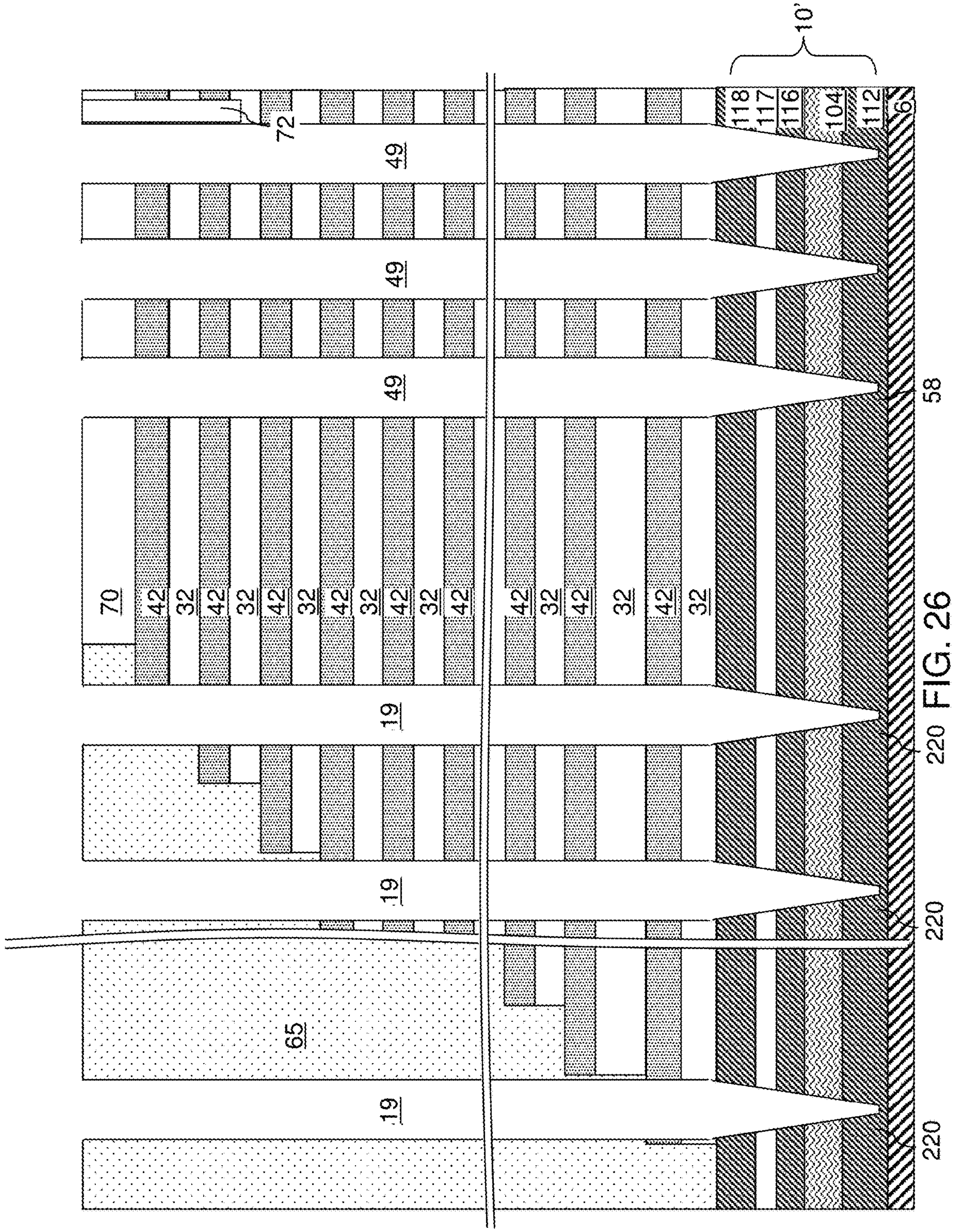
FIG. 26 is a vertical cross-sectional view of a second exemplary structure after formation of memory openings and support openings according to an embodiment of the present disclosure.

Referring to FIG. 26, a second exemplary structure according to a second embodiment of the present disclosure may be derived any of the first exemplary structures described above by forming memory openings 49 and support openings 19. For example, the second exemplary structure may be derived from the first exemplary structure illustrated in FIG. 3 by forming the memory openings 49 and the support openings 19 with a same pattern as the pattern of the memory openings 49 and the support openings 19 illustrated in FIGS. 4A and 4B. Optionally, the etch chemistry of the anisotropic etch process that forms the memory openings 49 and the support openings 19 may be modified from that shown in FIG. 4A to form a taper (i.e., tapered sidewalls with a narrowing width or diameter) at a bottom region of the openings 49 and 19. Alternatively, the taper may be omitted.

Generally, the support openings 19 are formed in the staircase region 300, and the memory openings 49 can be formed in a memory array region 100 in which each layer within the alternating stack (32, 42) is present. In one embodiment, the memory openings 49 and the support openings 19 may be formed into the in-process source-level material layers 10' with an optional taper angle in sidewall surfaces.

In one embodiment, the anisotropic etch process may comprise a first anisotropic etch step that etches the materials of the insulating layers 32, the sacrificial material layers 42, and the retro-stepped dielectric material portion 65 without formation of significant etch residues on physically exposed sidewall surfaces. The physically exposed surfaces of the insulating layers 32, the sacrificial material layers 42, and the retro-stepped dielectric material portion 65 that are exposed to the memory openings 49 or to the support openings 19 may be vertical or substantially vertical with a taper angle greater than 0 degree and less than 5 degrees, such as less than 2 degrees and/or less than 1 degree and/or less than 0.5 degree. The taper angle is measured relative to the vertical direction.

In one embodiment, the anisotropic etch process may optionally comprise a second anisotropic etch step that etches the materials of the in-process source-level material layers 10'. The second anisotropic etch step may employ an etch chemistry that generates polymer residues during etching of the semiconductor materials in the in-process source-level material layers 10'. For example, the second anisotropic etch step may employ an etch chemistry that employs a $Cl_2$—Ar plasma, which generates etch residues including unsaturated $SiCl_2$ and SiCl etch products, and thus, forms tapered sidewall surface segments in the in-process source-level material layers 10'. The taper angle of the tapered sidewall surface segments of the memory openings 49 and the support openings 19 within the in-process source-level material layers 10' may be in a range from 0.5 degree to 15 degrees, such as from 1 degree to 10 degrees, and/or from 2 degrees to 7 degrees.

Thus, in one embodiment, segments of sidewalls of the memory openings 49 and the support openings 19 located within the source-level material layers 10 may have a greater taper angle than segments of the sidewalls of the memory openings 49 and the support openings 19 that are formed within the alternating stack (32, 42). In one embodiment, each of the memory openings 49 and the support openings 19 may be formed within an inverted conical shape such that the apex of the inverted conical shape is formed within the lower source-level semiconductor layer 112. Optionally, a silicon nitride liner (not shown) may be deposited on sidewalls of the memory openings 49 and the support openings 19. Optionally, the silicon nitride liner may be oxidized in an oxygen containing ambient to convert the silicon nitride liner to a silicon oxide or silicon oxynitride liner. Alternatively, a thin silicon oxide liner may be deposited on sidewalls of the memory openings 49 and the support openings 19. If present, the thickness of a dielectric nitride liner or the silicon oxide liner may be in a range from 1 nm to 4 nm, although lesser and greater thicknesses may also be employed. The liner may comprise at least a portion of the blocking dielectric 52 located in the memory openings 49 and at least a portion of the dummy blocking dielectric layer 52' located in the support openings, as described above.

Figure 27:
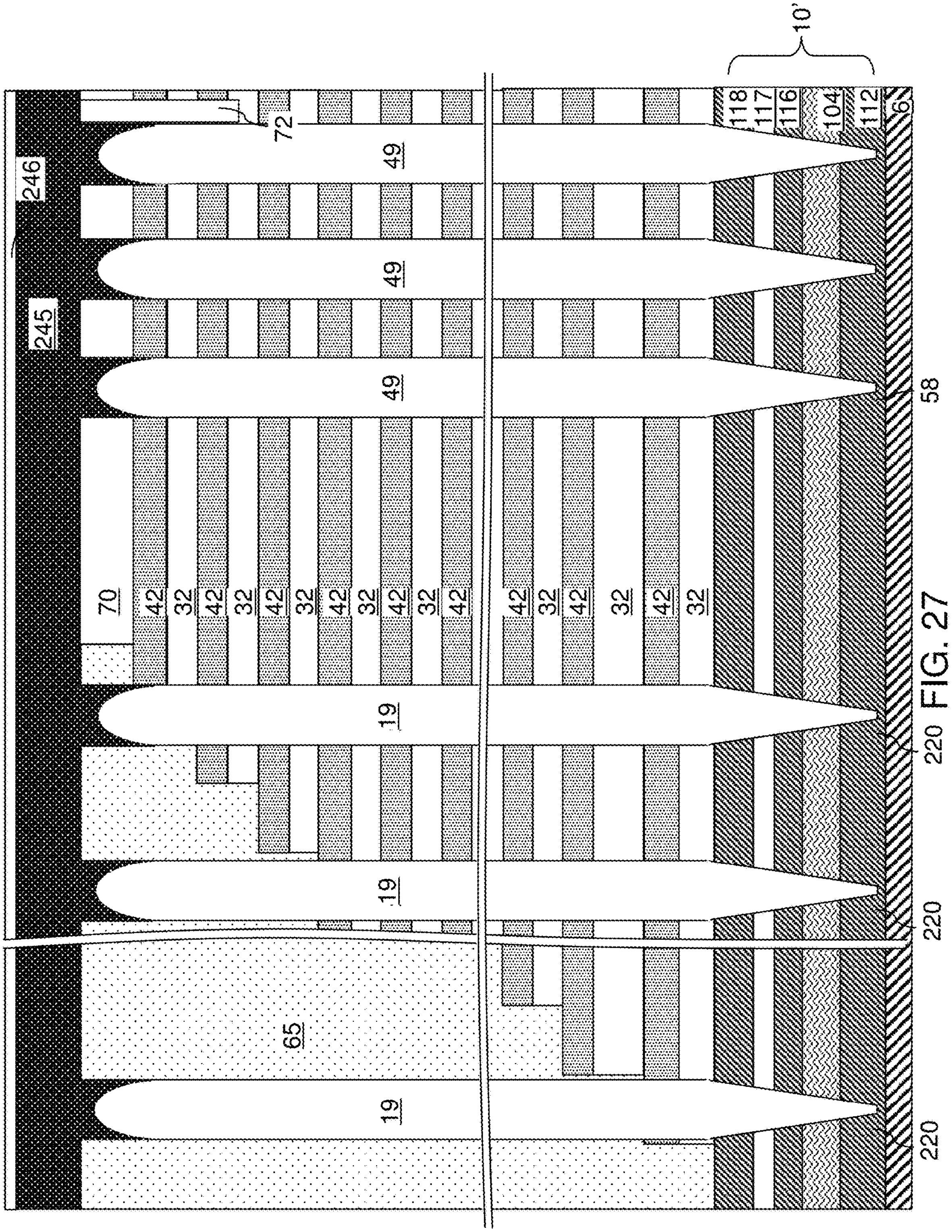
FIG. 27 is a vertical cross-sectional view of the second exemplary structure after formation of a patterning film and an optional sacrificial dielectric layer according to an embodiment of the present disclosure.

Referring to FIG. 27, a patterning film 245 may be formed over the insulating cap layer 70 and the retro-stepped dielectric material portion 65 by anisotropically depositing a patterning material. In one embodiment, the patterning film 245 may comprise a carbon-based material such as amorphous carbon, diamond-like carbon, or a compound thereof. For example, the patterning film 245 may include Advanced Patterning Film (APF) commercially available from Applied Materials, Inc.™ The patterning film 245 may be formed by an anisotropic deposition method, such as a plasma-enhanced chemical vapor deposition (PECVD) process. The thickness of the patterning film 245 over a horizontal top surface of the insulating layer 70 may be in a range from 100 nm to 1,000 nm, such as from 200 nm to 500 nm, although lesser and greater thicknesses may also be employed. Encapsulated cavities may be formed within each void in the memory openings 49 and the support openings 19 that is not filled within the patterning film 245.

An optional sacrificial dielectric layer 246 may be formed over the patterning film 245. In one embodiment, the optional sacrificial dielectric layer 246 may comprise a silicon oxide layer such as a low temperature oxide (LTO) layer formed by chemical vapor deposition. The thickness of the optional sacrificial dielectric layer 246 may be in a range from 2 nm to 20 nm, although lesser and greater thicknesses may also be employed.

Figure 28:
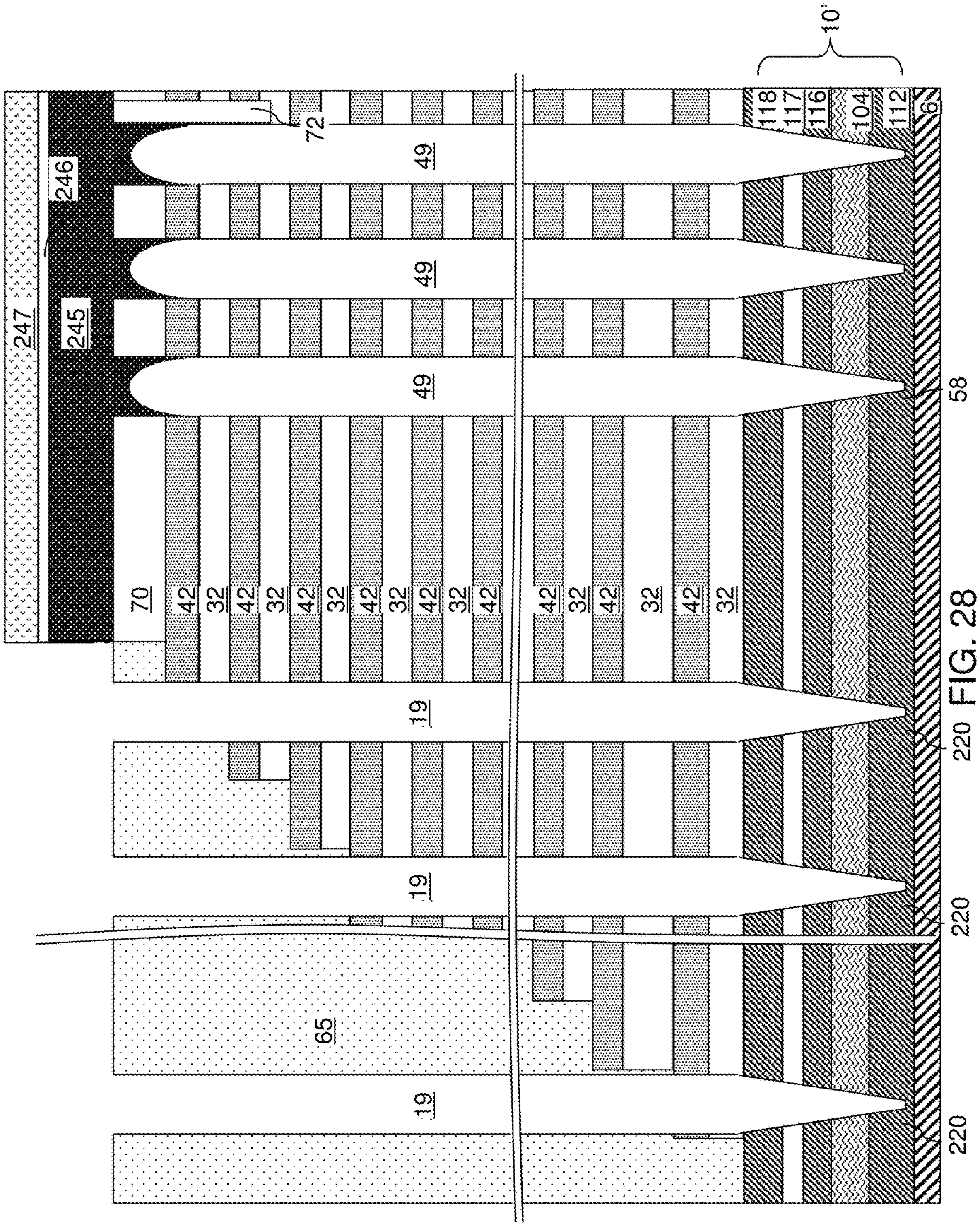
FIG. 28 is a vertical cross-sectional view of the second exemplary structure after patterning the patterning film by transferring a pattern in a patterned photoresist layer according to an embodiment of the present disclosure.

Referring to FIG. 28, a photoresist layer 247 can be applied over the patterning film 245 and the optional sacrificial dielectric layer 246, and can be lithographically patterned to remove portions of the photoresist layer 247 that are located over the support openings 19 without removing the portions of the photoresist layer 247 that are located over the memory openings 49. In one embodiment, portions of the photoresist layer 247 can be removed from the staircase region 300 without removing portions of the photoresist layer 247 from the memory array region 100.

An etch process can be performed to remove the unmasked portions of the optional sacrificial dielectric layer 246 and the patterning film 245. The optional sacrificial dielectric layer 246 and the patterning film 245 are removed from above the support openings 19 in the staircase region 300. The etch process may comprise an isotropic etch process (such as a wet etch process) or an anisotropic etch process (such as a reactive ion etch process). The photoresist layer 247 may be subsequently removed, for example, by ashing. The patterning film 245, as patterned by the processing steps of FIG. 28, covers each of the memory openings 49 that are located in the memory array region 100, and does not cover the support openings 19 that are located in the staircase region 300.

Figure 29:
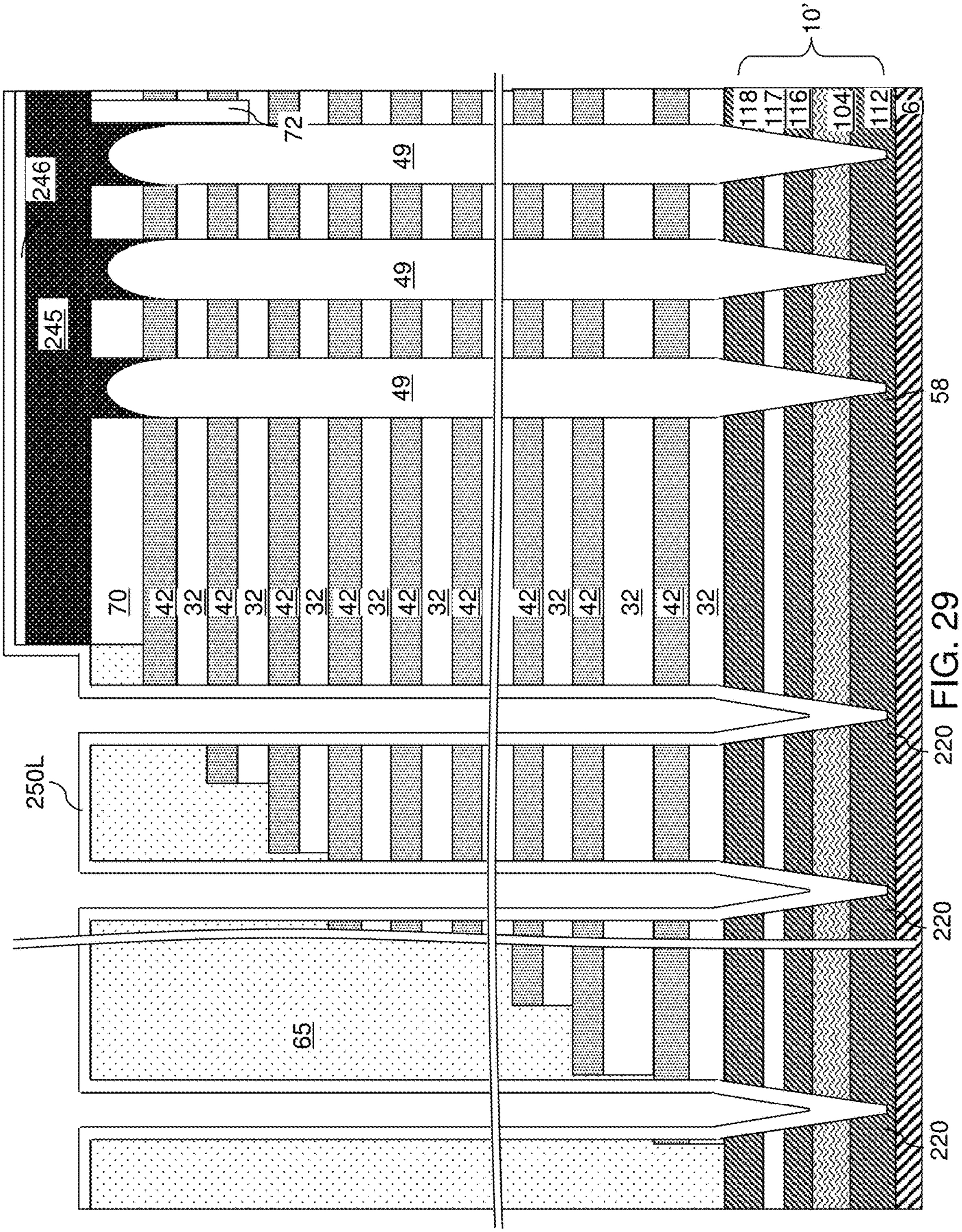
FIG. 29 is a vertical cross-sectional view of the second exemplary structure after deposition of a dielectric spacer material portion layer according to an embodiment of the present disclosure.

Referring to FIG. 29, a dielectric spacer material layer 250L can be deposited on physically exposed surfaces around the support openings 19 and over the optional sacrificial dielectric layer 246. The dielectric spacer material layer 250L may also be deposited on physically exposed sidewalls of the patterning film 245. The dielectric spacer material layer 250L includes an insulating material that is different from the material of the sacrificial material layers 42. For example, the dielectric spacer material layer 250L may comprise a silicon oxide material, such as a low temperature silicon oxide. The dielectric spacer material layer 250L may be formed by a conformal deposition process, such as a low pressure chemical vapor deposition (LPCVD) process. The thickness of the dielectric spacer material layer 250L may be in a range from 4 nm to 60 nm, such as from 6 nm to 40 nm, although lesser and greater thicknesses may also be employed.

Surface segments of the dielectric spacer material layer 250L are physically exposed to voids within unfilled volumes of the support openings 19. According to an embodiment of the present disclosure, the thickness of the dielectric spacer material layer 250L may be selected such that each physically exposed surface of the dielectric spacer material layer 250L located in a respective support opening 19 comprises a respective conical bottom tip. The apex of each conical bottom tip may be formed above the horizontal plane including the bottom surface of the source-level sacrificial layer 104. In one embodiment, the apex of each conical bottom tip may be formed above the horizontal plane including the top surface of the source-level sacrificial layer 104.

Figure 30:
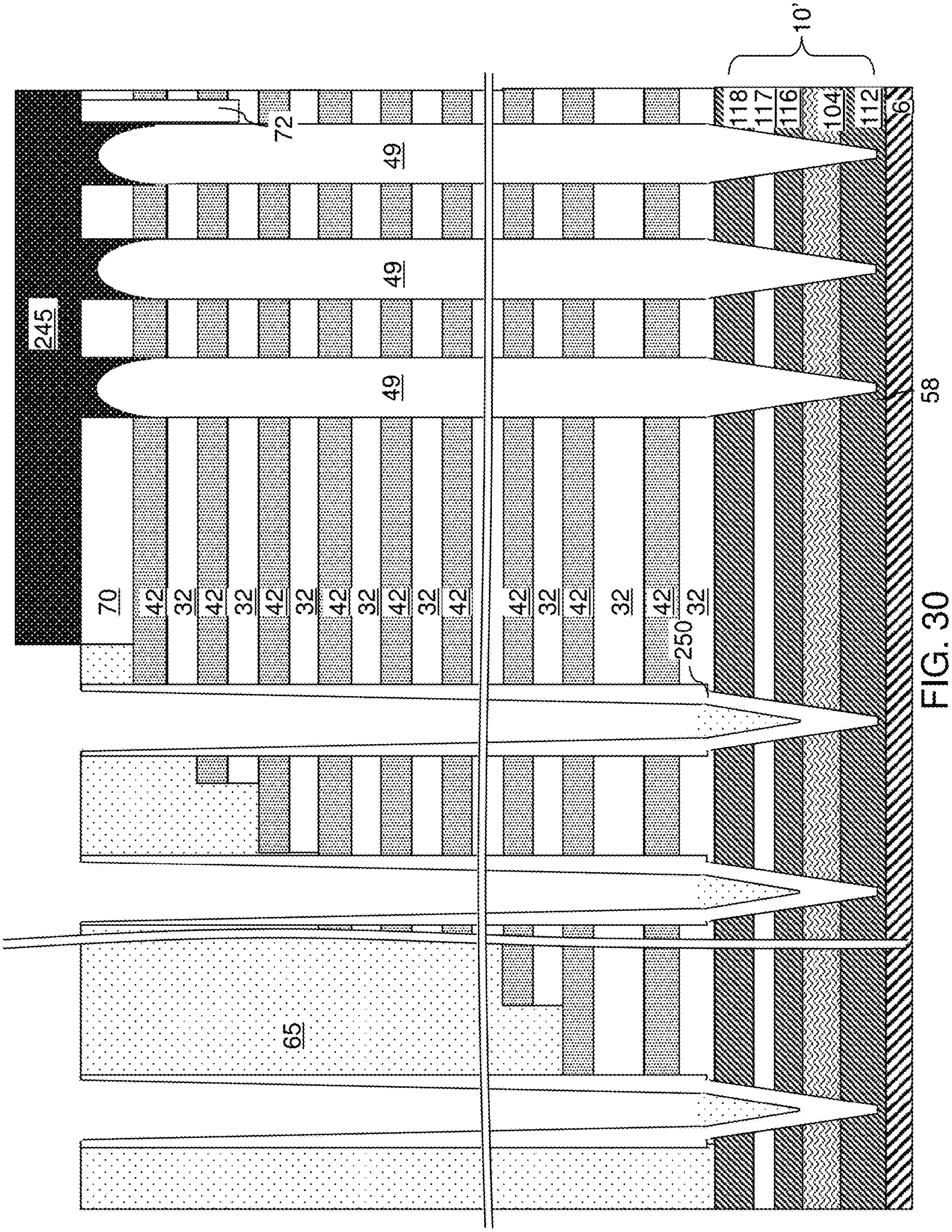
FIG. 30 is a vertical cross-sectional view of the second exemplary structure after removing upper portions of the dielectric spacer material portion layer according to an embodiment of the present disclosure.

Referring to FIG. 30, an anisotropic etch process may be performed to remove portions of the dielectric spacer material layer 250L and the optional sacrificial dielectric layer 246 that overlie the horizontal plane including the top surfaces of the insulating cap layer 70 and the retro-stepped dielectric material portion 65. Portions of the dielectric spacer material layer 250L and the entirety of the optional sacrificial dielectric layer 246 can be anisotropically etched from above the patterning film 245 and from upper portions of the support openings 19. In one embodiment, processing parameters of the anisotropic etch process can be selected such that the etch rate for the material of the dielectric spacer material layer 250L is higher above the horizontal plane including the top surface of the retro-stepped dielectric material portion 65 and in upper portions of the support openings 19 than at bottom portions of the support openings 19. For example, the anisotropic etch process may be a depletive etch process in which the etch rate for the material of the dielectric spacer material layer 250L is limited by supply of etchant ions in the plasma. In this case, the etch rate for the material of the dielectric spacer material layer 250L may decrease with a vertical distance downward from the horizontal plane including the top surface of the retro-stepped dielectric material portion 65. In one embodiment, portions of the dielectric spacer material layer 250L can be anisotropically etched by performing a depletive etch process in which the etch rate of the material of the dielectric spacer material layer 250L increases with a vertical distance from the substrate 8 within the support openings 19 (i.e., decreases with a vertical distance from the horizontal plane including the top peripheries of the memory openings 19, such as the vertical plane including the top surface of the retro-stepped dielectric material portion 65). Alternatively, the anisotropic etch process may be a sidewall spacer anisotropic etch process.

Remaining portions of the dielectric spacer material layer 250L in the support openings 19 comprise dielectric spacer material portions 250. In one embodiment in which the openings are tapered at the bottom, each of the dielectric spacer material portions 250 has a variable lateral spacing between an inner sidewall and an outer sidewall that decreases with the vertical distance from the substrate 8. In other words, each of the dielectric spacer material portions 250 has a variable lateral spacing between an inner sidewall and an outer sidewall that increases with a vertical distance downward from the horizontal plane including the top surface of the retro-stepped dielectric material portion 65. In one embodiment, each of the dielectric spacer material portions 250 may comprise an inner surface having a conical bottom tip that is located above the horizontal plane including the bottom surface of the source-level sacrificial layer 104. In one embodiment, the conical bottom tips of the inner surfaces (inner sidewalls) of the dielectric spacer material portions 250 may be located above the horizontal plane including the top surface of the source-level sacrificial layer 104. The topmost surface of each dielectric spacer material portion 250 may be located at or below a horizontal plane including a top surface of the retro-stepped dielectric material portion 65. In one embodiment, the vertical distance between the horizontal plane including the top surface of the retro-stepped dielectric material portion 65 and the topmost surface of each dielectric spacer material portion 250 may be in a range from 0% to 80%, such as from 1% to 4050%, and/or from 5% to 25%, of the vertical distance between the horizontal plane including the top surface of the retro-stepped dielectric material portion 65 and the horizontal plane including the bottommost surface of the alternating stack (32, 42). In one embodiment, one, a plurality, a predominant fraction, and/or each of the dielectric spacer material portions 250 may have an outer sidewall contacting a respective cylindrical surface segment of the retro-stepped dielectric material portion 65.

Figure 31:
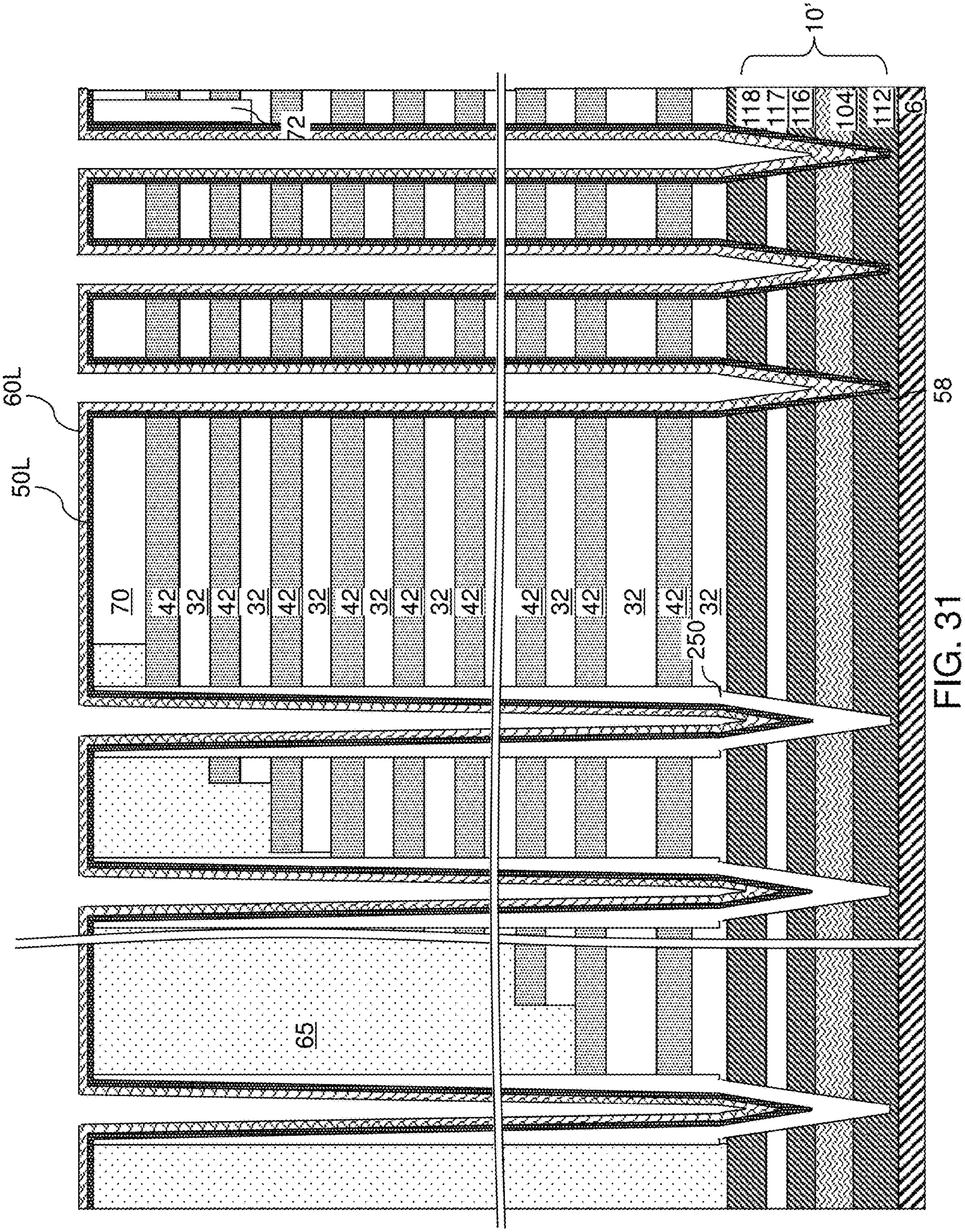
FIG. 31 is a vertical cross-sectional view of the second exemplary structure after formation of a memory film layer and a semiconductor channel material layer according to an embodiment of the present disclosure.

Referring to FIG. 31, the patterning film 245 can be subsequently removed selective to the materials of the insulating cap layer 70, the retro-stepped dielectric material portion 65, the dielectric spacer material portions 250, the alternating stack (32, 42), and the in-process source-level material layers 10'. In one embodiment, the patterning film 245 may be removed by ashing.

Subsequently, a memory film layer SOL and a semiconductor channel material layer 60L can be formed by performing conformal deposition processes in each of the memory openings 49 and support openings 19. The memory film layer SOL may comprise a same set of materials as the memory film 50 described with reference to FIG. 12B. For example, the memory film layer SOL may comprise a layer stack including an optional continuous blocking dielectric layer 52L (described with reference to FIGS. 7B and 12A), a continuous memory material layer 54 (described with reference to FIG. 12B), and an optional dielectric liner 56, such as a tunneling dielectric layer (described with reference to FIG. 12B). The semiconductor channel material layer 60L may have the same material composition and the same thickness range as the semiconductor channel material layer 60L described with reference to FIG. 12B.

Figure 32:
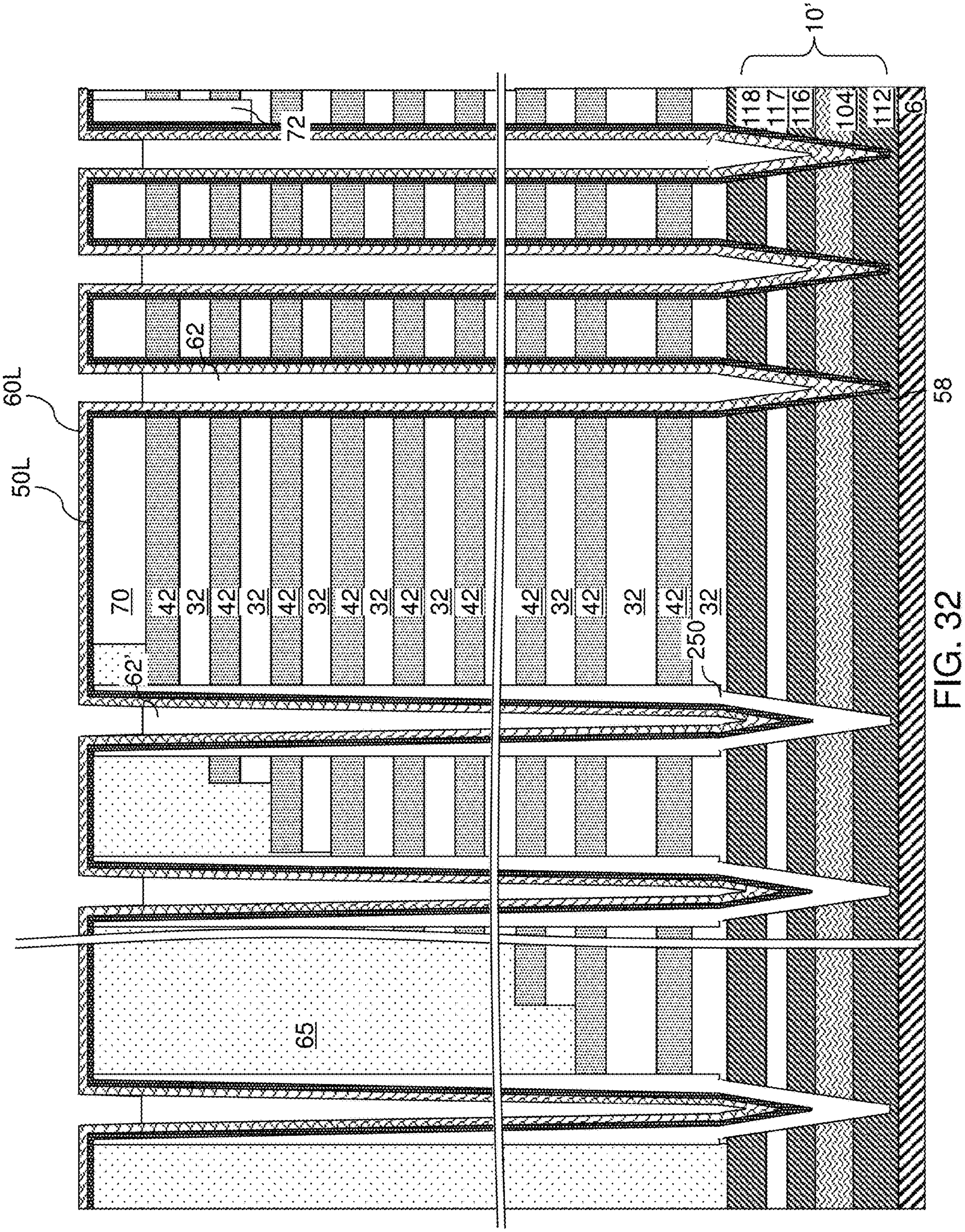
FIG. 32 is a vertical cross-sectional view of the second exemplary structure after formation of dielectric cores according to an embodiment of the present disclosure.

Referring to FIG. 32, the processing steps described with reference to FIG. 12C may be performed to form a dielectric core 62 within each memory opening 49 and to form a dummy dielectric core 62' within each support opening 19. The dielectric cores 62 and the dummy dielectric cores 62' may have the same material composition. For example, the dielectric cores 62 and the dummy dielectric cores 62' may comprise, and/or may consist essentially of, silicon oxide.

Figure 33:
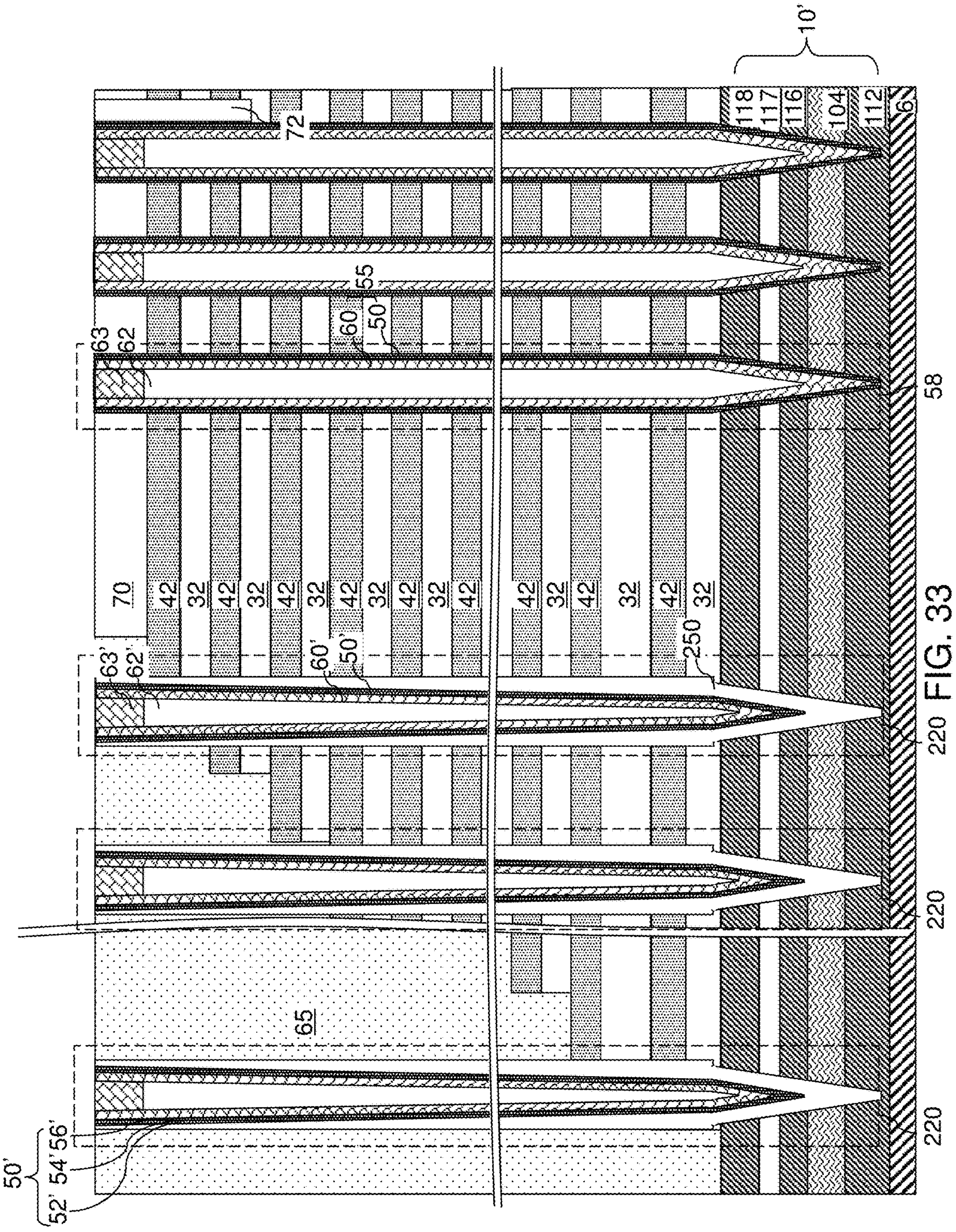
FIG. 33 is a vertical cross-sectional view of the second exemplary structure after formation of drain regions and dummy drain regions according to an embodiment of the present disclosure.

Referring to FIG. 33, the processing steps described with reference to FIG. 12D may be performed to form a drain region 63 within each memory opening 49 and to form as dummy drain region 63' within each support opening 19. The drain regions 63 and the dummy drain regions 63' may have the same material composition. Each portion of the semiconductor channel material layer 60L that remains in a memory opening 49 constitutes a vertical semiconductor channel 60. Each portion of the semiconductor channel material layer 60L that remains in a support opening 19 constitutes a dummy vertical semiconductor channel 60'. Each portion of the memory film layer 50L that remains in a memory opening 49 constitutes a memory film 50. Each portion of the memory film layer SOL that remains in a support opening 19 constitutes a dummy memory film 50' which includes a dummy blocking dielectric layer 52', a dummy memory material layer 54' and a dummy dielectric liner 56', such as a dummy tunneling dielectric layer.

The combination of all material portions formed in a memory opening 49 constitutes a memory opening fill structure 58. The combination of all material portions formed in a support opening 19 constitutes a support pillar structure 220. Each of the memory opening fill structures 58 comprises a respective memory film 50 and a respective vertical semiconductor channel 60. Each of the support pillar structures 220 comprises a respective one of the dielectric spacer material portions 250, a respective dummy memory film 50', and a respective dummy vertical semiconductor channel 60'. The dummy blocking dielectric layer 52', the dummy memory material layer 54' and the dummy dielectric liner 56' have the same composition and order of stacking as the respective blocking dielectric layer 52, the memory material layer 54 and the dielectric liner 56'. The memory opening fill structures 58 lack the dielectric spacer material portions 250, and the dielectric spacer material portions 250 are not formed in the memory openings 49.

In one embodiment, each of the memory films 50 may be formed with a respective first conical bottom tip that points downward. Each of the dummy memory films 50' may be formed with a respective second conical bottom tip that points downward. The second conical bottom tips are formed at a greater vertical distance from the substrate 8 than the first conical bottom tips are from the substrate 8.

Each first conical bottom tip of the memory films 50 may contact the lower source-level semiconductor layer 112. Each second conical bottom tip of the dummy memory films 50' may contact a respective dielectric spacer material portion 250. In one embodiment, each second conical bottom tip of the dummy memory films 50' may be located above the horizontal plane including the top surface of the lower source-level semiconductor layer 112. In one embodiment, each second conical bottom tip of the dummy memory films 50' may be located above the horizontal plane including the bottom surface of the upper source-level semiconductor layer 116.

In one embodiment, each of the vertical semiconductor channels 60 vertically extends through each of the sacrificial material layers 42 and has a respective bottommost surface located below a horizontal plane including a top surface of the source-level sacrificial layer 104. In one embodiment, each of the dummy vertical semiconductor channels 60' is located entirely above the horizontal plane including the top surface of the source-level sacrificial layer 104.

In one embodiment, the support pillar structures 220 can be located in the staircase region 300. The support pillar structures 220 vertically extend through the retro-stepped dielectric material portion 65 and a respective subset of the alternating stack (32, 42). Each of the support pillar structures 220 comprises a respective dielectric spacer material portion 250 that contacts a respective set of layers within the alternating stack (32, 42), a dummy memory film 50' having a same set of materials as the memory films 50 and spaced from the alternating stack (32, 46) by the respective dielectric spacer material portion 250, and a dummy vertical semiconductor channel 60' having a same material composition as the vertical semiconductor channels 60.

In one embodiment, segments of outer sidewalls of the memory opening fill structures 58 located within the in-process source-level material layers 10' have a greater taper angle than segments of the outer sidewalls of the memory opening fill structures 58 located within the alternating stack (32, 42). In one embodiment, each dielectric spacer material portion 250 of the support pillar structures 220 has an inner sidewall contacting a respective memory film 50 and an outer sidewall contacting a respective subset of layers within the alternating stack (32, 42) and the retro-stepped dielectric material portion 65. In one embodiment, the inner sidewall has a greater taper angle relative to a vertical direction than the outer sidewall for each of the dielectric spacer material portions 250.

In one embodiment, each of the memory opening fill structures 58 comprises a respective dielectric core 62 that is laterally surrounded by the respective vertical semiconductor channel 60. In one embodiment, each of the support pillar structures 220 comprises a respective dummy dielectric core 62' that is laterally surrounded by the respective dummy vertical semiconductor channel 60'. A taper angle of the respective dummy dielectric core 62' relative to a vertical direction is greater than a taper angle of the respective dielectric core 62 relative to the vertical direction.

Figure 34:
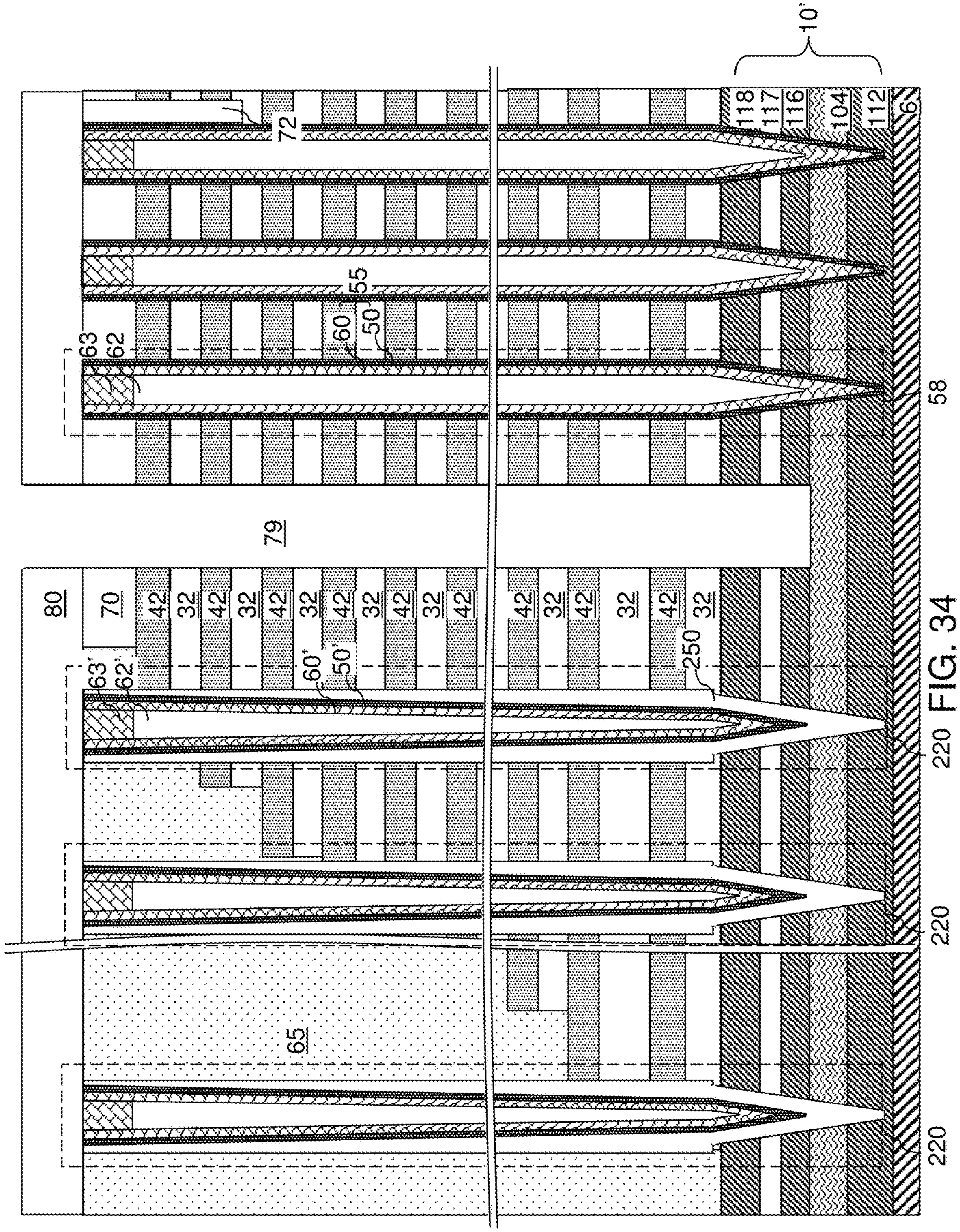
FIG. 34 is a vertical cross-sectional view of the second exemplary structure after formation of a contact-level dielectric layer and backside trenches according to an embodiment of the present disclosure.

Referring to FIG. 34, the processing steps described with reference to FIGS. 18A and 18B may be performed to form a contact-level dielectric layer 80 and backside trenches 79.

Figure 35:
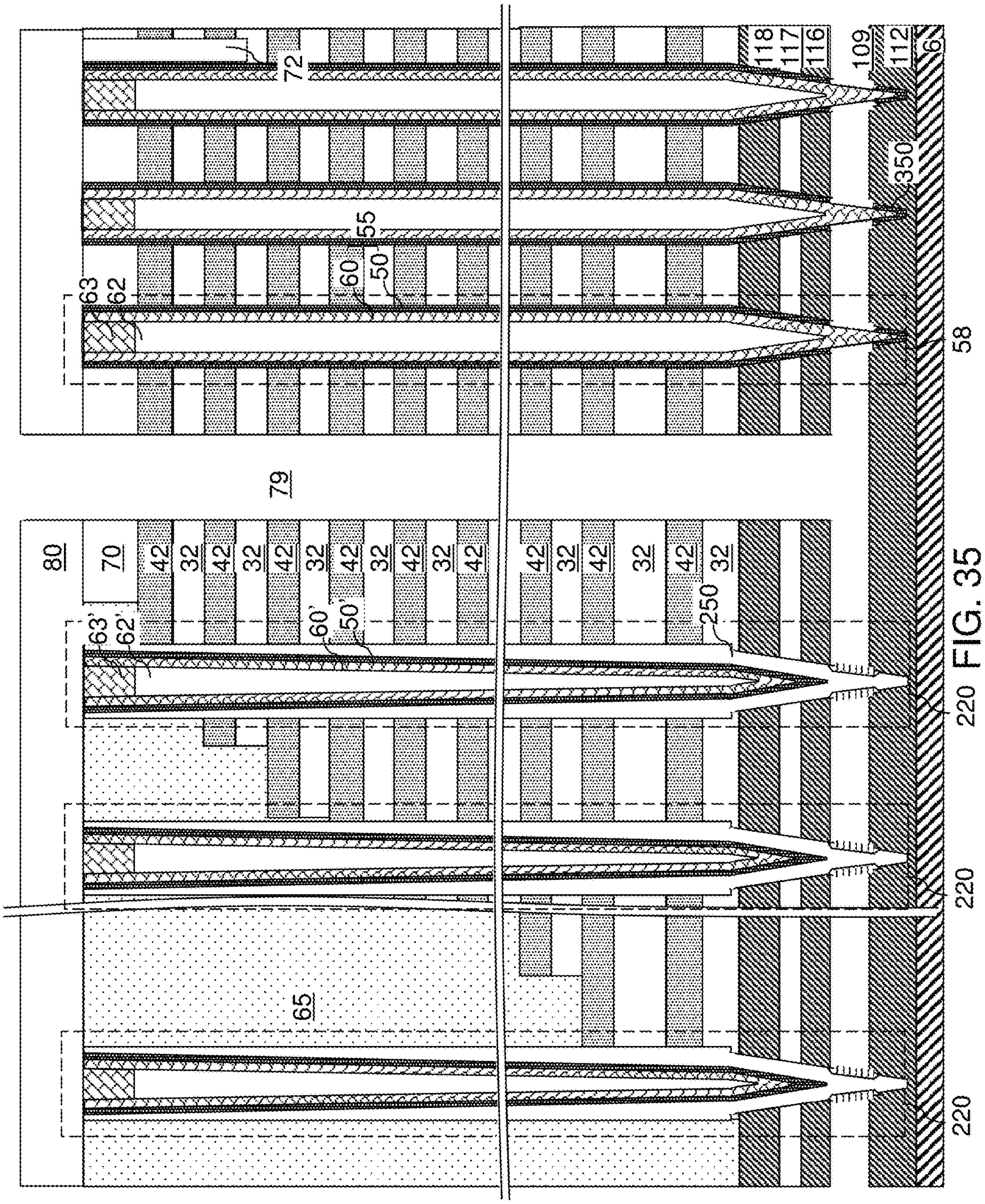
FIG. 35 is a vertical cross-sectional view of the second exemplary structure after formation of a source cavity according to an embodiment of the present disclosure.
Figure 36:
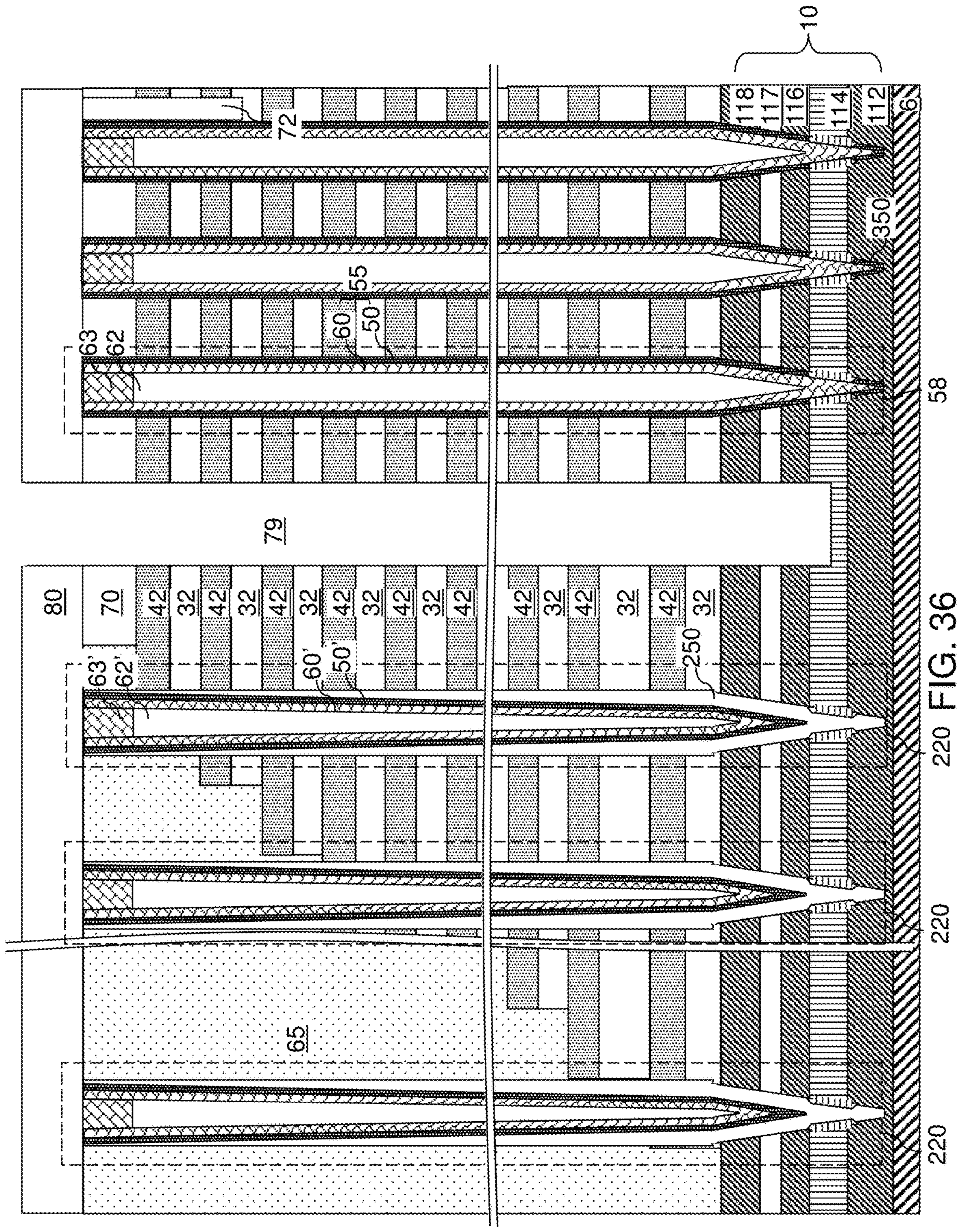
FIG. 36 is a vertical cross-sectional view of the second exemplary structure after formation of a source contact layer according to an embodiment of the present disclosure.

Referring to FIG. 35, the processing steps described with reference to FIGS. 19A, 19B, and 19C may be performed to form backside trench spacers (not illustrated), to remove source-level sacrificial layer 104, and to sequentially etch the various component layers of the memory films 50 from outside to inside. An isotropic etch process including a sequence of isotropic etch steps may be performed to sequentially etch portions of the various component layers of each memory film 50 at the level of the source cavity 109. Tapered surfaces of the vertical semiconductor channels 60 can be physically exposed at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Generally, portions of the memory films 50 that are exposed to the source cavity 109 can be removed by performing an isotropic etch process. Surface segments of the vertical semiconductor channels 60 are exposed. Outer surfaces of the dielectric spacer material portions 250 are physically exposed to the source cavity 109 upon removal of portions of the memory films 50 that are exposed to the source cavity 109. In one embodiment, the isotropic etch process collaterally etches surface portions of the dielectric spacer material portions 250 during removal of portions of the memory films 50 located at the level of the source cavity 109. In one embodiment, the isotropic etch process does not etch through the dielectric spacer material portions 250, but makes an indentation in the outer surface of each dielectric spacer material portion 250 at the level of the source cavity 109. In one embodiment, each of the dielectric spacer material portions 250 has a cylindrical indentation in portions located at the level of the source cavity 109 relative to portions located within the in-process source-level material layers 10 and not exposed to the source cavity 109.

In one embodiment, each of the dummy memory films 50' has a conical bottom tip that is embedded within a respective one of the dielectric spacer material portions 250. Upon removal of the physically exposed portions of the memory films 50 at the level of the source cavity 109, each of the memory films 50 may have an annular bottom surface that is exposed to the source cavity 109.

Referring to FIG. 35, the processing steps described with reference to FIG. 19D may be performed to form a source contact layer 114. Generally, the source contact layer 114 can be formed directly on the exposed surface segments of the vertical semiconductor channels 60. In one embodiment, the source contact layer 114 does not contact the dummy vertical semiconductor channels 60', and is spaced from the dummy vertical semiconductor channels 60' at least by a respective one of the dummy memory films 50'. In one embodiment, the dummy memory films 50' are laterally spaced from the source contact layer 114 by a portion of a respective one of the dielectric spacer material portions 250. In one embodiment, each of the memory films 50 comprises a bottom surface that contacts a respective annular top surface segment of the source contact layer 114.

In one embodiment, each of the dummy vertical semiconductor channels 60' is spaced from the source contact layer 114 at least by a respective dummy memory film 50'. In one embodiment, each of the dummy vertical semiconductor channels 60' is also spaced from the source contact layer 114 by a respective one of the dielectric spacer material portions 250.

The layer stack including the lower source-level semiconductor layer 112, the source contact layer 114, and the upper source-level semiconductor layer 116 constitutes a buried source layer (112, 114, 116). The set of layers including the buried source layer (112, 114, 116), the source-level insulating layer 117, and the source-select-level conductive layer 118 constitutes source-level material layers 10, which replaces the in-process source-level material layers 10'.

Figure 37:
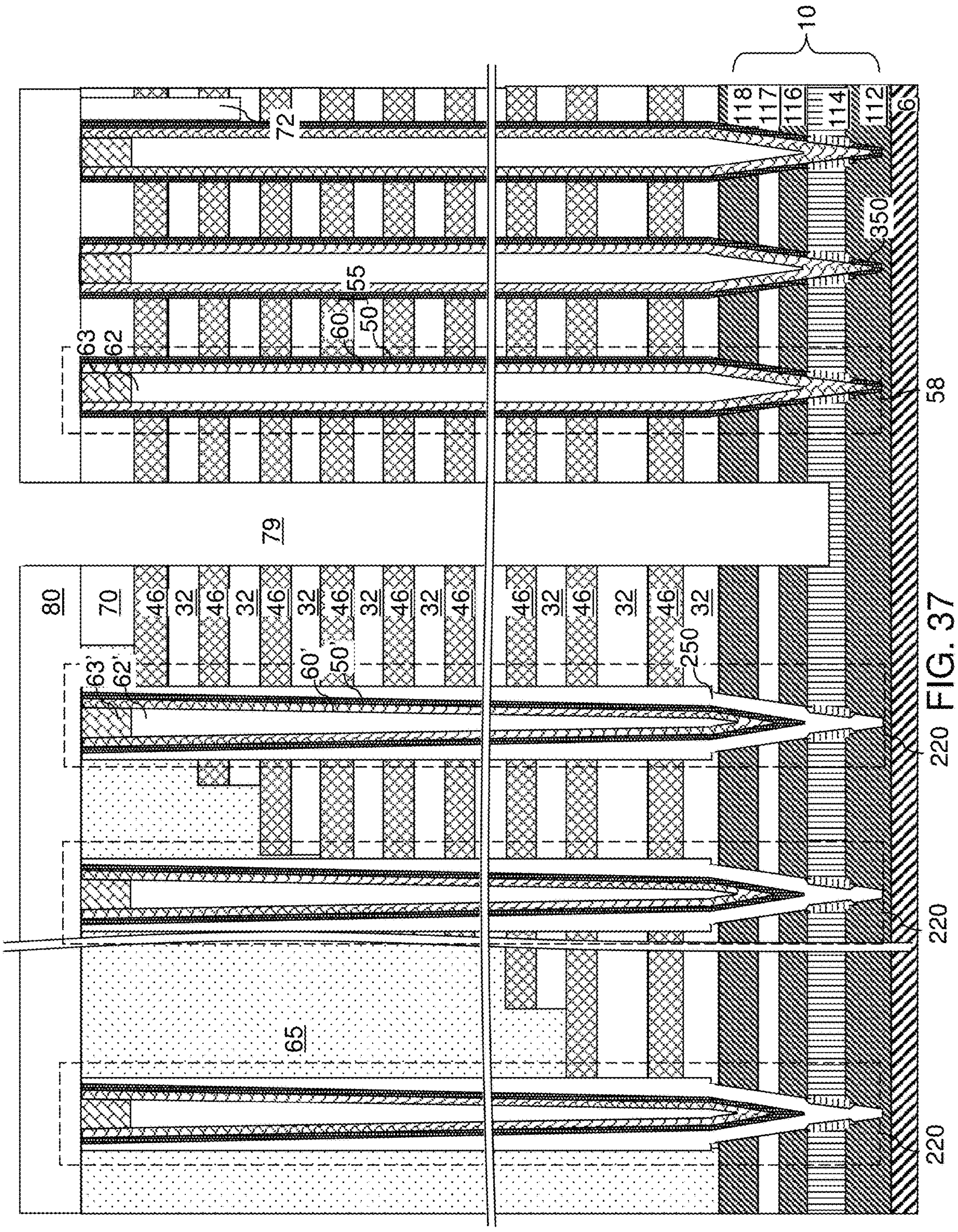
FIG. 37 is a vertical cross-sectional view of the second exemplary structure after replacement of the sacrificial material layers with electrically conductive layers according to an embodiment of the present disclosure.

Referring to FIG. 37, the processing steps described with reference to FIG. 19E can be performed to form dielectric semiconductor oxide plates (not shown) and annular dielectric semiconductor oxide spacers (not shown). Subsequently, the processing steps described with reference to FIGS. 19F and 19G may be performed to replace the sacrificial material layers 42 with electrically conductive layers 46.

Figure 38A:
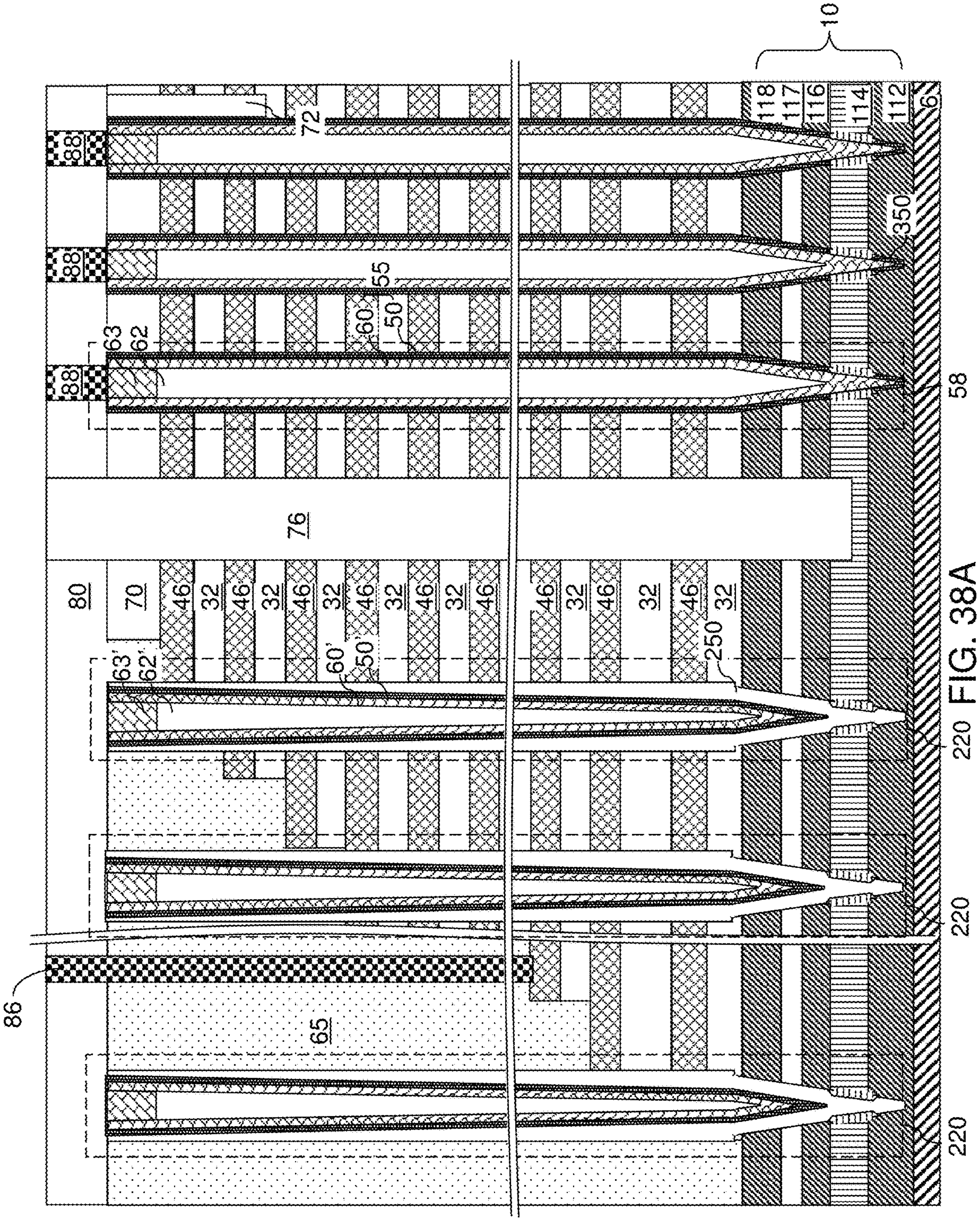
FIG. 38A is a vertical cross-sectional view of the second exemplary structure after formation of backside trench fill structures and contact via structures according to an embodiment of the present disclosure.
Figure 38B:
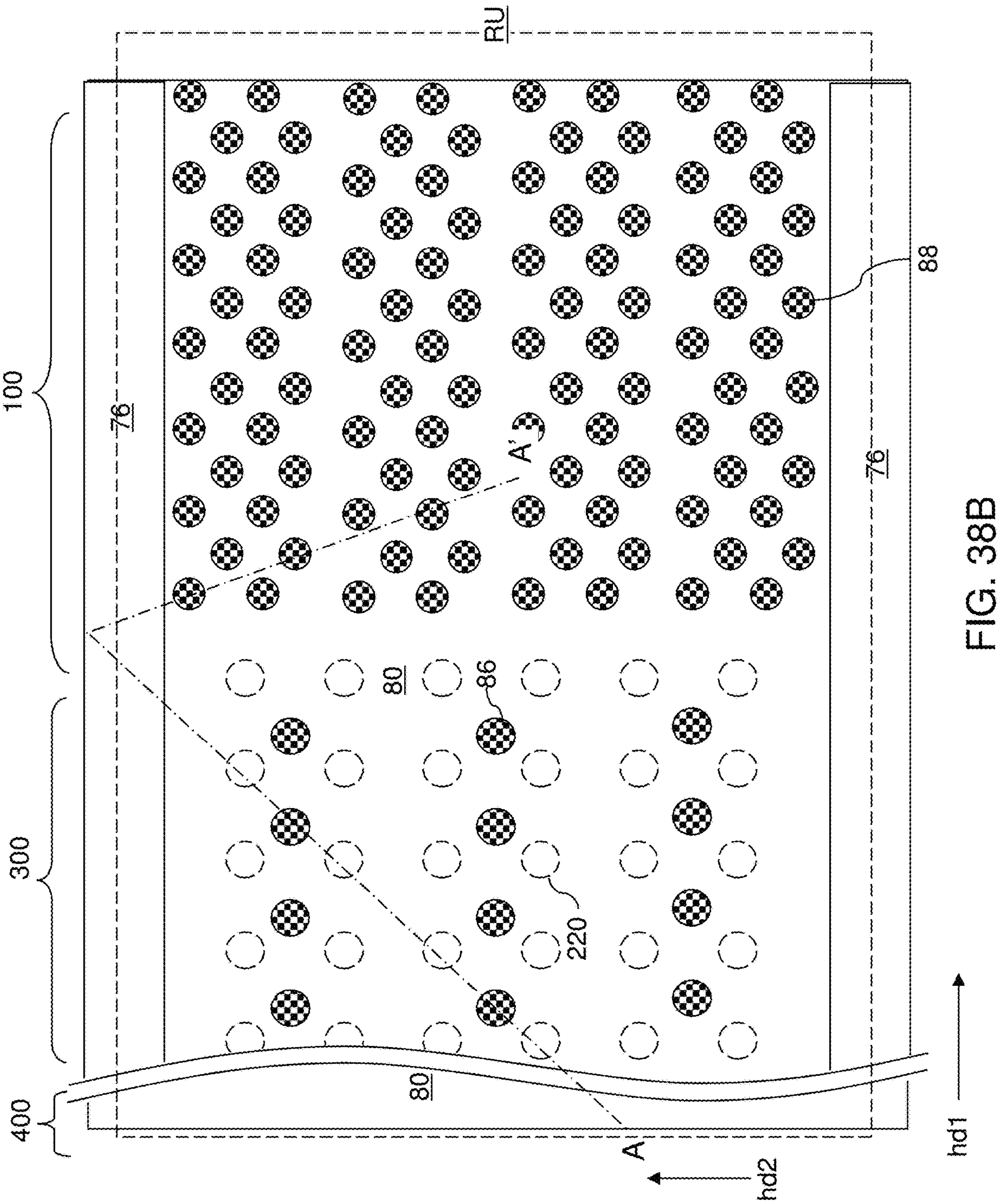
FIG. 38B is a top-down view of the second exemplary structure of FIG. 38A.

Referring to FIGS. 38A and 38B, the processing steps described with reference to FIGS. 19H, 20, 21A, and 21B may be performed to form backside trench fill structures 76 and various contact via structures (88, 86).

Figure 39:
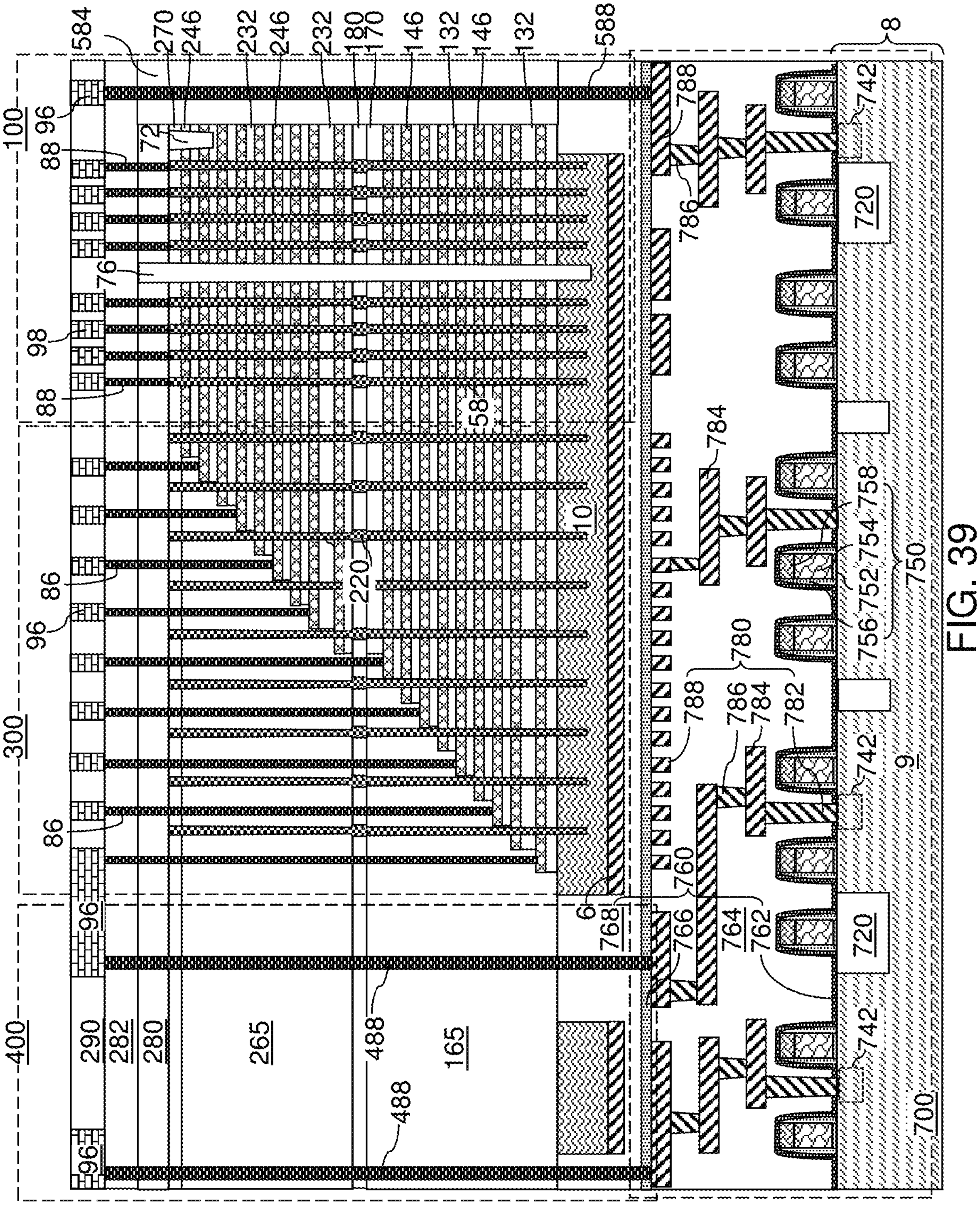
FIG. 39 is a vertical cross-sectional view of an alternative configuration of the exemplary structures according to an embodiment of the present disclosure.

Referring to FIG. 39, an alternative configuration of the second exemplary structure can be derived from any of the above exemplary structures by forming a multi-tier structure at a memory level. In this case, the alternating stack of insulating layers 32 and electrically conductive layers 46 may be replaced with a composite alternating stack that includes a first-tier alternating stack of first insulating layers 132 and first electrically conductive layers 146 and a second-tier alternating stack of second insulating layers 232 and second electrically conductive layers 246. A first insulating cap layer 170 and an inter-tier insulating layer 180 may be formed between the first-tier alternating stack (132, 246) and the second-tier alternating stack (232, 246). A first retro-stepped dielectric material portion 165 may be formed over first stepped surfaces of the first-tier alternating stack, and a second retro-stepped dielectric material portion 265 may be formed over second stepped surfaces of the second-tier alternating stack.

A second insulating cap layer 270, a first contact-level dielectric layer 280, a second contact-level dielectric layer 282 may be formed over the second-tier alternating stack. Dielectric fill material portions 584 may be formed through the composite alternating stack. Memory-region through-memory-level via structures 588 may be formed through the dielectric fill material portions 584, and peripheral region through-memory-level via structures 488 may be formed through the retro-stepped dielectric material portions (165, 265). Memory opening fill structures 58 may vertically extend through the composite alternating sack in the memory array region 100. Support pillar structures (22 or 220) can vertically extend through the retro-stepped dielectric material portions (165, 265) and the composite alternating stack. Drain contact via structures 88 can contact the drain regions 63 within each memory opening fill structure 58. Layer contact via structures 86 can contact the electrically conductive layers (146, 246). The metal interconnect structures may comprise, for example, bit lines 98 and various metal lines 96 that provide electrical connection to the layer contact via structures 86 and the through-memory-level via structures (488, 588).

Referring to all drawings and according to various embodiments of the present disclosure, a three-dimensional memory device comprises: an alternating stack {(32, 46) or (132, 146, 232, 246)} of insulating layers (32, 132, 232) and electrically conductive layers (46, 146, 246), memory opening fill structures 58 located within a respective memory opening 49 vertically extending through the alternating stack in a memory array region 100, and support pillar structures 220 vertically extending through the alternating stack. Each of the memory opening fill structures 58 includes a respective vertical semiconductor channel 60 and a respective memory film 50 that contacts each layer within the alternating stack. Each of the support pillar structures 220 includes a respective dummy vertical semiconductor channel 60', a respective dummy memory film 50, and at least one respective dielectric spacer material portion 250 laterally surrounding the respective dummy memory film 50' and interposed between the electrically conductive layers (46, 146, 246) and the respective dummy memory film.

In one embodiment, the respective dielectric spacer material portion 250 contacts a respective set of layers within the alternating stack, the dummy memory film 50' has a same set of materials as the memory film 50, the dummy memory film 50' is spaced from the alternating stack by the respective dielectric spacer material portion 250, and the dummy vertical semiconductor channel 60 has a same material composition as the vertical semiconductor channel 60'. In one embodiment, the memory opening fill structures 58 lack the dielectric spacer material portions, and the dielectric spacer material portions 250 are not formed in the memory openings 49.

In one embodiment, the alternating stack is located over a substrate 8, each layer within the alternating stack is present within the memory array region 100, and the alternating stack comprises stepped surfaces in a staircase region 300 in which the electrically conductive layers (46, 146, 246) have variable lateral extents with a vertical distance from the substrate 8. In one embodiment, a retro-stepped dielectric material portion {65, (165, 265)} is located in the staircase region 300 and overlies the stepped surfaces of the alternating stack. The support pillar structures 220 are located in the staircase region 300 and vertically extend through the retro-stepped dielectric material portion and through a respective subset of the alternating stack.

In one embodiment, the three-dimensional memory device comprises source-level material layers 10 underlying the alternating stack {(32, 46) or (132, 146, 232, 246)} and comprising a source contact layer 114 that contacts a bottom portion of each of the vertical semiconductor channels 60. In one embodiment, each of the dummy vertical semiconductor channels 60' is spaced from the source contact layer 114 at least by a respective dummy memory film 50'. In one embodiment, each of the dummy vertical semiconductor channels 60' is spaced from the source contact layer 114 by a respective one of the dielectric spacer material portions 250.

In one embodiment, each of the vertical semiconductor channels 60 vertically extends through each of the electrically conductive layers (46, 146, 246) and has a respective bottommost surface located below a horizontal plane including a top surface of the source contact layer 114; and each of the dummy vertical semiconductor channels 60' is located entirely above the horizontal plane including the top surface of the source contact layer 114. In one embodiment, the respective bottommost surface of the vertical semiconductor channels 60 is located below a horizontal plane including a bottom surface of the source contact layer 114.

In one embodiment, each of the memory films 50 comprises a bottom surface that contacts a respective annular top surface segment of the source contact layer 114. In one embodiment, segments of sidewalls of the memory opening fill structures 58 located within the source-level material layers 10 have a greater taper angle than segments of the sidewalls of the memory opening fill structures 58 located within the alternating stack {(32, 46) or (132, 146, 232, 246)}.

In one embodiment, each of the dielectric spacer material portions 250 has a cylindrical indentation in portions that directly contact the source contact layer 114 relative to portions located within the source-level material layers 10 and not directly contacting the source contact layer 114.

In one embodiment, each dielectric spacer material portion 250 of the support pillar structures 220 has an inner sidewall contacting a respective memory film 50 and an outer sidewall contacting a respective subset of layers within the alternating stack {(32, 46) or (132, 146, 232, 246)} and the retro-stepped dielectric material portion {65, (165, 265)}; and the inner sidewall has a greater taper angle relative to a vertical direction than the outer sidewall for each of the dielectric spacer material portions 250.

In one embodiment, each dielectric spacer material portion 250 of the support pillar structures 220 has a variable lateral spacing between a respective inner sidewall and a respective outer sidewall that decreases with a vertical distance from the substrate 8.

In one embodiment, each of the memory opening fill structures 58 comprises a respective dielectric core 62 that is laterally surrounded by the respective vertical semiconductor channel 60; and each of the support pillar structures 220 comprises a respective dummy dielectric core 62' that is laterally surrounded by the respective dummy vertical semiconductor channel 60', wherein a taper angle of the respective dummy dielectric core 62' relative to a vertical direction is greater than a taper angle of the respective dielectric core 62 relative to the vertical direction.

In one embodiment, each of the dummy memory films 50' has a conical bottom tip that is embedded within a respective one of the dielectric spacer material portions 250; and each of the memory films 50 has an annular bottom surface.

In one embodiment, at least one of the support pillar structures 220 comprises a respective dielectric spacer material portion 250 having a topmost surface located below a horizontal plane including a top surface of the retro-stepped dielectric material portion {65, (165, 265)} and a sidewall contacting a cylindrical surface segment of the retro-stepped dielectric material portion {65, (165, 265)}.

The various embodiments of the present disclosure may be employed to provide support pillar structures that reduce electrical leakage current between the dummy channels 60' and the electrically conductive layers 46. For example, the dielectric spacer material portions 250 within support pillar structures 220 can prevent leakage paths through the support pillar structures 220 by providing an additional dielectric insulation material between dummy vertical semiconductor channels 60' and various conductive materials located outside the support pillar structures 220 (such as the electrically conductive layers 46 and source-level conductive layers). The dielectric spacer material portions 250 within support pillar structures 220 also provide additional structural support which reduces or prevents subsidence (i.e., sinking) of the electrically conductive layers 46 in the staircase region 300. Furthermore, the dielectric spacer material portions 250 may reduce or eliminate backside trench 79 twisting and/or bending, which also reduces leakage current and short circuits.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:

an alternating stack of insulating layers and electrically conductive layers;

memory opening fill structures located within a respective memory opening vertically extending through the alternating stack in a memory array region, wherein each of the memory opening fill structures comprises a respective vertical semiconductor channel and a respective memory film that contacts each layer within the alternating stack; and support pillar structures vertically extending through the alternating stack, wherein each of the support pillar structures comprises a respective dummy vertical semiconductor channel, a respective dummy memory film, and at least one respective dielectric spacer material portion laterally surrounding the respective dummy memory film and interposed between the electrically conductive layers and the respective dummy memory film;

wherein:

the alternating stack is located over a substrate;

each layer within the alternating stack is present within the memory array region;

the alternating stack comprises stepped surfaces in a staircase region in which the electrically conductive layers have variable lateral extents with a vertical distance from the substrate;

a retro-stepped dielectric material portion is located in the staircase region and overlies the stepped surfaces of the alternating stack; and the support pillar structures are located in the staircase region and vertically extend through the retro-stepped dielectric material portion and through a respective subset of the alternating stack; and further comprising at least one feature selected from:

(a) each dielectric spacer material portion of the support pillar structures has an inner sidewall contacting a respective memory film and an outer sidewall contacting a respective subset of layers within the alternating stack and the retro-stepped dielectric material portion; and the inner sidewall has a greater taper angle relative to a vertical direction than the outer sidewall for each of the dielectric spacer material portions; or (b) each dielectric spacer material portion of the support pillar structures has a variable lateral spacing between a respective inner sidewall and a respective outer sidewall that decreases with a vertical distance from the substrate; or (c) each of the memory opening fill structures comprises a respective dielectric core that is laterally surrounded by the respective vertical semiconductor channel; and each of the support pillar structures comprises a respective dummy dielectric core that is laterally surrounded by the respective dummy vertical semiconductor channel, wherein a taper angle of the respective dummy dielectric core relative to a vertical direction is greater than a taper angle of the respective dielectric core relative to the vertical direction; or (d) each of the dummy memory films has a conical bottom tip that is embedded within a respective one of the dielectric spacer material portions; and each of the memory films has an annular bottom surface; or (e) at least one of the support pillar structures comprises a respective dielectric spacer material portion having a topmost surface located below a horizontal plane including a top surface of the retro-stepped dielectric material portion and a sidewall contacting a cylindrical surface segment of the retro-stepped dielectric material portion.

2. The three-dimensional memory device of claim 1, wherein the at least one feature comprises the feature (a).

3. The three-dimensional memory device of claim 1, wherein the at least one feature comprises the feature (b).

4. The three-dimensional memory device of claim 1, wherein the at least one feature comprises the feature (c).

5. The three-dimensional memory device of claim 1, wherein the at least one feature comprises the feature (d).

6. The three-dimensional memory device of claim 1, wherein the at least one feature comprises the feature (e).

7. A three-dimensional memory device, comprising:

an alternating stack of insulating layers and electrically conductive layers;

memory opening fill structures located within a respective memory opening vertically extending through the alternating stack in a memory array region, wherein each of the memory opening fill structures comprises a respective vertical semiconductor channel and a respective memory film that contacts each layer within the alternating stack;

support pillar structures vertically extending through the alternating stack, wherein each of the support pillar structures comprises a respective dummy vertical semiconductor channel, a respective dummy memory film, and at least one respective dielectric spacer material portion laterally surrounding the respective dummy memory film and interposed between the electrically conductive layers and the respective dummy memory film; and source-level material layers underlying the alternating stack and comprising a source contact layer that contacts a bottom portion of each of the vertical semiconductor channels, wherein:

the alternating stack is located over a substrate;

each layer within the alternating stack is present within the memory array region;

the alternating stack comprises stepped surfaces in a staircase region in which the electrically conductive layers have variable lateral extents with a vertical distance from the substrate;

a retro-stepped dielectric material portion is located in the staircase region and overlies the stepped surfaces of the alternating stack; and the support pillar structures are located in the staircase region and vertically extend through the retro-stepped dielectric material portion and through a respective subset of the alternating stack.

8. The three-dimensional memory device of claim 7, wherein each of the dummy vertical semiconductor channels is spaced from the source contact layer at least by a respective dummy memory film and by a respective one of the dielectric spacer material portions.

9. The three-dimensional memory device of claim 7, wherein:

each of the vertical semiconductor channels vertically extends through each of the electrically conductive layers and has a respective bottommost surface located below a horizontal plane including a top surface of the source contact layer;

each of the dummy vertical semiconductor channels is located entirely above the horizontal plane including the top surface of the source contact layer; and the respective bottommost surface of the vertical semiconductor channels is located below a horizontal plane including a bottom surface of the source contact layer.

10. The three-dimensional memory device of claim 7, wherein each of the memory films comprises a bottom surface that contacts a respective annular top surface segment of the source contact layer.

11. The three-dimensional memory device of claim 7, wherein segments of sidewalls of the memory opening fill structures located within the source-level material layers have a greater taper angle than segments of the sidewalls of the memory opening fill structures located within the alternating stack.

12. The three-dimensional memory device of claim 7, wherein each of the dielectric spacer material portions has a cylindrical indentation in portions that directly contact the source contact layer relative to portions located within the source-level material layers and not directly contacting the source contact layer.

13. A method of forming a three-dimensional memory device, comprising:

forming an alternating stack of insulating layers and sacrificial material layers over a substrate;

forming stepped surfaces by patterning the alternating stack in a staircase region;

forming a retro-stepped dielectric material portion over the stepped surfaces;

forming support openings in the staircase region and memory openings in a memory array region in which each layer within the alternating stack is present;

forming a patterning film over the alternating stack such that the patterning film covers the memory openings and does not cover the support openings;

forming a dielectric spacer material portion layer on physically exposed surfaces of the support openings and over the patterning film;

anisotropically etching portions of the dielectric spacer material portion layer from above the patterning film and in upper portions of the support openings, wherein remaining portions of the dielectric spacer material portion layer in the support openings comprise dielectric spacer material portions;

removing the patterning film;

forming memory opening fill structures in the memory openings and support pillar structures in the support openings, wherein each of the memory opening fill structures comprises a respective memory film and a respective vertical semiconductor channel, and each of the support pillar structures comprises a respective one of the dielectric spacer material portions, a respective dummy memory film, and a respective dummy vertical semiconductor channel; and replacing the sacrificial material layers with electrically conductive layers.

14. The method of claim 13, further comprising:

forming in-process source-level material layers over the substrate, wherein the in-process source-level material layers comprise a source-level sacrificial layer, wherein the memory opening fill structures extend into the source-level sacrificial layer;

forming a source cavity by removing the source-level sacrificial layer;

removing portions of the memory films that are exposed to the source cavity by performing an isotropic etch process, wherein surface segments of the vertical semiconductor channels are exposed; and forming a source contact layer directly on the exposed surface segments of the vertical semiconductor channels.

15. The method of claim 14, wherein:

outer surfaces of the dielectric spacer material portions are physically exposed to the source cavity;

the isotropic etch process collaterally etches surface portions of the dielectric spacer material portions; and the source contact layer does not contact the dummy vertical semiconductor channels, and is spaced from the dummy vertical semiconductor channels at least by a respective one of the dummy memory films.

16. The method of claim 14, wherein:

the isotropic etch process does not etch through the dielectric spacer material portions; and the dummy memory films are laterally spaced from the source contact layer by a portion of a respective one of the dielectric spacer material portions.

17. The method of claim 13, further comprising forming in-process source-level material layers over the substrate.

18. The method of claim 17, wherein:

the alternating stack is formed over the in-process source-level material layers;

the memory openings and the support openings are formed into the in-process source-level material layers with a taper angle in sidewall surfaces;

each of the memory films is formed with a respective first conical bottom tip;

each of the dummy memory films is formed with a respective second conical bottom tip; and the second conical bottom tips are formed at a greater vertical distance from the substrate than the first conical bottom tips are from the substrate.

* * * * *